United States Patent [19]
Takai

[11] Patent Number: 6,069,508
[45] Date of Patent: May 30, 2000

[54] CLOCK GENERATING CIRCUIT HAVING HIGH RESOLUTION OF DELAY TIME BETWEEN EXTERNAL CLOCK SIGNAL AND INTERNAL CLOCK SIGNAL

[75] Inventor: Yasuhiro Takai, Tokyo, Japan

[73] Assignee: NEC Corporation, Tokyo, Japan

[21] Appl. No.: 09/095,057

[22] Filed: Jun. 10, 1998

[30] Foreign Application Priority Data

Jun. 10, 1997 [JP] Japan .................................. 9-152656
Oct. 29, 1997 [JP] Japan .................................. 9-297529

[51] Int. Cl.$^7$ .................................................. H03K 5/159
[52] U.S. Cl. ......................... 327/161; 327/153; 327/299; 327/276
[58] Field of Search .................................. 327/149, 150, 327/153, 158, 161, 291, 294, 298, 276, 299

[56] References Cited

U.S. PATENT DOCUMENTS 5,699,003  12/1997  Saeki ...................................... 327/261
5,929,682   7/1999  Kazuya et al. ........................... 327/291

FOREIGN PATENT DOCUMENTS 8-237091   9/1996  Japan .

OTHER PUBLICATIONS

Yoshinori Okahima et al., "Digital Delay Locked Loop and Design Technique for High–Speed Synchronous Interface", *IEICE Trans. Electron.*, vol. E79–C, No. 6, Jun. 1996, pp. 798–807.

Atsushi Hatakeyama et al., "A 256Mb SDRAM Using a Register–Controlled Digital DLL", *1997 IEEE International Solid–State Circuits Conference*, Paper TP 4.5, 1997, pp. 72–73.

Jin–Man Han et al., "Skew Minimization Techniques for 256M–bit synchronous DRAM and beyond", *1996 Symposium on VLSI Circuits Digest of Technical Papers*, 1996, pp. 192–193.

Toshio Yamada et al., "Capacitance coupled Bus with Negative Delay Circuit for High speed and Low Power (10GB/s<500mW) Synchronous DRAMs", *1996 Symp. on VLSI Circuits Dig. of Tech. Papers*, 1996, pp. 112–113.

NEC 1996 Data Book: IC Memory Dynamic RAM 2, Oct. 1996, pp. 376–377.

*Primary Examiner*—Tuan T. Lam
*Attorney, Agent, or Firm*—Sughrue, Mion, Zinn, Macpeak & Seas, PLLC

[57] ABSTRACT

A clock generating circuit synchronizes an internal clock signal with an external clock signal, and has a delay circuit implemented by a series of delay stages connected through pairs of signal transfer lines to one another; each of the delay stages has a series combination of a first charging circuit and a first discharging circuit connected between a positive power line and a ground line and a series combination of a second charging circuit and a second discharging circuit connected in parallel to the first series combination, and each pair of signal transfer lines is connected between the first series combination of one of the delay stage and the second series combination of the next delay series; a potential edge signal is propagated through charging/discharging operations toward a certain delay stage during a first time period equal to the pulse period of the external clock signal, and returns to the first delay stage so as to generate a one-shot pulse in the next pulse period; even if the pulse period fluctuates, the delay circuit changes the turning point of the potential edge signal, and makes the internal clock signal strictly synchronous with the external clock signal.

31 Claims, 41 Drawing Sheets

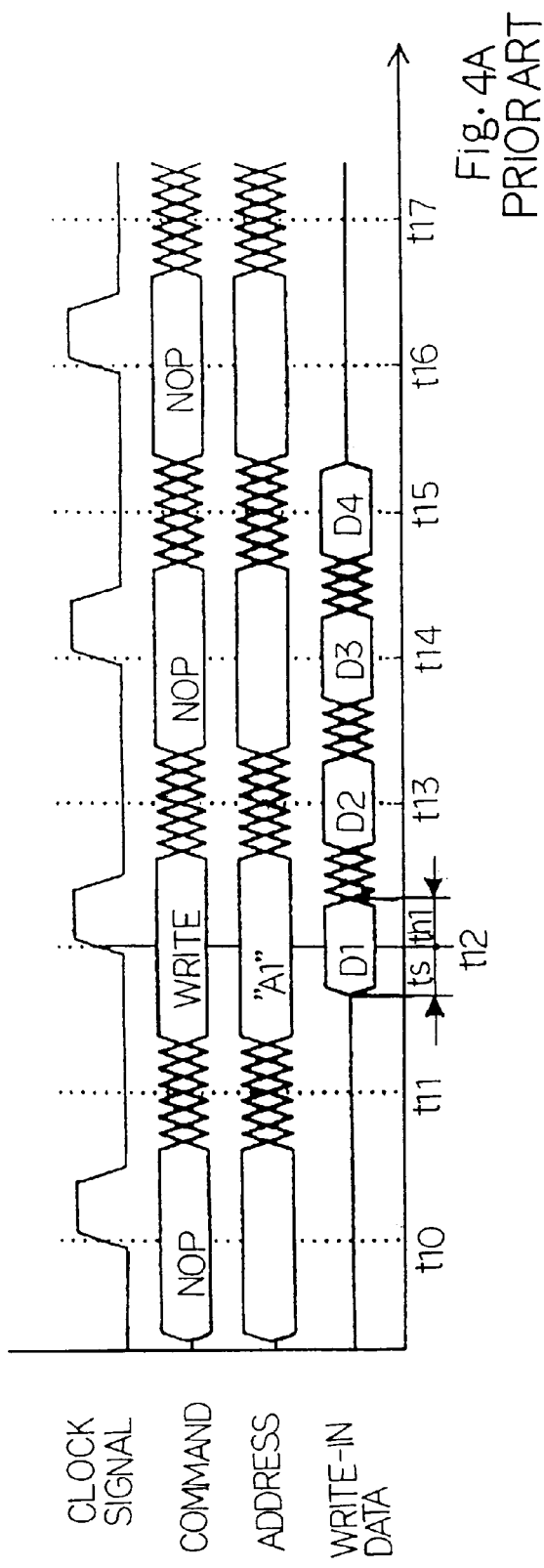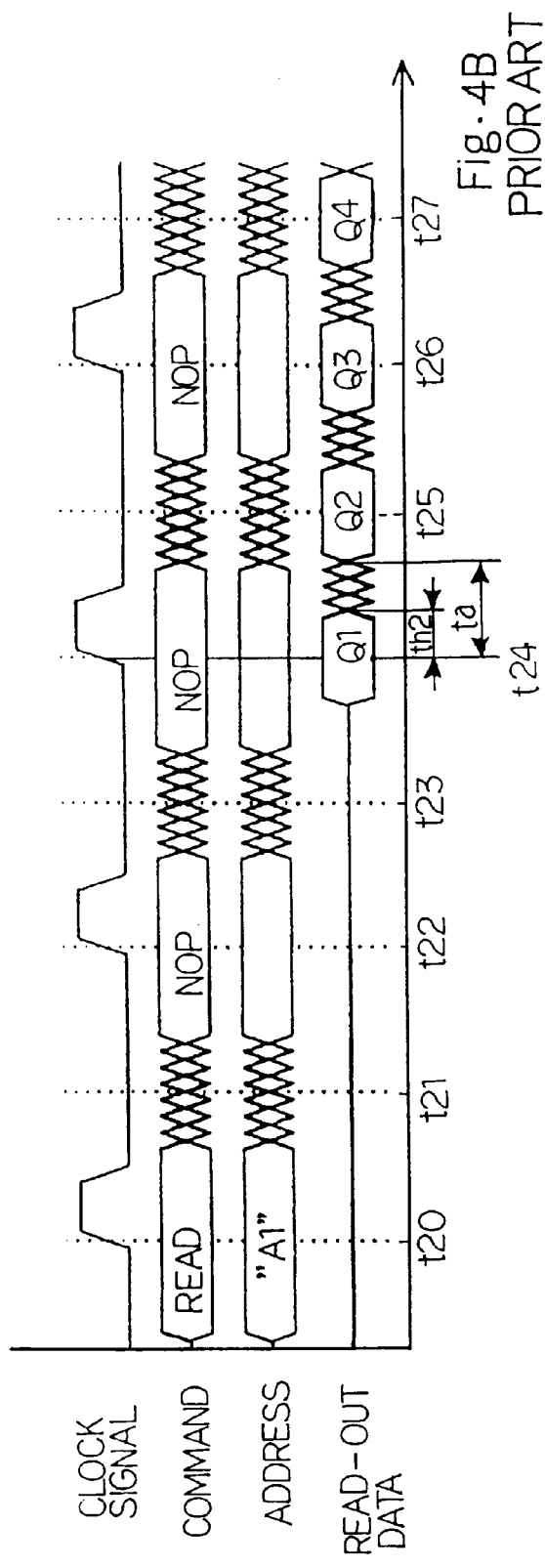
Fig. 4A PRIOR ART
Fig. 4B PRIOR ART

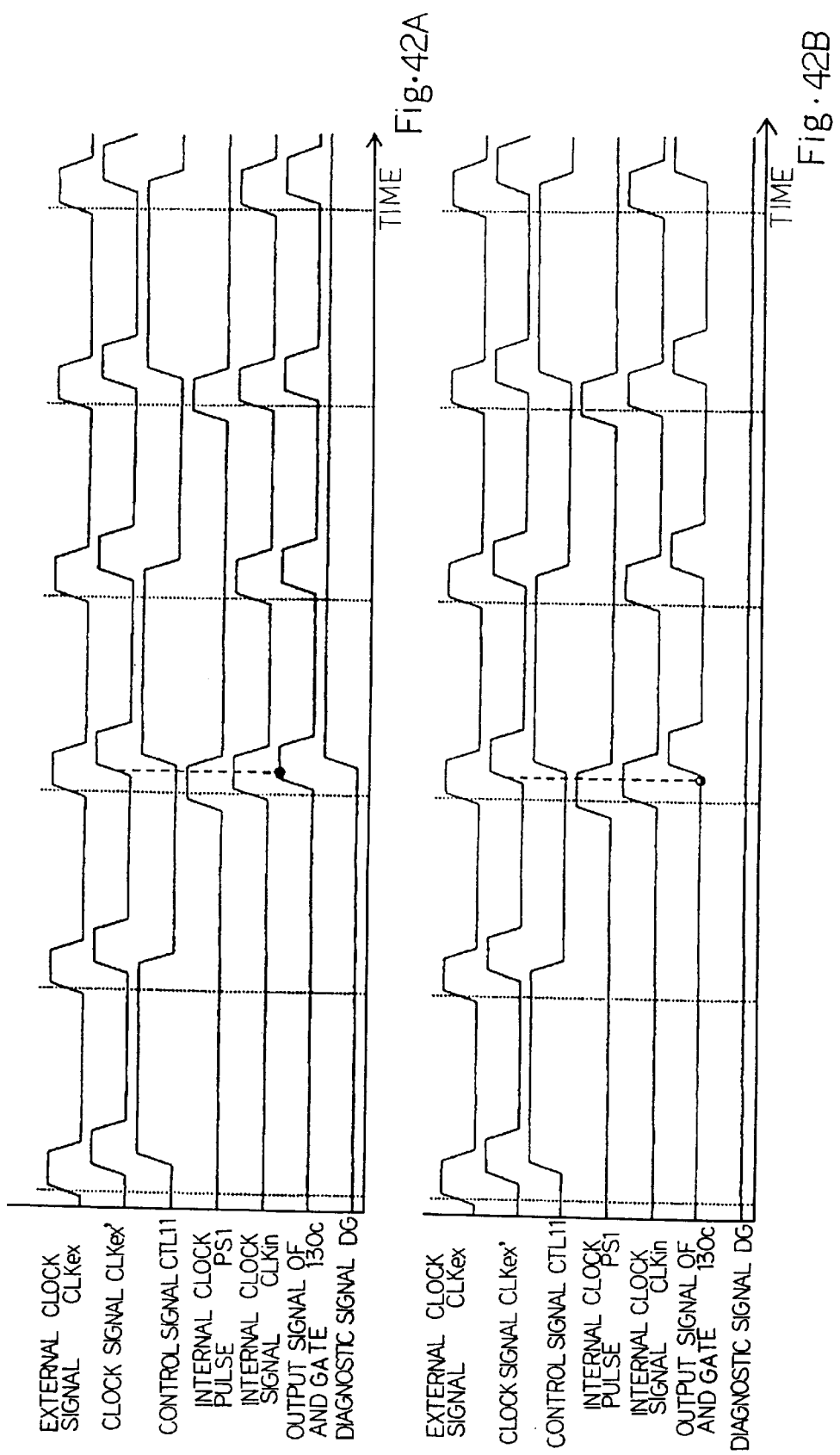

CLOCK GENERATING CIRCUIT HAVING HIGH RESOLUTION OF DELAY TIME BETWEEN EXTERNAL CLOCK SIGNAL AND INTERNAL CLOCK SIGNAL

FIELD OF THE INVENTION

This invention relates to a clock generating circuit and, more particularly, to a clock generating circuit incorporated in a semiconductor integrated circuit device for producing an internal clock signal synchronous with an external clock signal.

DESCRIPTION OF THE RELATED ART

FIG. 1 illustrates a typical example of the clock generating circuit incorporated in a semiconductor integrated circuit device 1. An external clock signal CLKex is supplied to a signal pin 1a, and is transferred from the signal pin 1a to a signal buffer circuit 1b. The signal buffer circuit 1b supplies it through a signal line 1c to an amplifier 1d, and the amplifier 1d produces an internal clock signal CLKin. The internal clock signal CLKin is supplied to an internal circuit 1e.

FIG. 2 illustrates delay time between the external clock signal CLKex and the internal clock signal CLKin. The external clock signal CLKex rises at time t1 and time t4, and a pulse repetition period Tc is defined as lapse of time between time t1 and time t4. While the signal line 1c is propagating the external clock signal CLKex, the potential level on the signal line 1c rises at time t2 and time t5, and delay time is introduced into the signal propagation. The amplifier further introduces delay time, and the internal clock signal CLKin rises at time t3 and time t6. Thus, the internal clock signal CLKin is delayed from the external clock signal CLKex by "TD", and the delay time TD is inherent in the prior art clock generating circuit.

The semiconductor manufacturers have increased the circuit components integrated on the integrated circuit device, and the circuit components and the signal lines are scaled down. The delay time TD tends to be increased. On the other hand, the internal circuit 1e has been speed up, and the pulse repetition period Tc is getting shorter and shorter. As a result, the ratio of delay time TD to the pulse repetition period Tc becomes larger, seriously affecting the behavior of the internal circuit 1e.

In order to prevent the internal circuit 1e from the serious delay TD, a phase locked loop is employed in the prior art clock generating circuit. FIG. 3 illustrates the phase locked loop incorporated in the prior art clock generating circuit. The phase locked loop comprises a delay circuit 2a connected to the amplifier 1d, a phase comparator 2b connected to the delay circuit 2a and the signal buffer 1b, a low-pass filter 2c connected to the phase comparator 2b and a voltage controlled oscillator 2d connected between the low-pass filter 2c and the amplifier 1d. The delay circuit 2a introduces delay time equal to the delay due to the signal buffer 1b, and produces a delayed clock signal CLKdy from the internal clock signal CLKin. The signal buffer 1b and the delay circuit 2a supply the external clock signal CLKex and the delayed clock signal CLKdy to the phase comparator 2b. The phase comparator 2b compares the external clock signal CLKex with the delayed clock signal CLKdy to see whether or not any phase difference takes place between the external clock signal CLKex and the delayed clock signal CLKdy. If the phase difference is found, the phase comparator 2b changes the magnitude of an error signal ER1 in such a manner as to eliminate the phase difference between the external clock signal CLKex and the delayed clock signal CLKdy, and supplies it to the low-pass filter 2c. The low-pass filter 2c produces a control signal CTL1 from the error signal ER1, and supplies it to the control node of the voltage controlled oscillator 2d. The potential level of the control signal CTL1 is varied in proportional to the magnitude of the error signal ER1, and the control signal CTL1 causes the voltage controlled oscillator 2d to eliminate the phase difference between the external clock signal CLKex and the delayed clock signal CLKdy. The voltage controlled oscillator 2d changes the frequency of an oscillation signal OSC1 in proportional to the potential level of the control signal CTL1, and supplies it to the amplifier 1d. The amplifier 1d produces the internal clock signal CLKin from the oscillation signal OSC1, and the phase locked loop controls the internal clock signal CLKin to be synchronous with the external clock signal CLKex.

Semiconductor memory devices are incorporated in a computer system, and data is transferred from and to the semiconductor memory devices. The data transmission speed sets a limit on the performance of the computer system, and a high speed data transmission is proposed. The high-speed data transmission is called "double data rate", and data input/output is twice repeated in a single clock period.

FIGS. 4A and 4B illustrate the behavior of a computer system designed in the double data rate transmission. In the data write-in operation, the clock signal rises at time t10, time t12, time t14 and time t16 (see FIG. 4A). A microprocessor (not shown) executes a command "WRITE" indicative of a data write-in at time t12, and concurrently supplies an address "A1" to an associated semiconductor memory device. The write-in data "D1" to "D4" are supplied to the semiconductor memory device at time t12, time t13, time t14 and time t15, respectively. The write-in data "D1" and "D3" are synchronous with the pulse rise at time t12 and time t14. However, the write-in data "D2" and "D4" are supplied to the semiconductor memory device at intermediate timings between time t12 and time t14 and between time t14 and time t16.

Similarly, data is read out from the semiconductor memory device at a pulse rise and an intermediate timing as shown in FIG. 4B. The clock signal rises at time t20, time t22, time t24 and time t26 (see FIG. 4B). A microprocessor (not shown) executes a command "READ" indicative of a data read-out at time t20, and concurrently supplies an address "A1" to an associated semiconductor memory device. The read-out data "Q1" to "Q4" are read out from the semiconductor memory device at time t24, time t25, time t26 and time t27, respectively. The read-out data "Q1" and "Q3" are synchronous with the pulse rise at time t24 and time t26. However, the write-in data "Q2" and "Q4" are supplied from the semiconductor memory device at intermediate timings between time t24 and time t26 and between time t26 and the next time.

Thus, the data write-in/data read-out is twice repeated in each pulse repetition period. If the clock frequency is 66 MHz, the data transmission speed is 132 mega-bits per second, and is twice as fast as the clock frequency. For this reason, the double data rate transmission is employed in a high-speed SRAM (Static Random Access Memory), a synchronous DRAM (Dynamic Random Access Memory) II and a sink-rink DRAM as reported in Nikkei Micro Device, 1997, February, page 11. Moreover, the double data rate transmission is employed in the data transmission between a graphics controller and a system controller as defined in the AGP (Accelerated Graphics Port interface) specification, revision 1.0, Intel Corporation, Jul. 31, 1996.

As described hereinbefore, the first timing is defined by the pulse rise, and the second timing is provided in the intermediate period. The pulse decay is not used for the second timing. This is because of the fact that the difference between the pulse rise time and the pulse decay time is non-ignoreable in a high-frequency clock signal. In detail, if the pulse is asymmetrical between the leading edge and the trailing edge, the asymmetric pulse gives different timings between the pulse rise and the pulse decay with respect to a certain threshold, and, accordingly, the pulse repetition period is unevenly divided into a low level sub-period and a high level sub-period. This means that the data cycle time is different between two data codes.

FIG. 5 illustrates a prior art clock generating circuit incorporated in a semiconductor integrated circuit device adopted in the double data rate transmission. A frequency divider 3a is connected between the amplifier 1d and a delay circuit 3b, and the other components are labeled with the same references designating corresponding components of the prior art phase clock generating circuit shown in FIG. 3. The delay circuit 3b introduces delay time in such a manner as to be equal to the difference between the delay due to the signal buffer 1b and the delay time due to the frequency divider 3a. The frequency divider 3a reduces the frequency of the internal clock signal CLKin to a half, and supplies the low-frequency internal clock signal CLKin' through the delay circuit 3b to the phase comparator 2b. The phase comparator 2b makes the low-frequency internal clock signal CLKin' synchronous with the external clock signal CLKex, and causes the voltage controlled oscillator 2d to generate the oscillation signal OSC1 twice as high in frequency as the external clock signal CLKex. As a result, the internal clock signal CLKin has a certain frequency twice as high as the frequency of the external clock signal CLKex. An internal clock pulse is in-phase to the external clock pulse, and the next internal clock pulse is different from the external clock pulse by 180 degrees. Using these internal clock pulses, the semiconductor integrated circuit device realizes the double data rate transmission.

However, the prior art clock generating circuit for the double data rate transmission encounters a problem in long time period consumed until the phase adjustment. When the prior art clock generating circuit starts the phase adjusting sequence, the internal clock signal CLKin is usually different in phase from the external clock signal CLKex, and the phase difference is gradually decreased to zero through the operation of the phase locked loop. The phase locked loop usually repeats the operation more than ten times, and consumes long time until the phase adjustment.

Moreover, the phase locked loop is continuously working for the phase adjustment, and consumes a large amount of electric power. If the prior art clock generating circuit is incorporated in the semiconductor dynamic random access memory devices, the prior art clock generating circuits increase standby current consumption of the semiconductor dynamic random access memory devices, and the current consumption of the semiconductor dynamic random access memory devices forms large part of the standby current consumption of a computer system.

Yet another problem of the prior art clock generating circuit is low reliability. The voltage controlled oscillator 2d controls the oscillating frequency with the voltage. This means that the power voltage is expected to be stable. If the power voltage level is unintentionally decreased, the control voltage range becomes narrow, and the voltage controlled oscillator can not precisely control the oscillating frequency.

In order to overcome the problems inherent in the prior art clock generating circuit shown in FIG. 5, two approaches have been proposed. One of the approaches is called as "register-controlled delay-locked loop", and is disclosed in IEICE Trans. Electron., vol 1.E79-C, No. 6, pages 798 to 807. The second approach is called as "synchronous mirror delay", and is disclosed in Japanese Patent Publication of Unexamined Application No. 8-237091. The register-controlled delay-locked loop and the synchronous mirror delay are abbreviated as "RDLL" and "SMD", respectively.

FIG. 6 illustrates the prior art clock generating circuit, and the register-controlled delay-locked loop scheme is used in the prior art clock generating circuit. An external clock signal CLKex is supplied to the signal pin 1a, and is transferred to the signal buffer 1b. The internal clock signal CLKin is delivered from the amplifier 1d as similar to the prior art clock generating circuit shown in FIG. 5. The signal buffer 1b supplies the external clock signal CLKex to one input node of a phase comparator 4. A series of delay circuits 5 and 6 is connected to the other input node of the phase comparator 4. The delay circuit 5 introduces delay time equal to the delay due to the signal buffer 1b, and the delay of the other delay circuit 6 is equal to the delay due to the amplifier 1d. The series of delay circuits 5/6 supplies a delayed clock signal CLKdy to the phase comparator 4, and the phase comparator 4 produces a status signal ER2 representative of the phase difference between the external clock signal CLKex and the delayed clock signal CLKdy. Namely, the status signal ER2 is selectively representative of advanced status, delayed status and in-phase status.

The status signal ER2 is supplied to a controller 7. The controller 7 is responsive to the status signal ER2 so as to selectively change control signals CTL1, CTL2, CTL3 and CTL4. The control signals CTL1 to CTL4 are supplied to a shift register 8. The shift register 8 has N stages 81, ... 8n–1, 8n, 8n+1, ... and 8N, and the plural stages 81 to 8N supply control signals N1, ... Nn–1, Nn, Nn+1, ... NN to a control circuit 9. The control circuit 9 is associated with a variable delay circuit 10, and controls the delay time.

The control circuit 9 has NAND gates NA11, ... NA1n–1, NA1n, NA1n+1, ... and NA1N, and the external clock signal CLKex is supplied to the NAND gates NA11 to NA1N. The control signals N1 to NN are further supplied to the NAND gates NA11 to NA1N, respectively, and one of the NAND gates NA11 to NA1N supplies a complementary clock signal CLKBex to the variable delay circuit 10.

The variable delay circuit 10 has NAND gates NA21, ... NA2n–1, NA2n, NA2n+1, ... NA2N arranged in series and inverters IV11, ... Ivn–1, Ivn, Ivn+1, ... inserted between the NAND gates NA21 to NA2N. One of the input nodes of the NAND gate NA21 is connected to the power supply line Vdd, and the output nodes of the inverters IV11 to Ivn+1, ... are respectively connected to the input nodes of the next NAND gates. The NAND gates NA11 to NA1N are respectively associated with the NAND gates NA21 to NA2N, and the complementary clock signal CLKBex is selectively supplied to the other input nodes of the NAND gates NA21 to NA2N. The output node of the NAND gate NA2N is connected to the delay circuit 5 and the amplifier 1d.

The prior art clock generating circuit shown in FIG. 6 behaves as follows. The shift register 8 is assumed to maintain the control signal Nn in the high level and the other control signals N1 to Nn–1 and Nn+1 to NN in the low level. Only the NAND gate NA1n is enabled with the control signal Nn, and becomes responsive to the external clock signal CLKex. The NAND gate NA1n supplies the complementary clock signal to the NAND gate NA2n, and the external clock signal/complementary clock signal CLKex/ CLKBex is propagated from the NAND gate NA2n to the delay circuit 5 and the amplifier 1d. The NAND gates NA2n to NA2N and the inverters IN1n . . . introduces certain delay time during the propagation of the external clock signal/ complementary clock signal CLKex/CLKBex.

The phase comparator 4 is assumed to admit the delayed clock signal CLKdy to be the in-phase status. The controller 7 keeps the control signals CTL1 to CTL4 low, and the shift register 8 does not change the control signals N1 to NN. As a result, the variable delay circuit 10 does not change the delay time.

On the other hand, when the phase comparator 4 finds the clock signal CLKdy is delayed from the external clock signal CLKex, the phase comparator 4 informs the controller 7 of the delayed status, and the controller 7 changes only the control signal CTL4 to the high level. The control signal CTL4 of the high level causes the shift register 8 to change the control signal Nn to the low level and the control signal Nn+1 to the high level. The NAND gate NA1n is disabled with the control signal NA of the low level, and the NAND gate NA1n+1 is enabled with the control signal NA1n+1. Then, the complementary clock signal CLKBex is propagated from the NAND gate 2n+1 to the delay circuit 5 and the amplifier 1d, and the delay time is shortened, because the complementary clock signal/external clock signal CLKBex/ CLKex do not pass the NAND gate NA2n and the inverter INV1n. If the clock signal CLKdy is still delayed from the external clock signal CLKex, the controller 7 changes only the control signal CTL3 to the high level, and causes the shift register 8 to rightwardly shift the control signal of the high level. In this way, while the clock signal CLKdy is being delayed, the controller 7 selectively changes the control signals CTL3 and CTL4 in order to rightwardly shift the control signal of the high level, and the variable delay circuit 10 stepwise shortens the signal proapgation path for the complementary clock signal/external clock signal CLKBex/CLKex.

On the other hand, when the phase comparator 4 finds the delayed clock signal CLKdy to be advanced from the external clock signal CLKex, the controller 7 selectively changes the control signals CTL1/CTL2 so that the shift register 8 stepwise shifts the control signal of the high level leftwardly, and the variable delay circuit 10 prolongs the signal propagation path for the complementary clock signal/ external clock signal CLKBex/CLKex.

Thus, the variable delay circuit 10 changes the signal propagation path under the control of the shift register 8, and the the prior art clock generating circuit makes the internal clock signal CLKin in-phase to the external clock signal CLKex. The prior art clock generating circuit repeats the above described sequence tens times until the phase matching. However, even if the phase comparator 4 or the controller 7 stops the given task, the shift register 8 stores the appropriate propagation length. When the phase comparator 4 and the controller 7 restart the synchronous operation, the shift register 8, the controlling circuit 9 and the variable delay circuit 10 immediately make the delayed clock signal CLKdy synchronous with the external clock signal CLKex. For this reason, if the internal circuit does not require the internal clock signal CLKin, the prior art clock generating circuit is powered off except for the shift register 8, and the electric power consumption is drastically reduced.

The register-controlled delay-locked loop scheme is available for the double data rate transmission. FIG. 7 illustrates a prior art clock generating circuit for the double data rate transmission. The control circuit 9, the variable delay circuit 10 and the pair of delay circuits 5/6 are doubled in the prior art clock generating circuit, and another control circuit, another variable delay circuit and another pair of delay circuits are labeled with "11", "12" and "13/14", respectively. The delay circuit 5/13 and the delay circuit 6/14 introduce the delay time equivalent to the signal buffer 1b and the amplifier 1d, respectively, and the delayed clock signal CLKdy is supplied from the delay circuit 14 to the phase comparator 4. The phase comparator 4 compares the delayed clock signal CLKdy with the external clock signal CLKex to see whether or not the delayed clock signal CLKdy is synchronous with the external clock signal CLKex. The phase comparator 4 produces the status signal ER2 representative of the current status between the delayed clock signal CLKdy and the external clock signal CLKex.

The controller 7 selectively changes the control signals CTL1 to CTL4 to the active high level. If the clock signal CLKdy is delayed from the external clock signal CLKex, the controller 7 selectively changes the control signals CTL4 and CTL3 to the active high level, and the shift register 8 stepwise shifts the control signal of the active high level rightwardly, and the control circuits 9/11 cause the associated variable delay circuits 10/12 to shorten the signal propagation paths; On the other hand, if the clock signal CLKdy is advanced, the controller 7 selectively changes the control signals CTL1 and CTL2 to the active high level, and the shift register 8 stepwise shifts the control signal of the active high level rightwardly. As a result, the control circuits 9/11 cause the associated variable delay circuits 10/12 to prolong the signal propagation paths.

The amplifier 1d is connected between the variable delay circuit 10 and the variable delay circuit 12, and the amplifier 1d raises the internal clock signal CLKin at the mid point of the pulse width of the external clock signal CLKex. In other words, the prior art clock generating circuit shown in FIG. 7 generates the internal clock signal CLKin 180 degrees delayed from the external clock signal CLKex. The prior art clock generating circuit shown in FIG. 7 is combined with the prior art clock generating circuit shown in FIG. 6. The combination raises the internal clock signal at the pulse rise of the external clock signal CLKex and the mid point between the external clock pulses, and is available for the double data rate transmission.

FIG. 8 illustrates a prior art clock generating circuit, and the synchronous mirror delay scheme is used in the prior art clock generating circuit. The prior art clock generating circuit comprises the signal buffer 1b, the delay circuits 5/6, a first delay line 15, a second delay line 16, a signal transfer circuit 17 connected between the first delay line 15 and the second delay line 16 and the amplifier 1d. The delay circuits 5 and 6 introduce delay time equal to the delay due to the signal buffer 1b and delay time equal to the delay due to the amplifier 1d, respectively.

The first delay line 15 includes plural delay stages 150, 151, 152, . . . 15n, 15n+1, 15n+2, . . . . 15N connected in series, and each of the delay stages 150 to 15N is implemented by a series combination of NAND gate NA3 and an inverter INV2. The signal buffer 1b supplies the external clock signal CLKex to the NAND gate NA3 of the first stage 150, and the external clock signal CLKex is propagated toward the final delay stage 15N.

The second delay line 16 also includes plural delay stages 160, . . . 16N-n-1, 16N-n, 16N-n+1, . . . 16N-1 and 16N connected in series, and each of the delay stages 160 to 16N is implemented by a NAND gate NA4 and an inverter INV3.

The delay stages 160 to 16N are equal to the delay stages 150 to 15N, and the delay stages 150 to 15N are respectively associated with the delay stages 16N to 160. The second delay line 16 leftwardly propagates a signal from stage to stage. Thus, the direction of signal propagation is opposite between the first delay line 15 and the second delay line 16.

Plural NAND gates NA5 form in combination the signal transfer circuit 17, and are associated with the delay stages 150 to 15N and, accordingly, the delay stages 16N to 160. The NAND gates NA5 have respective input nodes connected to the output nodes of the inverters INV2 of the associated delay stages 150 to 15N and other input nodes supplied with the external clock signal CLKex. The output nodes of the NAND gates NA5 are connected to the input nodes of the NAND gates NA4 of the associated delay stages 16N to 160. The inverter INV3 of the final stage 16N is connected to the amplifier 1d, and the amplifier 1d supplies the internal clock signal CLKin to an internal circuit (not shown).

The prior art clock generating circuit behaves as follows. The first external clock pulse is supplied from the signal pin 1a through the signal buffer 1b and the delay circuits 5/6 to the first delay stage 150, and the first delay line 15 propagates the first external clock pulse toward the final delay stage 15N. The second external clock pulse is supplied from the signal buffer 1b to the NAND gates NA5, and the NAND gates NA5 are simultaneously enabled with the second external clock pulse. If the first external clock pulse reaches the delay stage 15n, the NAND gate NA5 transfers the first external clock pulse from the inverter INV2 of the delay stage 15n to the NAND gate NA4 of the delay stage 16N-n. The first external clock pulse is propagated from the delay stage 16N-n to the delay stage 16N. The first external clock pulse is supplied from the inverter INV3 of the final delay stage 16N to the amplifier 1d, and the amplifier 1d supplies an internal clock pulse to the internal circuit (not shown).

The signal buffer 1b and the amplifier 1d are assumed to respectively introduce delay time t1 and delay time t2. The delay circuits 5 and 6 also introduce the delay time t1 and the delay time t2, respectively, and the first external clock pulse consumes time td during the propagation from the delay stage 150 to the delay stage 15n. The cycle time tCK is defined as time deference between the pulse rise of the first external clock pulse and the pulse rise of the second external clock pulse, and the first external clock pulse consumes time equal to the cycle time tCK until the delay stage 15n. For this reason, the cycle time tCK is equal to the total delay time (td+t1+t2).

From the application of the second external clock pulse to the signal pin 1a to the generation of the internal clock pulse from the first external clock pulse, the second external clock pulse introduces the delay time t1 due to the signal buffer 1b, the first external clock pulse is propagated from the delay stage 16N-n to the final delay stage 16N, and the amplifier 1d increases the magnitude of the first external clock pulse for the internal clock pulse. For this reason, the total of the delay time is expressed as (t1+td+t2). Thus, the internal clock pulse is generated at the pulse rise of the third external clock pulse, and the prior art clock generating circuit eliminates phase difference during the two cycles. If the internal clock signal CLKin is not required, the prior art clock generating circuit is powered off, and the current consumption in the waiting period is decreased to zero.

The synchronous mirror delay is available for the double data rate transmission. FIG. 9 illustrates a prior art clock generating circuit for the double data rate transmission. In the prior art clock generating circuit for the double data rate transmission, delay circuits 18/19 are inserted between the delay circuit 6 and the first delay line 15, and the second delay line 16 is doubled so that two signal propagation paths 20a/20b are incorporated in a second delay line 20. The external two signal propagation paths 20a/20b are connected in parallel to an OR gate OR1 of an amplifier 21. The signal propagation path 20a has delay stages connected to the odd delay stages 150, . . . of the first delay line 15, and the other signal propagation path 20b has delay stages connected to the even delay stages 151, . . . of the first delay line 15. For this reason, the delay stages of each signal propagation path 20a/20b are equal to a half of the delay stages of the first delay line 15, and each signal propagation path 20a/20b introduces delay time as half as the delay time introduced by the second delay line 16. Each of the delay stages of the second delay line 20 is implemented by the series combination of the NAND gate NA4 and the inverter INV3.

The delay circuit 5/18 and the other delay circuit 6/19 introduce delay time equal to the delay due to the signal buffer 1b and delay time equal to the delay due to the amplifier 21, respectively. The first delay line 15 propagates an external clock pulse for time td, and the second delay line 20 introduces delay time td/2 during the propagation of the external clock pulse along either propagation path 20a/20b. The first external clock pulse and the second external clock pulse defines the cycle tile tCK equal to (2×t1+2×t2+td), and the amplifier 21 produces an internal clock pulse from the first external clock pulse after the lapse of time equal to (t1+td/2+t2). The lapse of time is a half of the cycle time tCK. Thus, the internal clock pulse is 180 degrees delayed from the second external clock pulse. When the prior art clock signal generating circuit shown in FIG. 9 is combined with the prior art clock generating circuit shown in FIG. 8, the combination synchronously generates the internal clock signal CLKin appropriate to the double data rate transmission.

Thus, the prior art clock generating circuit formed in the register-controlled delay-locked loop scheme/synchronous mirror delay scheme is available for the double data rate transmission, and immediately makes the internal clock signal CLKin synchronous with the external clock signal CLKex. The prior art clock generating circuit drastically decreases the electric power consumption during the waiting time, and the accurately adjusts the internal clock signal CLKin to a target frequency regardless of the stability of the power voltage.

However, the prior art clock generating circuit in the register-controlled delay-locked loop scheme and the prior art clock generating circuit in the synchronous mirror delay scheme hardly satisfy requirements of the next double data rate transmission, and are available for only narrow frequency range. The next double data rate transmission requires an internal clock signal much higher in frequency than the internal clock signal CLKin. If the prior art clock generating circuits are driven at higher frequency, the window for the input data and the output data becomes narrower. This results in reduction of the margin.

In detail, the semiconductor memory device requires an input set-up time ts and an input hold time th1 for a data write-in operation as shown in FIG. 4A. The semiconductor memory device holds an input data signal during the input set-up time ts, and the input set-up time ts and the input hold time th1 are parted before and behind the leading edge of the clock signal. Similarly, the semiconductor memory device requires an access time ta and an output hold time th2 for a data read-out operation as shown in FIG. 4B. The semiconductor memory device determines the logic level of the read-out data during the access time, and holds the previous read-out data in the output hold time th2.

As described hereinbefore, the prior art clock generating circuits shown in FIGS. 6 and 7 stepwise change the delay time through the shift of the control signal, and each delay stage NA21/IV11, . . . introduces a piece of delay time as the unit into the propagation of the complementary clock signal/external clock signal CLKBex/CLKex. In other words, the resolution of the prior art clock generating circuits in the register-controlled delay-locked loop scheme is equivalent to the two stages of logic gate. Similarly, the prior art clock generating circuits shown in FIGS. 8 and 9 stepwise change the delay time through the signal propagation of the external clock signal CLKex, and two logic gates in the delay line introduces the unit of delay. For this reason, the resolution of the prior art clock generating circuits in the synchronous mirror delay scheme is also equivalent to the two stages of logic gate. In this situation, the cycle time tCK is variable within the unit of delay, and the variation of cycle time tCK causes the internal clock pulse to be generated at a different timing. This results in that the internal clock signal CLKin is offset from the external clock signal CLKex. If the internal clock signal CLKin is offset from the external clock signal CLKex, the margin for the input set-up time ts, the input hold time th1, the access time ta and the output hold time th2 is changed, because they are defined on the basis of the external clock signal CLKex.

The data read-out timing and the data write-in timing are variable with parasitic capacitance and/or parasitic inductance coupled to the data input/output signal lines, and the fluctuation of the internal clock signal CLKin merely admits the data read-out timing and the data write-in timing to vary within a narrow range. If the user requests the manufacturer to keep the margin for the data read-out and the data write-in wide, the manufacturer is required to strictly control process parameters during the fabrication. Otherwise, the manufacturer abandons the speed-up.

Another problem inherent in the prior art is undesirable waveform distortion in the internal clock signal CLKin. Each delay stage in the variable delay circuits 10/12 and the first/second delay lines 15/16/20 consists of a NAND gate and an inverter connected in series. A parallel combination of p-channel type field effect transistors and a series combination of n-channel type field effect transistors form parts of the standard NAND gate, and are causative of the waveform distortion due to different in transition time between the pulse rise and the fall. In the worst case, the prior art clock generating circuit loses an internal clock pulse.

SUMMARY OF THE INVENTION

It is therefore an important object of the present invention to provide a clock signal generating circuit, which generates an internal clock signal synchronous with an external clock signal variable in a wide frequency range without the waveform distortion and large electric power consumption.

In accordance with one aspect of the present invention, there is provided a clock generating circuit comprising a first controller responsive to a preliminary clock signal for producing a first control signal changed from a first level to a second level in a first time period equal to a pulse period of the preliminary clock signal and from the second level to the first level in a second time period equal to the pulse period and alternated with the first time period, a first complementary control signal complementarily changed between the first level and the second level with respect to the first control signal and a first input signal changed from an inactive level to an active level in the first time period, a first delay circuit including a plurality of first delay stages connected in series through first signal transfer lines and second signal transfer lines respectively paired with the first transfer lines and responsive to the first input signal for generating a first potential edge signal and propagating the first potential edge signal from a first delay stage connected through an input signal line to the controller toward a certain delay stage of the plurality of delay stages in the first time period and from the certain delay stage through the first delay stage to a first output signal line in the second time period and a first one-shot pulse generator connected to the first output signal line so as to produce a first internal clock pulse keeping a constant phase relation to a preliminary clock pulse of the preliminary clock signal in the second time period, and each of the plurality of first delay stages has a first charging circuit connected to a first power voltage line and enabled with the first control signal in the second time period so as to become responsive to a potential level on the first signal line to the next delay stage for providing a current path from the first power voltage line to one of the first output signal line and the second signal line from the previous delay stage, a first discharging circuit connected to a second power voltage line different in potential level from the first power voltage line and enabled with the first control signal in the first time period so as to become responsive to a potential level on one of the first input signal line and the first signal line from the previous delay stage for providing a current path from the aforesaid one of the first output signal line and the second signal line to the second power voltage line, a second charging circuit connected to the first power voltage line and enabled with the first complementary control signal in the first time period so as to become responsive to a potential level on the aforesaid one of the output signal line and the second signal line from the previous delay stage for providing a current path from the first power voltage line to the first signal line to the next delay stage and a second discharging circuit connected to the second power voltage line and enabled with the first complementary control signal in the second time period so as to become responsive to a potential level on the second signal line to the next delay stage.

BRIEF DESCRIPTION OF THE DRAWINGS

The features and advantages of the clock generating circuit will be more clearly understood from the following description taken in conjunction with the accompanying drawings in which:

FIGS. 4A and 4B are timing charts showing the behavior of the computer system designed in the double data rate transmission;

FIGS. 42A and 42B are timing charts showing the behavior of a test circuit incorporated in the clock generating circuit.

DESCRIPTION OF THE PREFERRED EMBODIMENTS

First Embodiment

Figure 1:
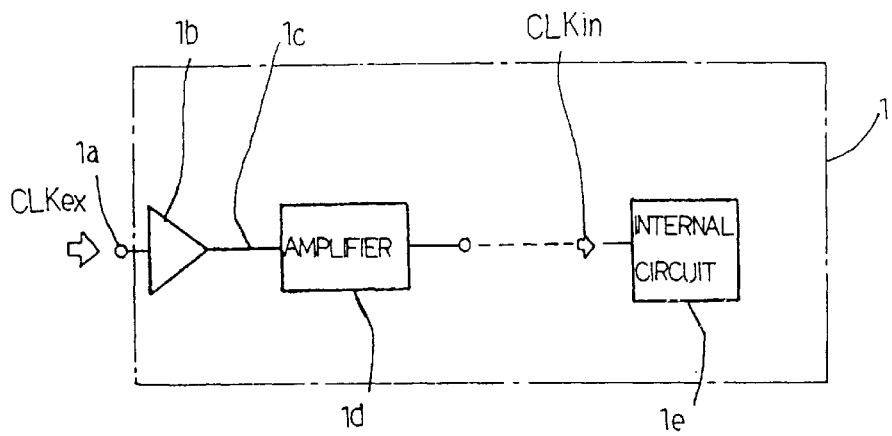
FIG. 1 is a block diagram showing the prior art clock generating circuit.
Figure 2:
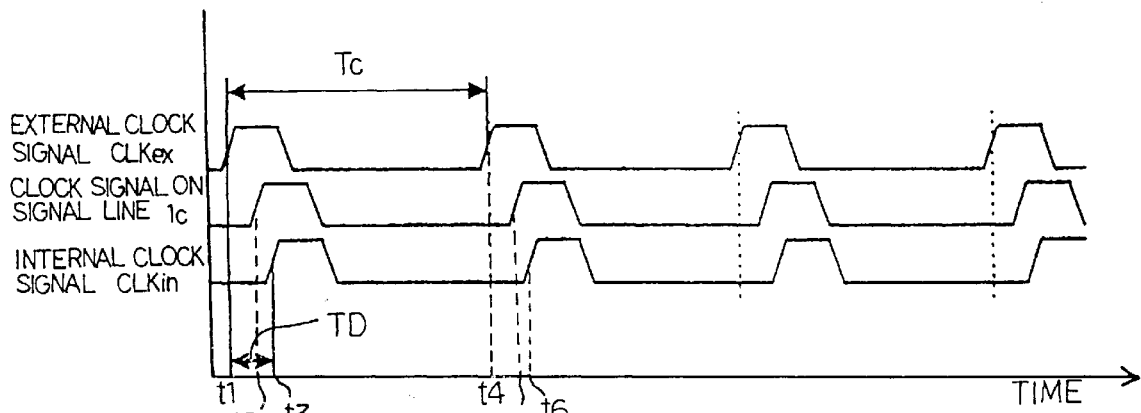
FIG. 2 is a timing chart showing the behavior of the prior art clock generating circuit.
Figure 3:
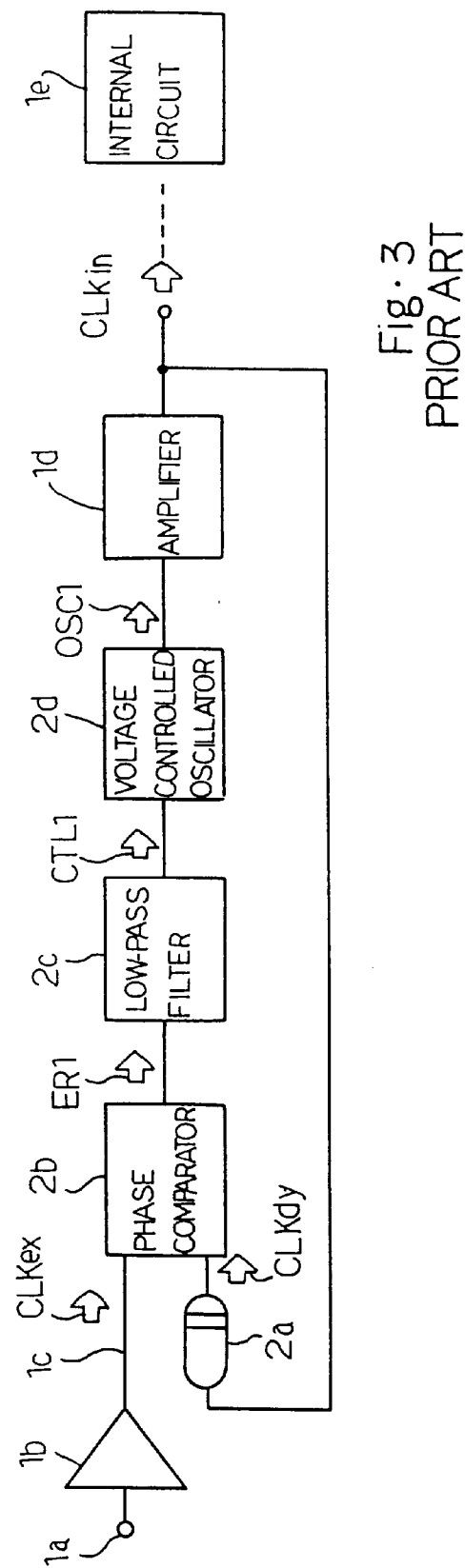
FIG. 3 is a block diagram showing the phase locked loop incorporated in the prior art clock generating circuit.
Figure 5:
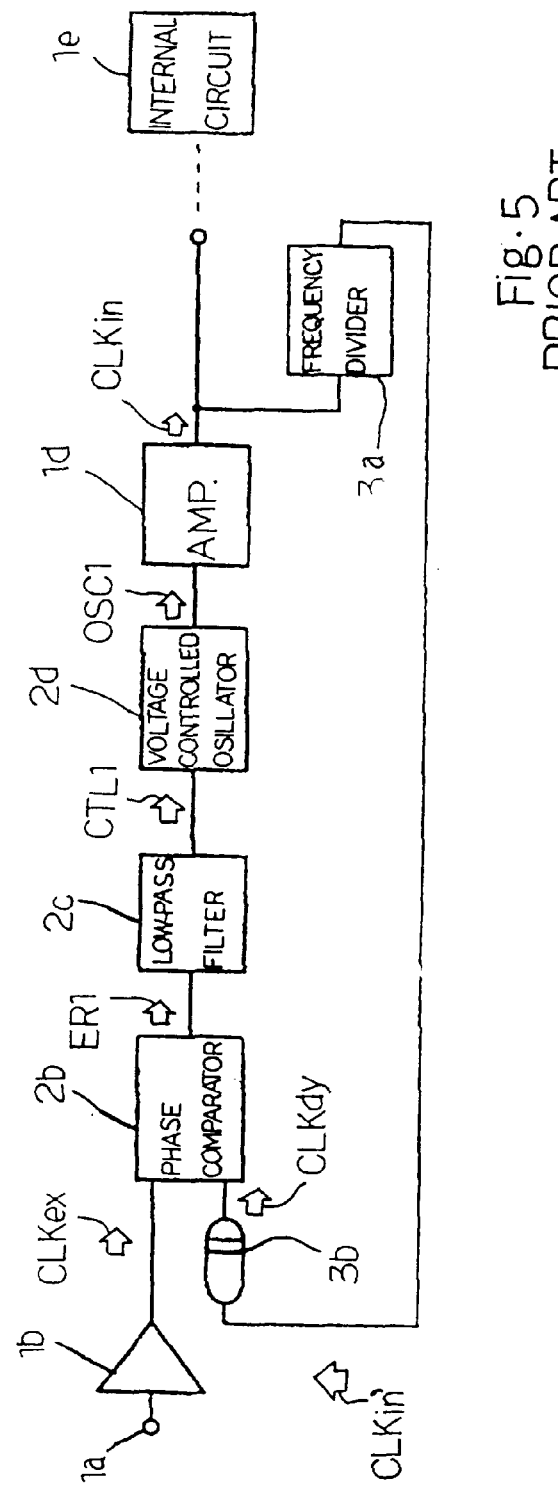
FIG. 5 is a clock diagram showing the prior art clock generating circuit used in a semiconductor integrated circuit device adopted in the double data rate transmission.
Figure 6:
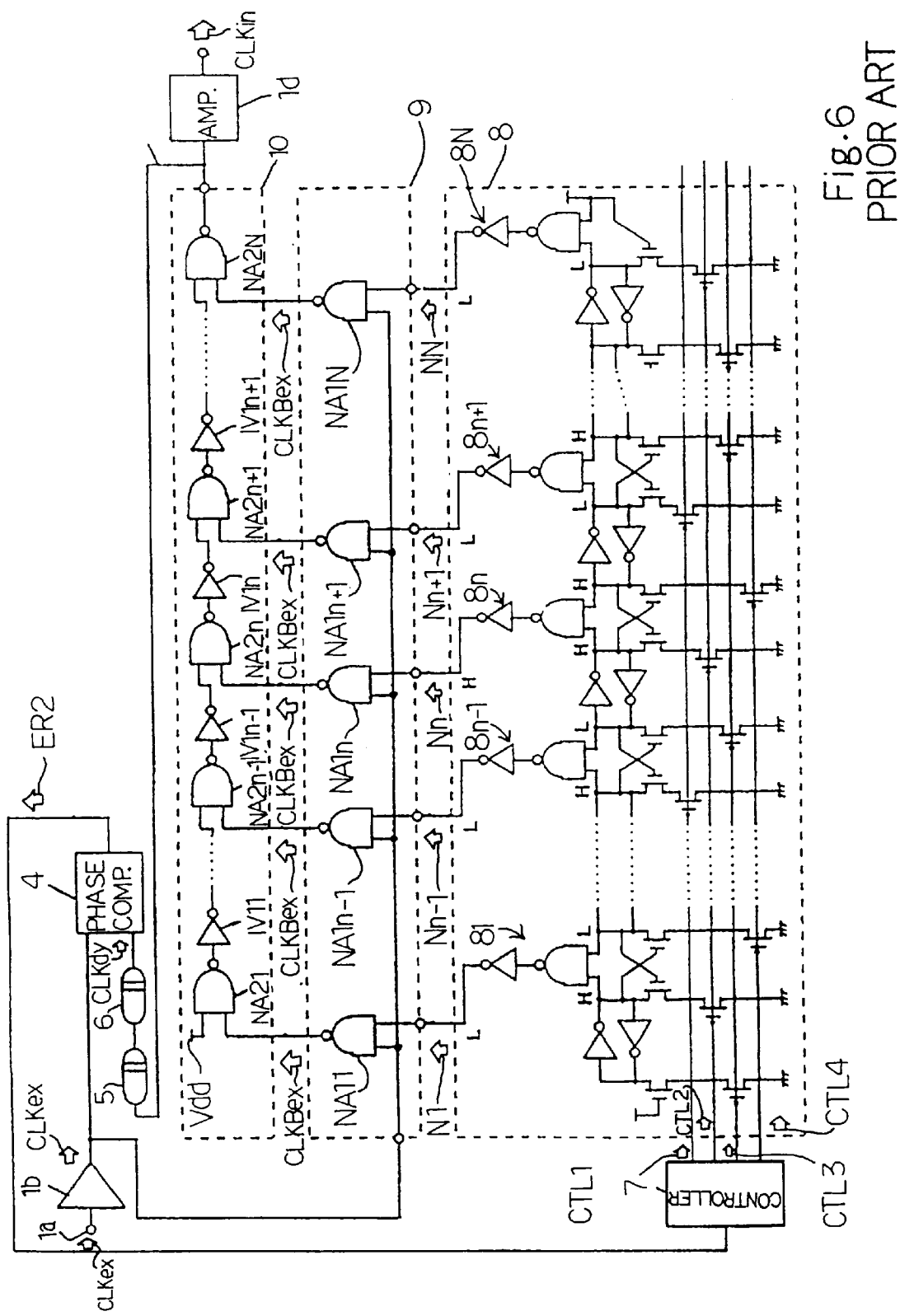
FIG. 6 is a circuit diagram showing the circuit configuration of the prior art clock generating circuit formed in the register-controlled delay-locked loop scheme.
Figure 7:
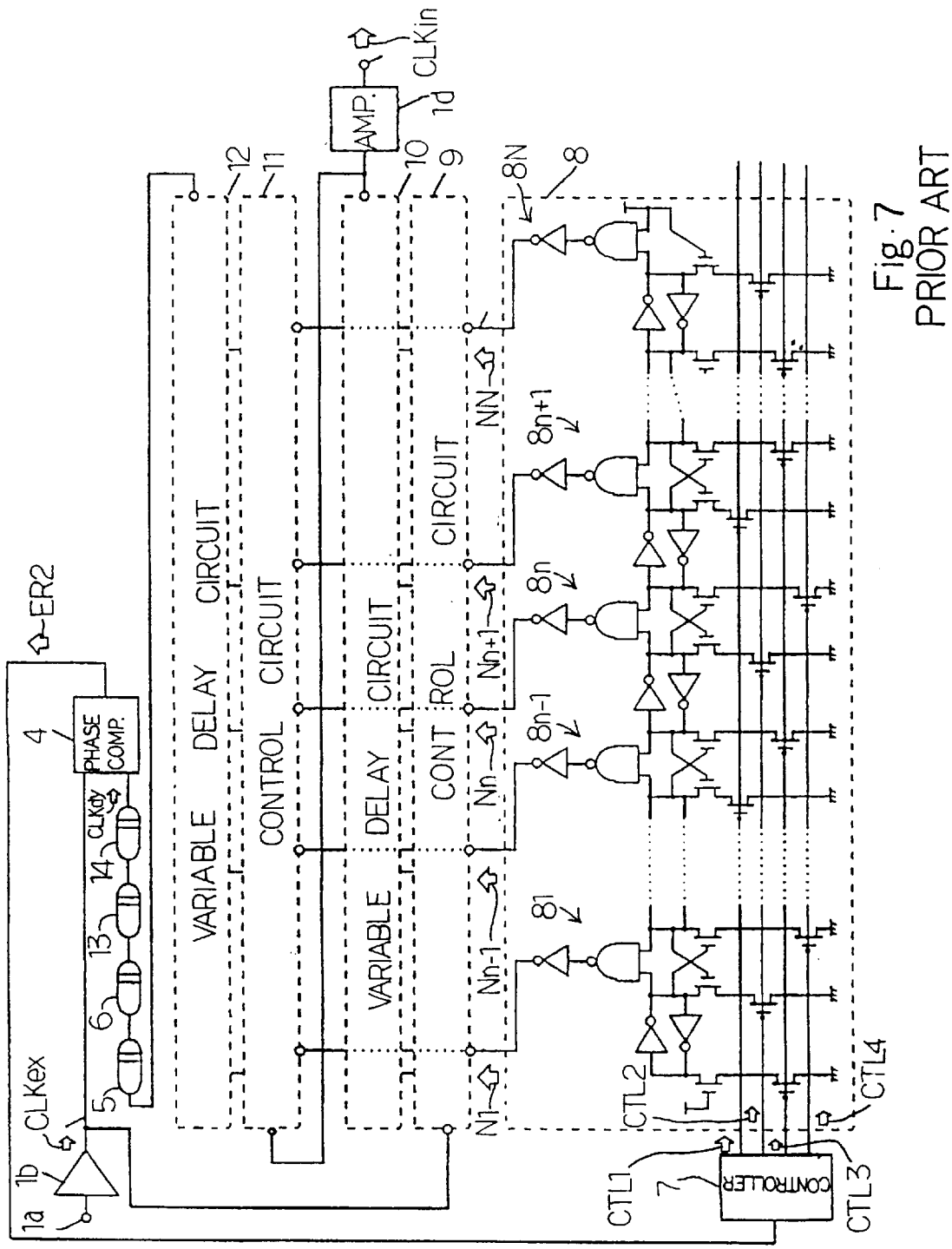
FIG. 7 is a circuit diagram showing the circuit configuration of the prior art clock generating circuit for generating the internal clock signal 180 degrees delayed from the external clock signal.
Figure 8:
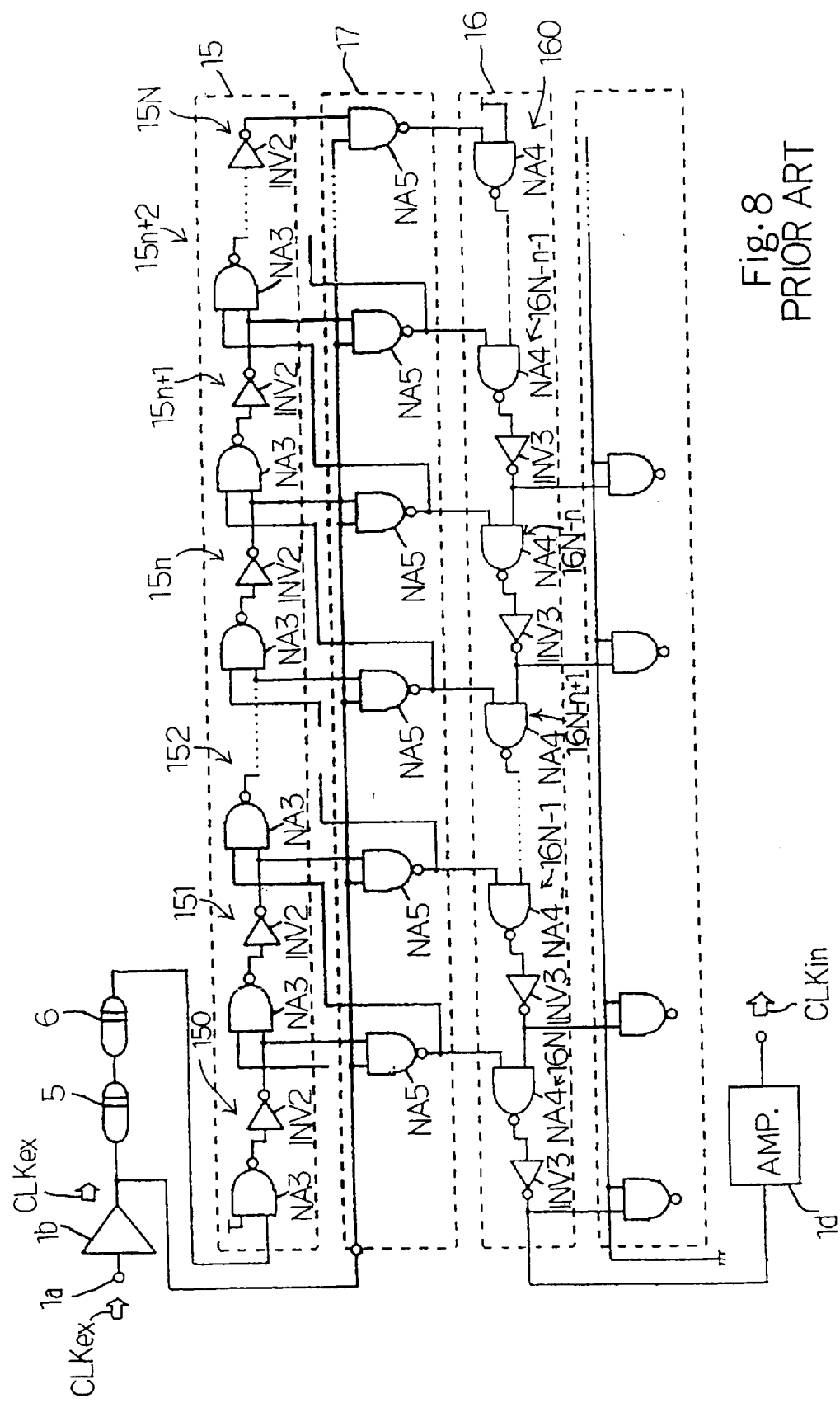
FIG. 8 is a circuit diagram showing the circuit configuration of the prior art clock generating circuit formed in the synchronous mirror delay scheme.
Figure 9:
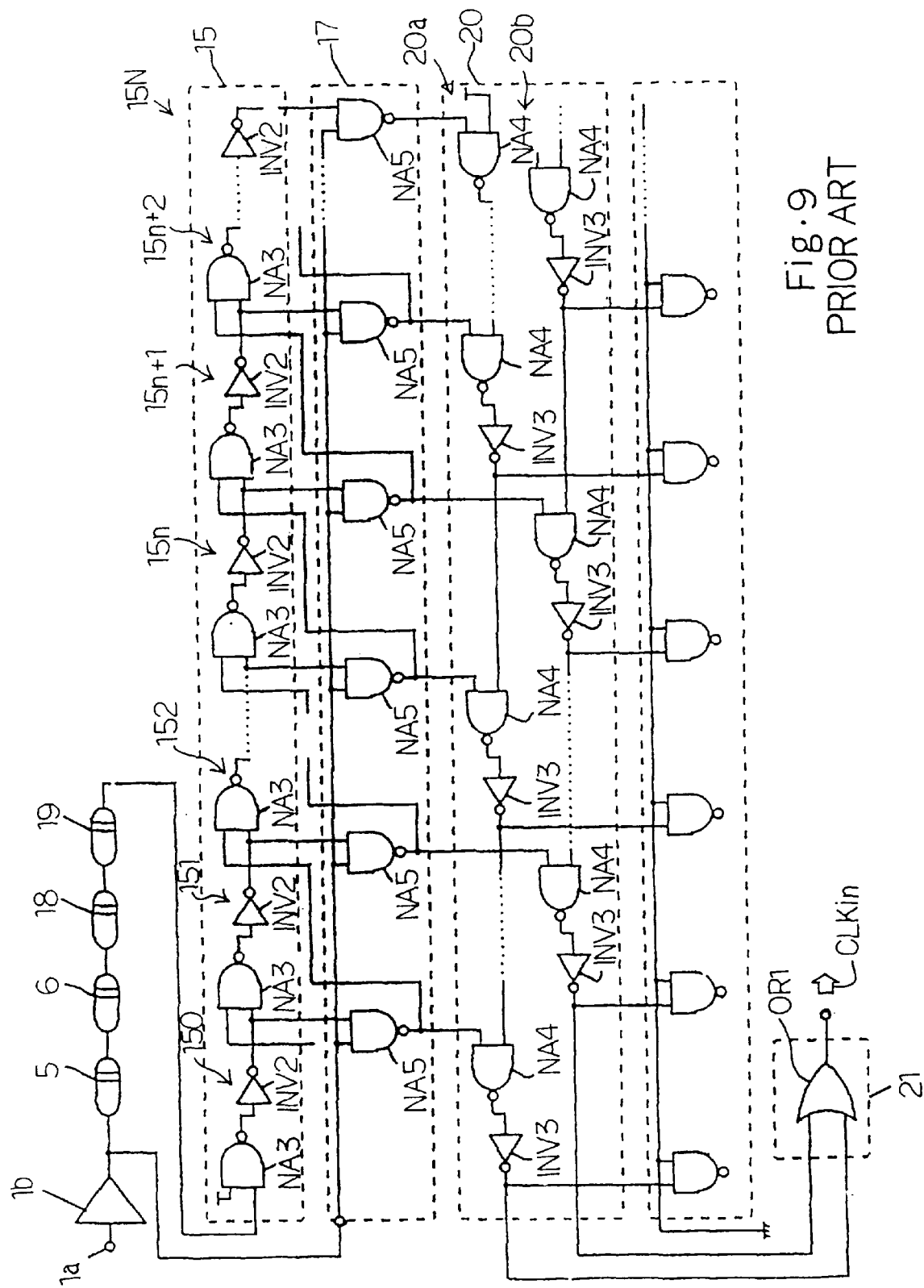
FIG. 9 is a circuit diagram showing the circuit configuration of the prior art clock generating circuit available for the double data rate transmission.
Figure 10:
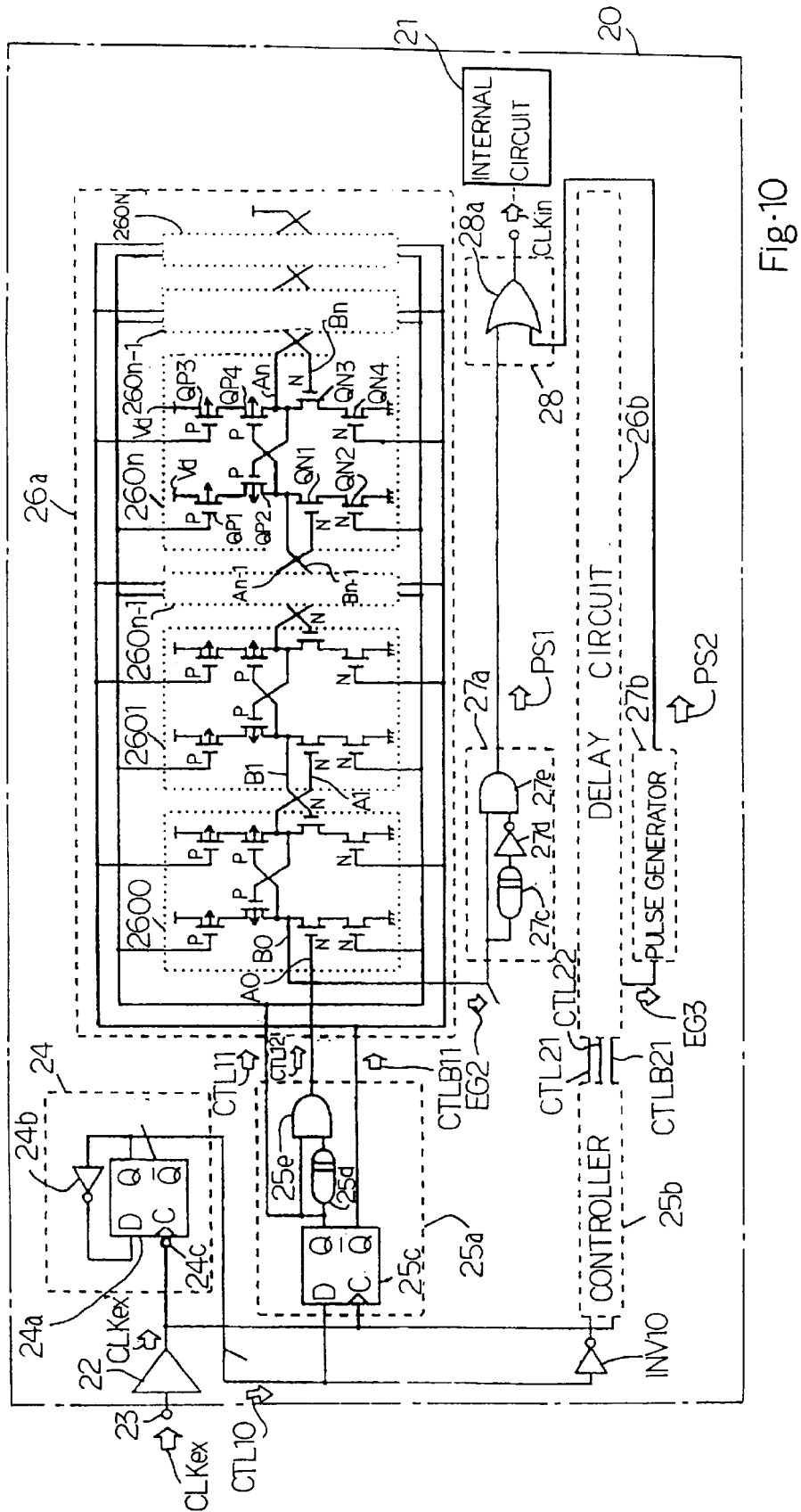
FIG. 10 is a circuit diagram showing the circuit configuration of a clock generating circuit according to the present invention.

Referring to FIG. 10 of the drawings, a clock generating circuit embodying the present invention is integrated on a semiconductor chip 20 together with an internal circuit 21. The clock generating circuit comprises a receiving circuit 22 connected to a signal pin 23, a polarity controller 24 connected to the receiving circuit 22, a pair of controllers 25a/25b connected to the receiving circuit 22 and the polarity controller 24 directly and indirectly through an inverter INV10, a pair of delay circuits 26a/26b connected to the pair of controllers 25a/25b, a pair of pulse generators 27a/27b connected to the pair of delay circuits 26a/26b and an amplifier 28 connected to the pair of pulse generators 27a/27b. An external clock signal CLKex is supplied to the signal pin 23, and the amplifier 28 supplies an internal clock signal CLKin to the internal circuit 21.

The external clock signal CLKex is transferred to the receiving circuit 22, and the receiving circuit 22 produces a clock signal CLKex' from the external clock signal CLKex. The clock signal CLKex' is different in the potential range from the external clock signal CLKex.

The polarity controller 24 includes a flip-flop circuit 24a, an inverter 24b connected between the output node Q and the data inout node D and an inverter connected between the receiving circuit 22 and the clock node C. The clock signal CLKex' is supplied through the inverter 24c to the clock node C, and the flip-flop circuit 24a alternates the logic level at the output node Q in response to the clock signal CLKex'. The polarity controller 24 supplies a polarity control signal CTL10 to the controllers 25a/25b.

The controller 25a is identical in circuit configuration with the other controller 25b, and only the controller 25a is described. The controller 25a includes a flip-flop circuit 25c, a delay circuit 25d and an AND gate 25e. The delay circuit 25d is connected to the output node Q, and the AND gate 25e has two input nodes one of which is connected to the output node of the delay circuit 25d and the other of which is connected to the output node Q of the flip-flop circuit 25c. The clock signal CLKex' is supplied to the clock node C of the flip-flop circuit 25c, and the polarity control signal CTL10 is connected to the input node D of the flip-flop circuit 25c. The polarity control signal CTL10 is toggled with the pulse rise of the clock signal CLKex', and the flip-flop circuit 25c produces a control signal CTL11 and a complementary control signal CTLB11. The complementary control signal CTLB11 is anti-phase to the control signal CTL11. The control signal CTL11 is supplied to the AND gate 25e, and the delay circuit 25d supplies a delayed signal to the AND gate 25e. For this reason, the AND gate 25e produces a control signal at the pulse rise of the delayed signal, and the control signal CTL12 falls at the pulse decay of the control signal CTL11. The certain lapse of time is introduced between the control signal CTL11 and the control signal CTL12. The control signals CTL11/CTL12 and the complementary control signal CTLB11 are supplied to the associated delay circuit 26a/26b. Although both flip-flop circuits 24a/25c are responsive to the clock signal CLKex', the inverter 24c inverts the clock signal CLKex', and prevents the flip-flop circuit 24a from malfunction due to a skew difference.

The delay circuit 26a is also identical in circuit configuration with the delay circuit 26b, and only the delay circuit 26a is described. The delay circuit 26a includes plurality of delay stages 2600, 2601, . . . 260n–1, 260n, 260n+1, . . . 260N connected in series, and the delay circuits 2600 to 260N are similarly arranged. Each delay stage has a first series of p-channel type field effect transistors QP1/QP2, a second series of p-channel type field effect transistors QP3/QP4, a first series of n-channel type field effect transistors QN1/QN2 and a second series of n-channel type field effect transistors QN3/QN4. The first series of p-channel type field effect transistors QP1/QP2 is connected between a positive power voltage line Vd and a signal transfer line Bn–1, and the first series of n-channel type field effect transistors QN1/QN2 is connected between the signal transfer line Bn–1 and a ground line. On the other hand, the second series of p-channel type field effect transistors QP3/QP4 is connected between the positive power voltage line Vd and a signal transfer line An, and the second series of n-channel type field effect transistors QN3/QN4 is connected between the signal transfer line An and the ground line. The signal transfer lines Bn–1 and An are respectively connected to the gate electrode of the p-channel type field effect transistor QP4 and the gate electrode of the p-channel type field effect transistor QP2. The control signals CTL11 and the complementary control signal CTLB11 are supplied to the gate electrode of the p-channel type field effect transistor QP1 and the gate electrode of the p-channel type field effect transistor QP3, respectively. The control signals CTL11 and the complementary control signal CTLB11 are further supplied to the gate electrode of the n-channel type field effect transistor QN2 and the gate electrode of the n-channel type field effect transistor QN4, respectively. The other n-channel type field effect transistors QN1 and QN3 are respectively gated by signal transfer lines An–1 and Bn. The signal transfer lines Bn–1 and An–1 are connected between the delay stage 260n and the previous delay stage 260n–1, and the signal transfer lines An and Bn are connected between the delay stage 260n and the next delay stage 260n+1. Thus, the delay states 2600 to 260N are connected in series through the signal transfer lines Ai and Bi, where i is natural number varied from zero to N. The AND gate 25e is connected through a signal transfer line A0 to the delay stage 2600, and the signal transfer line B0 is connected between the delay stage 2600 and the pulse generator 27a.

The delay stage 260n changes potential levels on the signal transfer lines An–1/Bn–1 and the signal transfer lines An/Bn as follows. The other delay stages 2600 to 260n–1 and 260n+1 to 260N behave as similar to the delay stage 260n.

The control signal CTL11 is assumed to be in the high level, and, accordingly, the complementary control signal CTLB11 is in the low level. While the control signal CTL11 is in the high level and the complementary control signal CTLB11 is in the low level, the delay circuit 26a is in a first time period. When the signal transfer line An–1 is changed to the high level, the n-channel type field effect transistors QN1/QN2 turn on, and change the signal transfer line Bn–1 to the low level. The low level on the signal transfer line Bn–1 and the complementary control signal CTLB11 cause the p-channel type field effect transistors QP3/QP4 to turn on, and the p-channel type field effect transistors QP3/QP4 change the signal transfer line An to the high level. On the other hand, in the next period when the control signal CTL11 is in the low level, the complementary control signal CTLB11 is in the high level. The next period is referrred to as "second time period". When the signal transfer line Bn is changed to the high level, the n-channel type field effect transistors Qn3/QN4 turn on, and change the signal transfer line to the low level. The low level on the signal transfer line An and the control signal CTL11 of the low level cause the p-channel type field effect transistors QP1/QP2 to turn on, and the p-channel type field effect transistors QP1./QP2 change the signal transfer line Bn–1 to the high level.

The pulse generator 27a is identical in circuit configuration with the pulse generator 27b, and only the pulse generator 27a is described. The pulse generator 27a includes a delay circuit 27c connected through the signal transfer line B0 to the delay stage 2600, an inverter 27d connected to the delay circuit 27c and an AND gate 27e having two input nodes connected to the signal transfer line B0 and the inverter 27d. The AND gate 27e produces a clock pulse PS1, and the AND gate 27e of the other pulse generator 27b produces a clock pulse PS2. The AND gates 27e are connected to the amplifier 28. When the signal transfer line B0 falls to the low level, the inverter 27d changes the input node of the AND gate 27e to the high level after certain lapse of time, and maintains the high level. In this situation, if the signal transfer line B0 rises to the high level, both input nodes of the AND gate 27e are maintained at the high level for the certain time period, and the AND gate 27e produces the clock pulse PS1.

The amplifier 28 includes an OR gate 28a, and the clock pulses PS1 and PS2 are supplied to the OR gate 28a. The amplifier 28 produces the internal clock signal CLKin from the clock pulses PS1/PS2.

Figure 11:
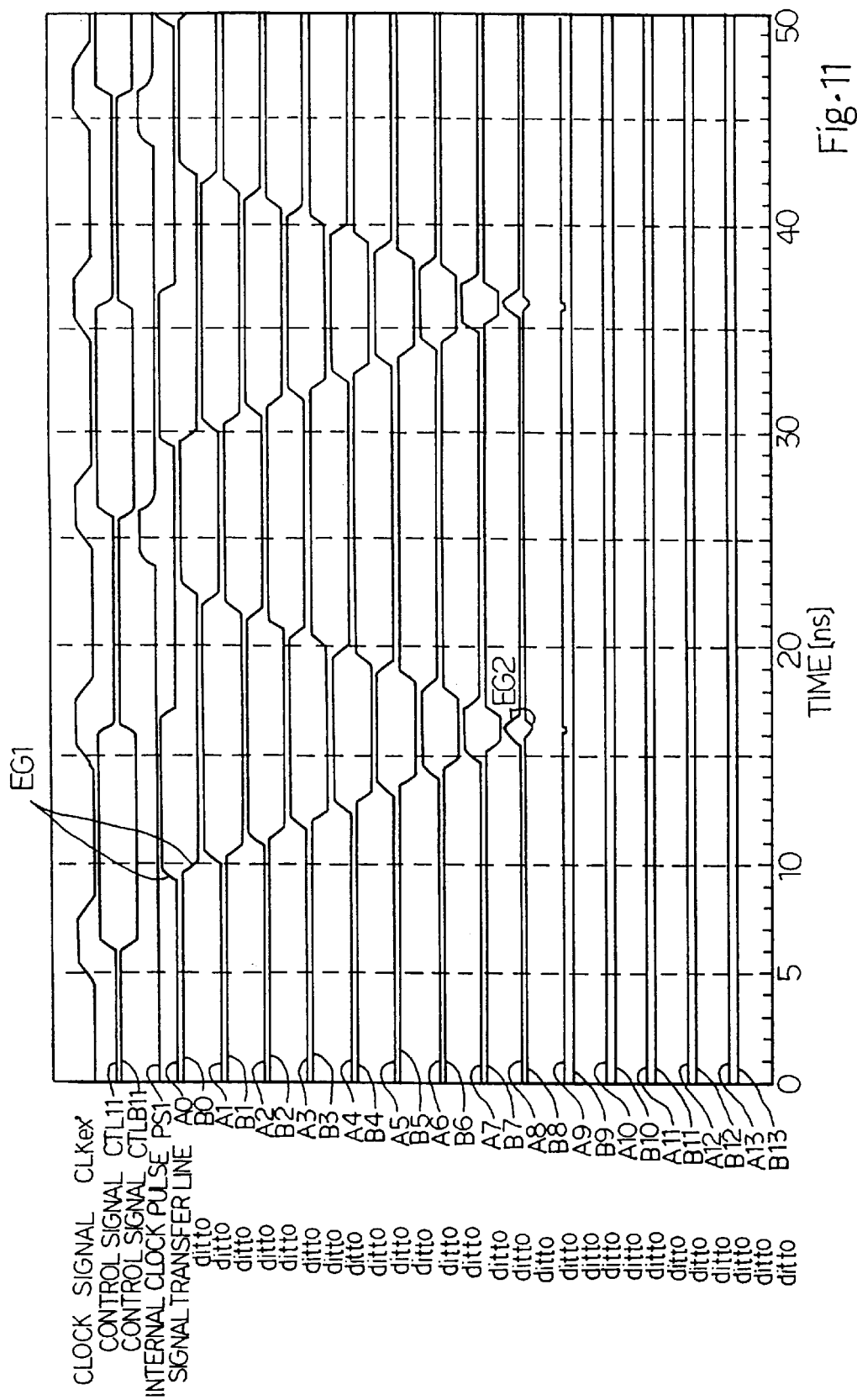
FIG. 11 is a timing chart showing the circuit behavior of a controller, a delay circuit and a pulse generating circuit incorporated in the clock generating circuit.

The controller 25a, the delay circuit 26a and the pulse generator 27a behaves as shown in FIG. 11. The clock signal CLKex' rises at 5 ns. The control signal CTL11 is changed to the high level, and the complementary control signal CTLB11 is changed to the low level. Then, the delay circuit 26a enters into the first time period. The controller 25a supplies the control signal CTL12 of the high level to the signal transfer line A0 around 10 ns, and, accordingly, the signal transfer line A0 is changed to the high level. As described hereinbefore, the signal transfer line A0 of the high level causes the signal transfer line B0 to be discharged and the signal transfer line A1 to be charged. In the similar manner, the signal transfer lines Ai, where i is 1, 2, . . . , are sequentially changed, and the signal transfer lines Bi are sequentially discharged. As a result, a potential edge signal EG1 is rippled from the signal transfer lines A0/B0 as shown.

The clock signal CLKex' rises at 15 ns, again. The control signal CTL11 is decayed to the low level, and the complementary control signal CTLB11 rises to the high level. The delay circuit 26a enters in the second time period, and the potential edge signal EG1 has reached the signal transfer line B8. The potential edge signal EG1 causes the delay stage 2608 to be discharging the signal transfer line B8.

The p-channel type field effect transistor QP3 of the delay stage 2609 turns off due to the complementary control signal CTLB11 of the high level, and the signal transfer line A9 is not changed to the high level. The control signal CTL11 of the low level causes the p-channel type field effect transistor QP1 of the delay stage 2608 to turn on, and the signal transfer line B8 is recovered to the high level. The signal transfer line A8 is discharged, and is recovered to the low level. In this way, the signal transfer lines Ai are sequentially discharged in the second time period, and the signal transfer lines Bi are sequentially charged in the second time period. Thus, a potential edge signal EG2 is rippled from the signal transfer lines A8/B8 to the signal transfer lines A0/B0 in the second time period. The potential edge signal EG2 is propagated from the delay stage 2600 through the signal transfer line B0 to the pulse generator 27a, and the clock generator 27a produces the internal clock pulse PS1 around 25 ns. Thus, the pulse generator 27a produces the internal clock pulse PS1 once two clock cycles.

The controller 25b, the delay circuit 26b and the pulse generator 27b behave complementarily to the controller 25a, the delay circuit 26a and the pulse generator 27a, because the polarity controller 24 supplies the polarity control signal CTL10 through the inverter INV10 to the controller 25b. For this reason, the control signal CTL21 is anti-phase signal to the control signal CTL11.

Figure 12:
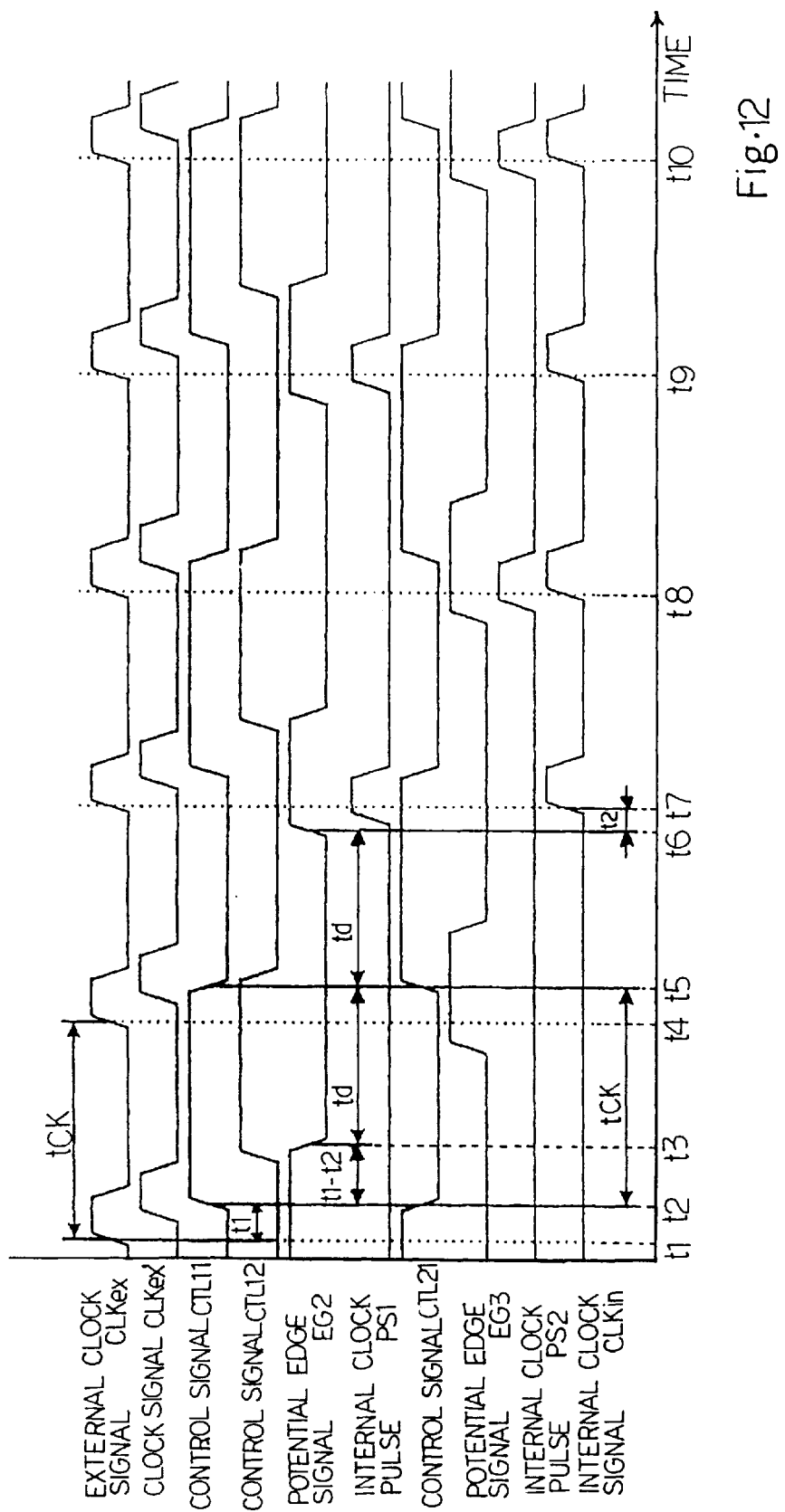
FIG. 12 is a timing chart showing the circuit behavior of the clock generating circuit.

FIG. 12 illustrates the behavior of the clock generating circuit. The external clock signal CLKex rises at time t1 time t4, . . . , and time t1 and time t4 define a cycle time tCK. The receiving circuit 22 produces the clock signal CLKex' from the external clock signal CLKex, and supplies the clock signal CLKex' to the controllers 25a/25b. The polarity controller 24 supplies the polarity control signal CTL10 to the controller 25a and the complementary polarity control signal to the other controller 25b, and the controllers 25a/25b alternate the control signals CTL11 and CTL21 complementarily to each other. For this reason, the delay circuits 26a/26b supply the potential edge signals EG2 and EG3 each once two cycles 2tCK, and the potential edge signal EG3 is different in phase from the potential edge signal EG2 by 180 degrees. Accordingly, the pulse generators 27a/27b generate the internal clock pulses PS1 and PS2, which are the anti-phase signal to each other. For this reason, the internal clock pulse PS1 rises at time t7, time t9, . . . , and the other internal clock pulse PS2 rises at time t8, time t10, . . . .

The internal clock pulse PS1 is ORed with the internal clock pulse PS2, and the amplifier 28 supplies the internal clock signal CLKin to the internal circuit 21. The internal clock signal CLKin is synchronous with the external clock signal CLKex.

Description is hereinbelow made on delay time between the signals. The delay circuit 26a/26b propagates the potential edge signal EG1 from the first delay stage 2600 toward a certain delay stage 260i in the first time period and potential edge siganl EG2/EG3 from the certain delay stage 260i to the first delay stage 2600. The parasitic capacitance coupled to each signal transfer line A0/B0/Ai/Bi is equal to those of the other signal transfer lines Ai/Bi/A0/B0, and the p-channel type field effect transistors QP1–QP4 and the n-channel type field effect transistors QN1–QN4 of a certain delay stage are equal in transistor characteristics to those of another delay stage. For this reason, the delay time during the propagation of the potential edge signal EG1 is equal to the delay time during the propagation of the potential edge signal EG2/EG3.

Time period between application of the external clock signal CLKex (t1) and the output of the control signal CTL11/CTL21 (t2) is expressed as "t1", and the time period t1 is consumed for the signal propagation through the receiving circuit 22 and the controller 25a/25b. Time period between the input of the potential edge signal EG1 to the pulse generator 27a/27b (t6) and the output of the internal clock signal CLKin (t7) is expressed as "t2", and the time period period t2 is consumed for the signal propagation through the pulse generator 27a/27b and the amplifier 28. The delay circuit 26a/26b introduces delay time td into the signal propagation of the potential edge signal EG1 or EG2/EG3 between the first delay stage 2600 and a certain delay stage 260i.

The delay circuit 25d is regulated in such a manner that the delay circuit 25d and the AND gate 25e introduce time delay equal to the total of time period t1 and time period t2, i.e., (t1+t2). The control signal CTL11 remains in the high level during time period equal to the cycle time tCK, and the time period is equal to the total of the time period (t1+t2) and the time period td, i.e., (t1+t2+td). Thus, the cycle time tCK is equal to the total time period (t1+t2+td).

The external clock signal CLKex rises at time t4, again, and the control signal CTL11 falls to the low level at time t5. The potential edge signal EG2/EG3 is backwardly propagated from the certain delay stage 260i to the first delay stage 2600, and is transferred to the pulse generator 27a/27b. The pulse generator 27a/27b produces the internal clock pulse PS1/PS2, and the internal clock signal CLKin is output from the amplifier 28. Time period from the pulse rise of the external clock signal CLKex to the output of the internal clock signal CLKin is expressed as (t1+td+t2), and is equal to the cycle time tCK. The internal clock signal CLKin rises in synchronism with the external clock signal CLKex at time t7. Thus, the clock generating circuit makes the internal clock signal CLKin synchronous with the external clock signal CLKex.

Figure 13:
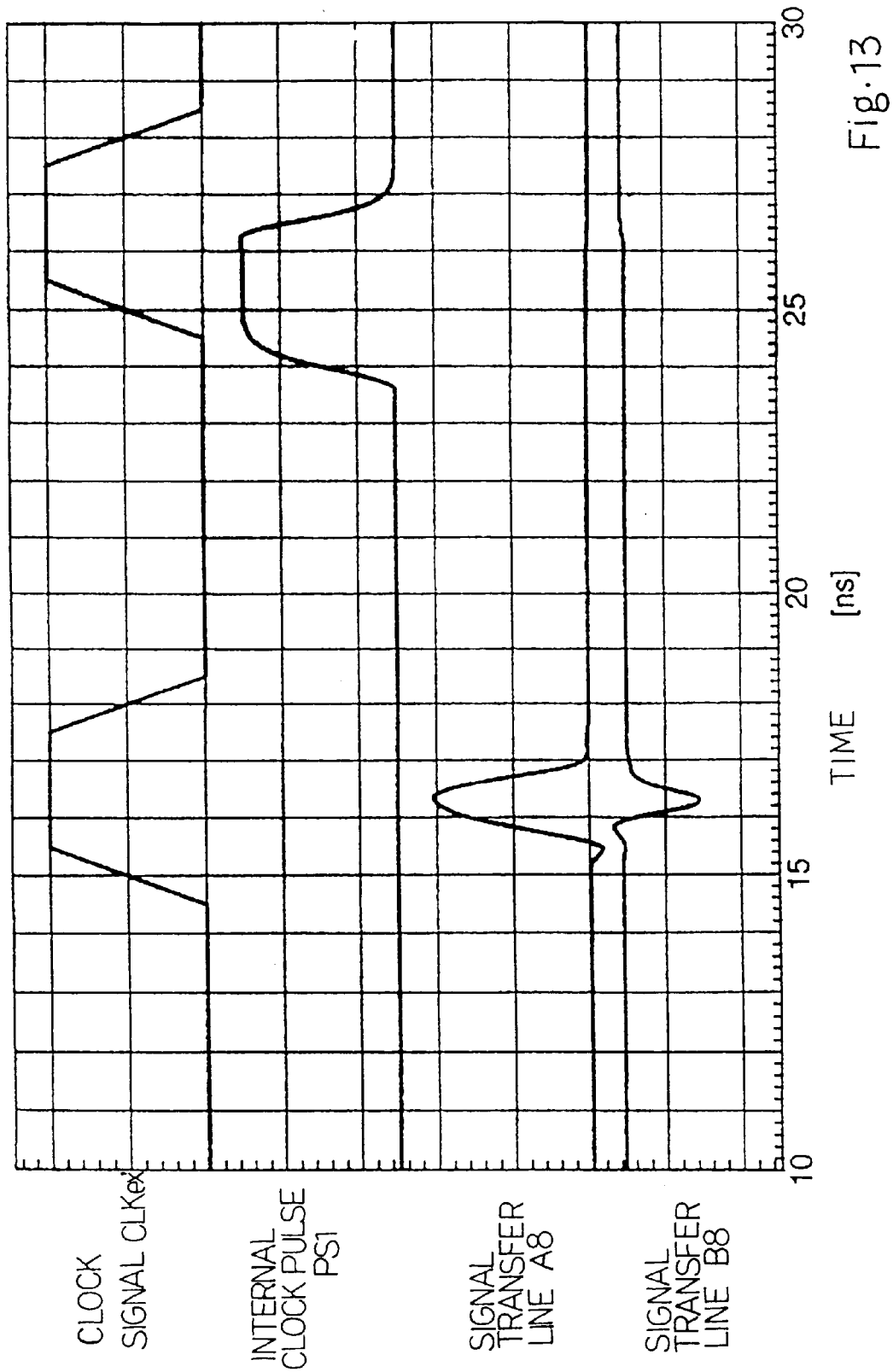
FIG. 13 is a timing chart showing the signal waveforms when phase difference takes place.

Assuming now that the external clock signal CLKex slightly increases the cycle time tCK, the potential edge signal EG1 causes the delay stage 2608 to discharge the signal transfer line A8 for certain time period slightly longer than usual, and makes the potential decay on the signal transfer line B8 deeper (compare FIG. 13 with FIG. 11). As a result, the delay stage 2608 requires additional time until the recovery of the signal transfer line B8, and the increases time period for the signal propagation from the delay stage 2608 to the signal transfer line B0. Thus, the prolonged cycle time tCK' retards the generation of the internal clock pulse PS1/PS2, and the delay circuit 26a/26b keeps the phase difference between the external clock signal CLKex and the internal clock pulse PS1 constant. In other words, the delay circuits 26a/26b make the internal clock signal CLKin synchronous with the external clock signal CLKex in spite of the fluctuation of the cycle time tCK.

The regulation of signal propagation time is achieved by the series of p-channel type field effect transistors QP1/QP2 or QP3/QP4 and the n-channel type field effect transistors QN1/QN2 or QN3/QN4 of each delay stage 260i, and the resolution is equal to or less than a signal logic stage.

The series of p-channel type field effect transistors QP1/QP2 is equal in current driving capability to the series of p-channel type field effect transistors QP3/QP4, and the parasitic capacitance to be driven by the p-channel type field effect transistors QP1/QP2 is equal to the parasitic capacitance to be driven by the p-channel type field effect transistors QP3/QP4. Similarly, series of n-channel type field effect transistors QN1/QN2 is equal in current driving capability to the series of n-channel type field effect transistors QN3/QN4, and the parasitic capacitance to be driven by the n-channel type field effect transistors QN1/QN2 is equal to the parasitic capacitance to be driven by the n-channel type field effect transistors QN3/QN4. For this reason, the fluctuation in the charging operation on the signal transfer line Ai during the first time period is canceled by the variation in the charging operation on the signal transfer line Bi during the second time period, and the fluctuation in the discharging operation on the signal transfer line Bi during the first time period is canceled by the variation in the discharging operation on the signal transfer line Ai during the second time period. As a result, any time difference between the first time period and the second time period is never accumulated in the delay circuit 26a/26b.

Even if the cycle time tCK is varied, the variation affects the charging/discharging operations in the certain delay stage 260I only, and the maximum phase difference between the external clock signal CLKex and the internal clock signal CLKin is equal to or less than the time delay introduced by a single gate.

As will be understood from the foregoing description, the clock generating circuit according to the present invention achieves good synchronism between the external clock signal CLKex and the internal clock signal CLKin within two clock cycles, and the resolution is equal to or less than the delay time introduced by a single gate.

If the internal circuit 21 does not request the clock generating circuit to supply the internal clock signal CLKin, all the component circuits 22, 24 to 28 are powered off, and the current consumption is perfectly decreased to zero.

Moreover, the pulse generators 27a/27b do not rely on the power potential level, and precisely generate the internal clock pulses PS1/PS2 at the frequency equal to the frequency of the external clock signal CLKex.

Finally, the delay stage 260i is implemented by the charging/discharging transistors, and the charging/discharging transistors make the potential edge signal EG1/EG2/EG3 symmetrical between the rise time and the decay time. For this reason, the potential edge signal EG1/EG2/EG3 is never deformed, nor lost.

Second Embodiment

Figure 14:
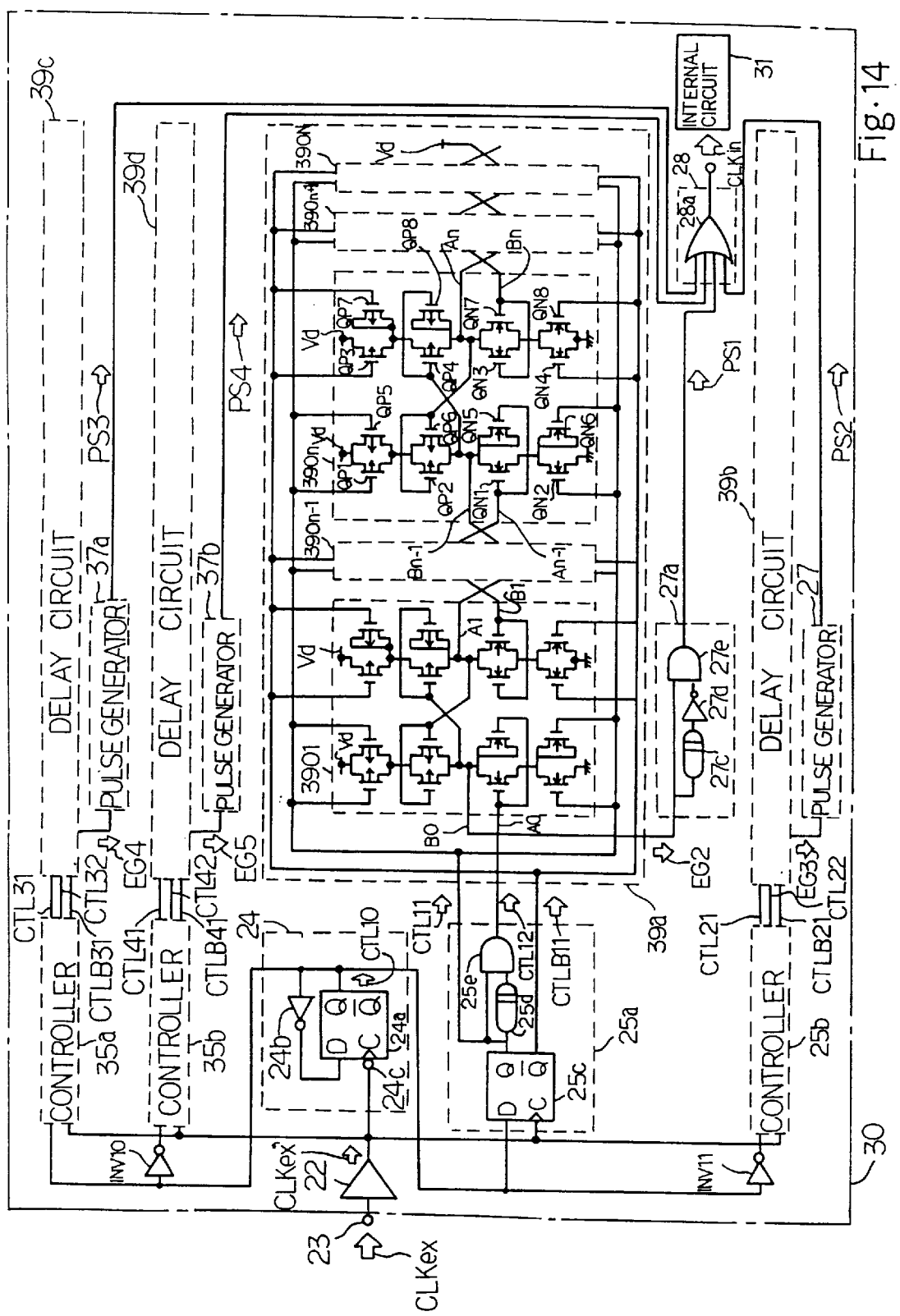
FIG. 14 is a circuit diagram showing another clock generating circuit according to the present invention.

Turning to FIG. 14 of the drawings, another clock generating circuit embodying the present invention is integrated on a semiconductor chip 30 together with an internal circuit 31. The clock generating circuit also comprises the receiving circuit 22, the polarity controller 24, the pair of controllers 25a/25b, the pair of pulse generators 27a/27b and the amplifier 28. These circuits 22, 24, 25a/25b, 27a/27b and 28 are similar in circuit configuration to those of the first embodiment, and no further description is incorporated hereinbelow.

The clock generating circuit further comprises a pair of controllers 35a/35b, a pair of pulse generators 37a/37b and four delay circuits 39a/39b/39c/39d. The controllers 35a/35b are similar in circuit configuration to the controllers 25a/25b, respectively, and the pulse generators 37a/37b are similar in circuit configuration to the pulse generators 27a/27b. For this reason, the pair of controllers 35a/35b and the pair of pulse generators 37a/37b are not detailed hereinbelow.

The delay circuits 39a to 39d are identical in circuit configuration with one another, and only the delay circuit 39a is hereinbelow detailed. The delay circuit 39a includes plural delay stages 3900, ... 390n−1, 390n, 390n+1, ... and 390N, and the delay stages 3901 to 390N are similar in circuit configuration to one another. For this reason, only the delay stage 390n is detailed.

The delay stage 390n includes the series of p-channel type field effect transistors QP1/QP2, the series of n-channel type field effect transistors QN1/QN2, the series of p-channel type field effect transistors QP3/QP4 and the series of n-channel type field effect transistors QN3/QN4 as similar to the delay stage 260n. The following field effect transistors QP5/QP6, QP7/QP8, QN5/QN6 and QN7/QN8 are added to the delay stage 260n, and form parts of the delay stage 390n. The p-channel type field effect transistors QP5/QP6 are connected in series between the power supply line Vd and the signal transfer line Bn−1, and, accordingly, the series of p-channel type field effect transistors QP5/QP6 is arranged in parallel to the series of p-channel type field effect transistors QP1/QP2.

The control signal CTL11 is supplied to the gate electrode of the p-channel type field effect transistor QP5, and the gate electrode of the p-channel type field effect transistor QP6 is connected to the signal transfer line An. On the other hand, the p-channel type field effect transistors QP7/QP8 are respectively associated with the p-channel type field effect transistors QP3/QP4. The complementary control signal CTLB11 is supplied to the gate electrode of the p-channel type field effect transistor QP7, and the source node of the p-channel type field effect transistor QP7 is connected to the drain node thereof. The gate electrode of the p-channel type field effect transistor QP8 is connected to the signal transfer line Bn−1, and the p-channel type field effect transistor QP8 has a source node connected to the drain node.

The n-channel type field effect transistors QN5/QN6 are respectively associated with the n-channel type field effect transistors QN1/QN2. The n-channel type field effect transistor QN5 has a source node and a drain node connected to one another, and the gate electrode of the n-channel type field effect transistor QN5 is connected to the signal transfer line An−1. The n-channel type field effect transistor QN6 has a source node and a drain node connected to one another, and the control signal CTL11 is supplied to the gate electrode of the n-channel type field effect transistor QN6. The n-channel type field effect transistors QN7/QN8 are connected in series between the signal transfer line An and the ground line. The signal transfer line Bn is connected to the gate electrode of the n-channel type field effect transistor QN7, and the complementary control signal CTLB11 is supplied to the gate electrode of the n-channel type field effect transistor QN8.

The control signal CTL11 is changed to the high level in the first time period. When the signal transfer line An−1 is changed to the high level, the n-channel type field effect transistors QN1/QN2 turn on, and the signal transfer line Bn−1 is discharged. Although the n-channel type field effect transistors QN5/QN6 also turn on, any current does not flow through the n-channel type field effect transistors QN5/QN6, because the source nodes are respectively connected to the drain nodes. When the signal transfer line Bn−1 is changed to the low level, the p-channel type field effect transistors QP4/QP8 turn on. The complementary control signal CTLB11 has caused the p-channel type field effect transistors QP3/QP7 to turn on, and the positive power line Vd charges the signal transfer line An through the series of p-channel type field effect transistors QP3/QP4. Any current does not flow through the p-channel type field effect transistors QP7/QP8, because the source nodes are connected to the drain nodes, respectively.

On the other hand, the control signal CTL11 is changed to the low level in the second time period, and the complementary control signal CTLB11 is in the high level. When the signal transfer line Bn is changed to the high level, the signal transfer line Bn and the complementary control signal CTLB11 cause the n-channel type field effect transistors QN3/QN4/QN7/QN8 to turn on, and the two series of n-channel type field effect transistors QN3/QN4 and QN7/QN8 discharge the signal transfer line An. The series of n-channel type field effect transistors QN7/QN8 increases the current driving capability twice as large as that of the first embodiment, and the signal transfer line An is rapidly changed to the low level. The signal transfer line An of the low level and the control signal CTL11 of the low level cause the p-channel type field effect transistors QP1/QP2 and QP5/QP6 to turn on, and the two series of p-channel type field effect transistors QP1/QP2 and QP5/QP6 rapidly charge the signal transfer line Bn–1. Thus, the signal propagation time of the delay stage 390n is decreased to a half of the signal propagation time of the delay stage 260n.

Figure 15:
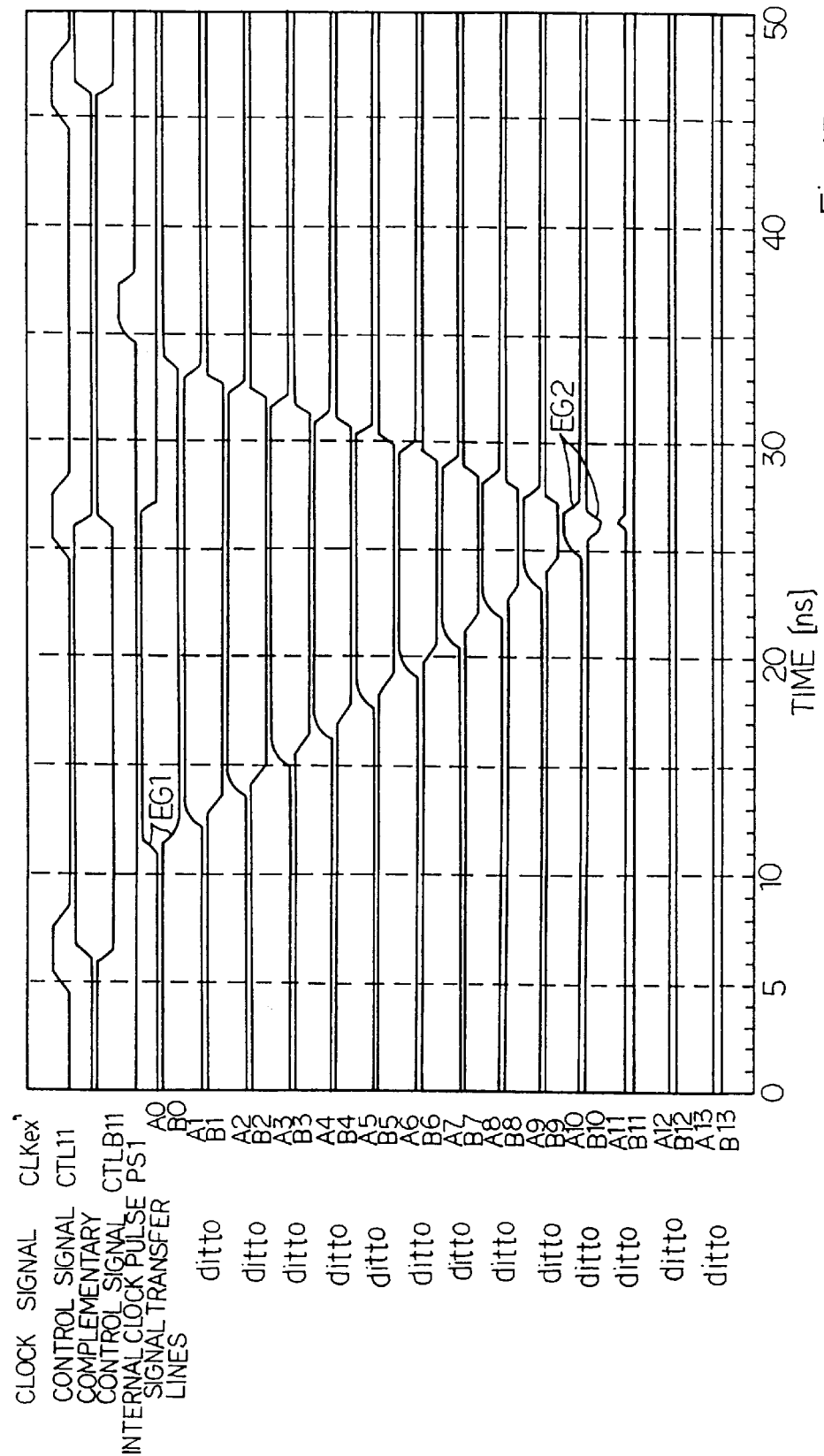
FIG. 15 is a timing chart showing the behavior of a delay circuit incorporated in the clock generating circuit.

FIG. 15 illustrates the behavior of the delay circuit 39a. The clock signal CLKex' rises at 5 ns, 25 ns and 35 ns, and the cycle time tCK is 20 ns, which is twice as long as the cycle time tCK of the first embodiment. The pulse rise at 5 ns causes the control signal CTL11 and the complementary control signal CTLB11 to be changed to the high level and the low level around 6 ns, and the delay circuit 39a enters into the first time period. The controller 25a generates the control signal CTL12. Then, the control signal CTL12 changes the signal transfer line A0 to the high level, and the delay stage 3901 discharges the signal transfer line B0 to the low level. The signal transfer lines are sequentially charged from A1 to A10, and the other signal transfer lines are sequentially discharged from B1 to B10. Thus, a potential edge signal EG1 is propagated from the delay stage 3901 to the delay stage 3911.

The clock signal CLKex' rises at 25 ns, again, and the delay circuit 39a enters into the second time period. The control signal CTL11 and the complementary control signal CTLB11 are respectively changed to the low level and the high level in the second time period. When the control signal CTL11 and the complementary control signal CTLB11 are changed due to the second pulse rise at 25 ns, the delay stage 3912 starts to charge the signal transfer line A11, and the signal transfer line A11 becomes slightly higher than the ground level. The delay stage 3912 stops the charging operation, and changes the charging operation to the discharging operation. The charging/discharging operations are repeated, and a potential edge signal EG2 is propagated from the delay stage 3911 to the delay stage 3901. As described hereinbefore, the current driving capability of each delay stage in the second time period is twice as large as that in the first time period, and the potential edge signal EG2 reaches the signal transfer lines A0/B0 within a half of the signal propagation time of the potential edge signal EG1.

The signal transfer line B0 propagates the potential edge signal EG2 to the pulse generator 27a, and the pulse generator 27a generates an internal clock pulse PS1 at 35 ns.

Figure 16:
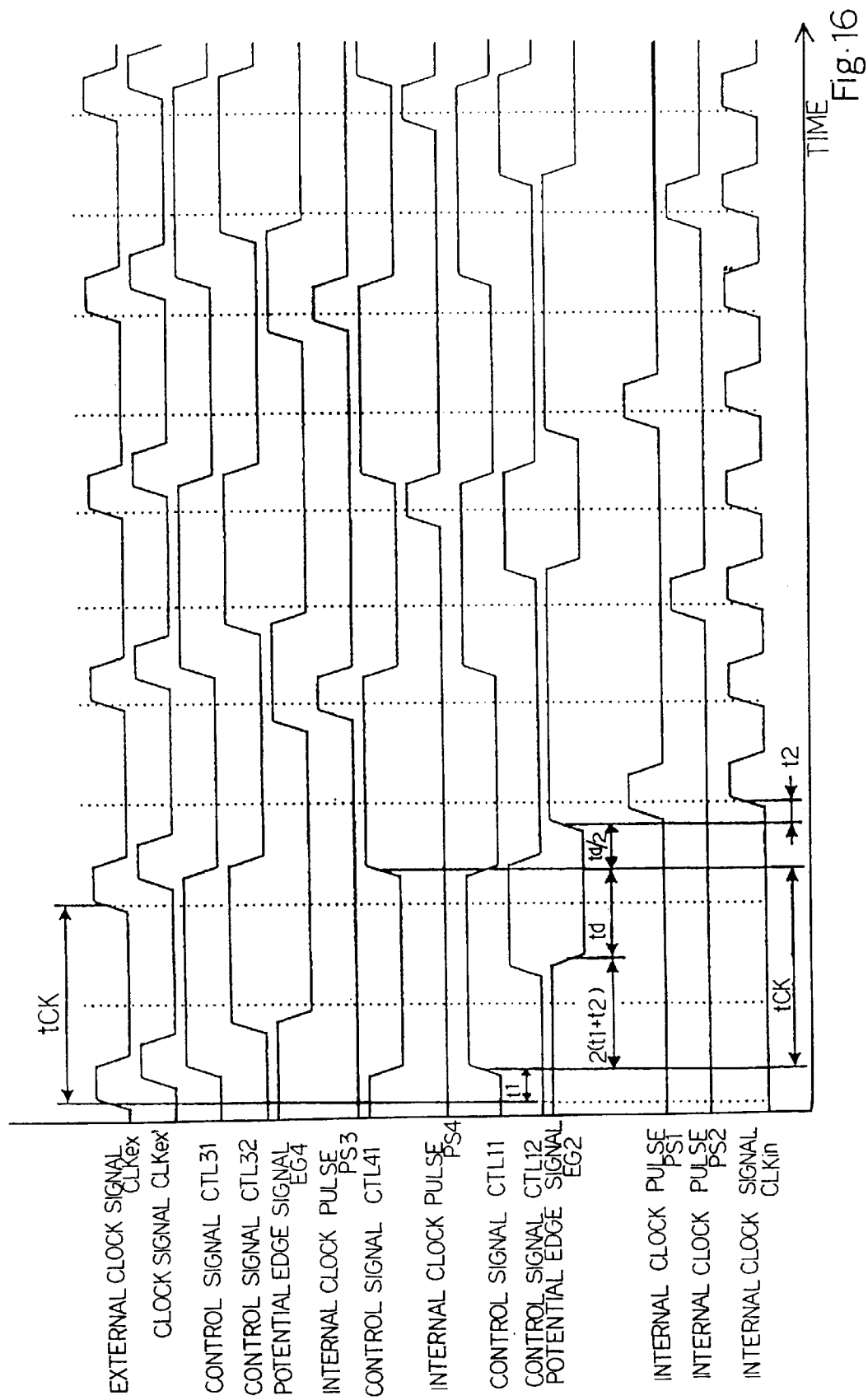
FIG. 16 is a timing chart showing the behavior of the clock generating circuit

FIG. 16 illustrates the circuit behavior of the clock generating circuit. The polarity controller 24 and the inverter INV10 cause the controller 35a, the delay circuit 39c and the pulse generator 37a to behave complementarily to the controller 35b, the delay circuit 39d and the pulse generator 37b, and the internal clock pulse PS4 is the anti-phase signal to the internal clock pulse PS3. The polarity controller 24 and the inverter INV11 cause the controller 25a, the delay circuit 39a and the pulse generator 27a to behave complementarily to the controller 25b, the delay circuit 39b and the pulse generator 27b, and the internal clock pulse PS2 is the anti-phase signal to the internal clock pulse PS1. The pulse generators 37a/37b/27a/27b supply the internal clock pulses PS3/PS4/PS1/PS2 to the OR gate 28a of the amplifier 28, and an internal clock signal CLKin is supplied from the amplifier 28 to the internal circuit 31. The internal clock signal CLKin is synchronous with the external clock signal CLKex.

Time period between application of the external clock signal CLKex and the output of the control signal CTL11 is expressed as "t1", and the time period t1 is consumed for the signal propagation through the receiving circuit 22 and the controller 25a. Time period between the input of the potential edge signal EG2 to the pulse generator 27a and the output of the internal clock signal CLKin is expressed as "t2", and the time period t2 is consumed for the signal propagation through the pulse generator 27a and the amplifier 28. The delay circuit 25d is adjusted in such a manner as to introduce delay time equal to 2(t1+t2).

The delay circuit 39a introduces delay time td into the signal propagation of the potential edge signal EG1 between the first delay stage 3901 and a certain delay stage 390l in the first time period, and the potential edge signal EG2 consumes td/2 between the certain delay stage 390i and the first delay stage 3901 in the second time period. The controller 25a maintains the control signal CTL11 at the high level in time period equal to the cycle time tCK, and the time period is equal to time period from the pulse rise of the control signal CTL11 to the arrival of the potential edge signal EG1 at the certain delay stage 390i. Therefore, the cycle time tCK is equal to 2×(t1+t2)+td.

In the second time period, time period from the input of the external clock CLKex to the output of the internal clock signal CLKin is expressed as {t1+t2+(td/2)}, and is equal to tCK/2. Thus, the pulse generator 27a genrates the internal clock pulse PS1 at the mid point between the second external clock pulse and the third external clock pulse.

The clock generating circuit implementing the second embodiment achieves all the advantages of the first embodiment. The resolution to the clock cycle tCK is equal to or less than the switching time of a single logic gate, and the fluctuation due to the cycle time tCK is ignoreable in so far as the linearity is maintained between the amount of electric charge and the charging/discharging time. The first internal clock pulse is only delayed from the first external clock pulse by the time period one and half times longer than the cycle time tCK. For this reason, the phase difference between the external clock signal CLKex and the internal clock signal CLKin is equal to or less than the switching time of a single logic gate with respect to 180 degrees. The internal clock signal CLKin is twice higher in frequency than the external clock signal CLKex, and the clock generating circuit implementing the second embodiment is available for the double data rate transmission.

Third Embodiment

Figure 17:
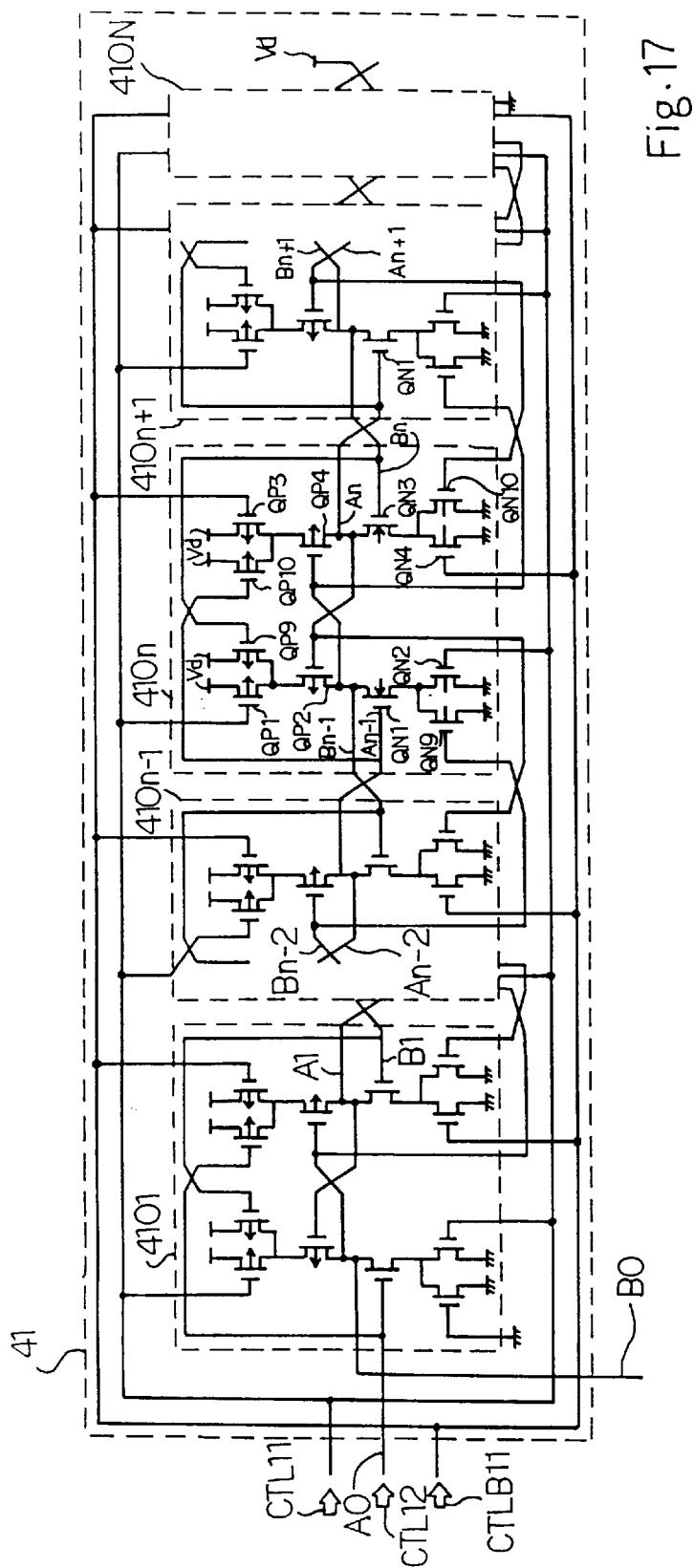
FIG. 17 is a circuit diagram showing the configuration of a delay circuit incorporated in yet another clock generating circuit according to the present invention.

FIG. 17 illustrates a delay circuit 41 incorporated in yet another clock generating circuit embodying the present invention. Each of the delay circuits 26a/26b is replaceable with the delay circuit 41. The delay circuit 41 includes plural delay stages 4101, . . . 410n–1, 410n, 410n+1, . . . and 410N, and the delay stages 4101 to 410N are similar in circuit configuration to one another. For this reason, only the delay stage 410n is detailed. The delay stage 410n has the p-channel type field effect transistors QP1/QP2/QP3/QP4 and the n-channel type field effect transistors QN1/QN2/QN3/QN4 as similar to the delay stage 260n, and p-channel type field effect transistors QP9 and QP10 and n-channel type field effect transistors QN9/QN10 are added to the delay stage 260n. The p-channel type field effect transistors QP9/QP10 are connected in parallel to the p-channel type field effect transistors QP1/QP3, and the n-channel type field effect transistors QN9/QN10 are connected in parallel to the n-channel type field effect transistors Qn2/QN4, respectively. The p-channel type field effect transistors QP9/QP10 are respectively gated by the signal transfer lines Bn and An−1, respectively, and the signal transfer lines Bn−2 and An+1 are respectively connected to the gate electrode of the n-channel type field effect transistor QN9 and the gate electrode of the n-channel type field effect transistor QN10.

In order to understand the reason why the p-channel type field effect transistors QP9/QP10 and the n-channel type field effect transistors QN9/QN10 are added to the delay circuit 260n, the behavior of the delay circuit 260n is described in detail. In the first time period, the control signal CTL11 is in the high level, and the control signal CTL11 and the signal transfer line An−1 of the high level cause the n-channel type field effect transistors QN1/QN2 to turn on. Then, the n-channel type field effect transistors QN1/QN2 starts to discharge the signal transfer line Bn−1, and the signal transfer line Bn−1 is decayed from the high level. When the n-channel type field effect transistors QN1/QN2 start to discharge, the p-channel type field effect transistor QP2 has been already turned on, and the source/drain node between the p-channel type field effect transistor QP1 and the p-channel type field effect transistor QP2 is also decayed from the high level. When the signal transfer line Bn−1 reaches certain voltage level lower than the drain node of the p-channel type field effect transistor QP3 by the threshold, the p-channel type field effect transistor QP4 turns on, and charges the signal transfer line An and the gate electrode of the p-channel type field effect transistor QP2. The potential difference between the source node and the gate electrode of the p-channel type field effect transistor QP2 is getting smaller and smaller. When the potential difference becomes less than the threshold of the p-channel type field effect transistor QP2, the p-channel type field effect transistor QP2 turns off, and the drain node of the p-channel type field effect transistor QP1 enters into the high impedance state before completion of the discharging operation. This results in that electric charge is left on the drain node of the p-channel type field effect transistor QP1.

When the delay circuit 26a enters into the second time period, the control signal CTL11 is changed to the low level, and the p-channel type field effect transistor QP1 turns on so as to flow current through the channel thereof. On the other hand, the complementary control signal CTLB11 is changed to the high level in the second time period, and the signal transfer line An enters into the high-impedance state. The channel of the p-channel type field effect transistor QP2 is capacitively coupled to the signal transfer line An, and the current passing through the channel lifts the potential level of the signal transfer line An. Then, the amount of electric charge in the signal transfer line An is increased, and the n-channel type field effect transistors QN3/QN4 are expected to discharge the additional electric charge together with the usual electric charge in the second time period. This results in that the delay stage 260n increases the delay time introduced into the propagation of the potential edge signal EG2. Similarly, the electric charge between the n-channel type field effect transistor QN3 and the n-channel type field effect transistor QN4 is also causative of prolongation of the delay time.

The potential level at an intermediate node between the field effect transistors is dependent on the waveform of a related signal, and is unstable. Especially, the intermediate node temporarily enters the high-impedance stage during the potential rise after power-on, and the potential level at the intermediate node is quite different from that during the usual signal propagation. The increment of the potential level on the signal transfer line An is dependent on the potential level at the intermediate node in the second time period, and is large in the first cycle after the power-on. For this reason, the signal propagation time is varied in the first cycle, and small phase difference takes place between the external clock signal CLKex and the internal clock signal CLKin. If the clock generating circuit shown in FIG. 10 is incorporated in a semiconductor integrated circuit device designed under severe requirements for the input set-up time, the input hold time etc., the phase difference makes the operation margin small.

The additional field effect transistors QP9/QP10 and QN9/QN10 aims at solution of the drawback due to the fluctuation of potential level at the intermediate node, and charge and discharge the intermediate nodes. In detail, the p-channel type field effect transistor QP9 is connected between the power supply line Vd and the intermediate node between the p-channel type field effect transistors QP1 and QP2, and is gated by the signal transfer line Bn. The intermediate node between the p-channel type field effect transistors QP1 and QP2 is discharged together with the signal transfer line Bn−1, and reaches the certain voltage level. The p-channel type field effect transistors QP3/QP4 charge the signal transfer line An, and the signal transfer line An causes the n-channel type field effect transistor QN1 of the next delay stage 410n+1 to turn on, and the n-channel type field effect transistors QN1/QN2 of the next delay stage 410n+n decay the potential level on the signal transfer line Bn. The potential decay on the signal transfer line Bn is relayed to the gate electrode of the p-channel type field effect transistor QP9, and causes the p-channel type field effect transistor QP9 to turn on. The p-channel type field effect transistor QP9 supplies current to the intermediate node between the p-channel type field effect transistors QP1 and QP2, and the signal transfer line An is electrically connected through the p-channel type field effect transistors QP3/QP4 to the power voltage line Vd. For this reason, even though the signal transfer line An is capacitively coupled to the channel of the p-channel type field effect transistor QP2, the potential level on the signal transfer line An is never varied. Thus, the p-channel type field effect transistor QP9 keeps the signal propagation time of the potential edge signal EG2 in the second time period constant. The other p-channel type field effect transistor QP10 and the n-channel type field effect transistors QN9/QN10 behaves as similar to the p-channel type field effect transistor QP9.

As will be understood, the clock generating circuit implementing the third embodiment achieves not only all the advantages of the first embodiment but also perfect elimination of phase difference between the external clock signal CLKex and the internal clock signal CLKin immediately after the power-on. In other words, the clock generating circuit is available for a semiconductor integrated circuit device, which requests the clock generating circuit to generate the internal clock signal CLKin strictly synchronous with the external clock signal CLKex immediately after power-on.

Fourth Embodiment

Figure 18:
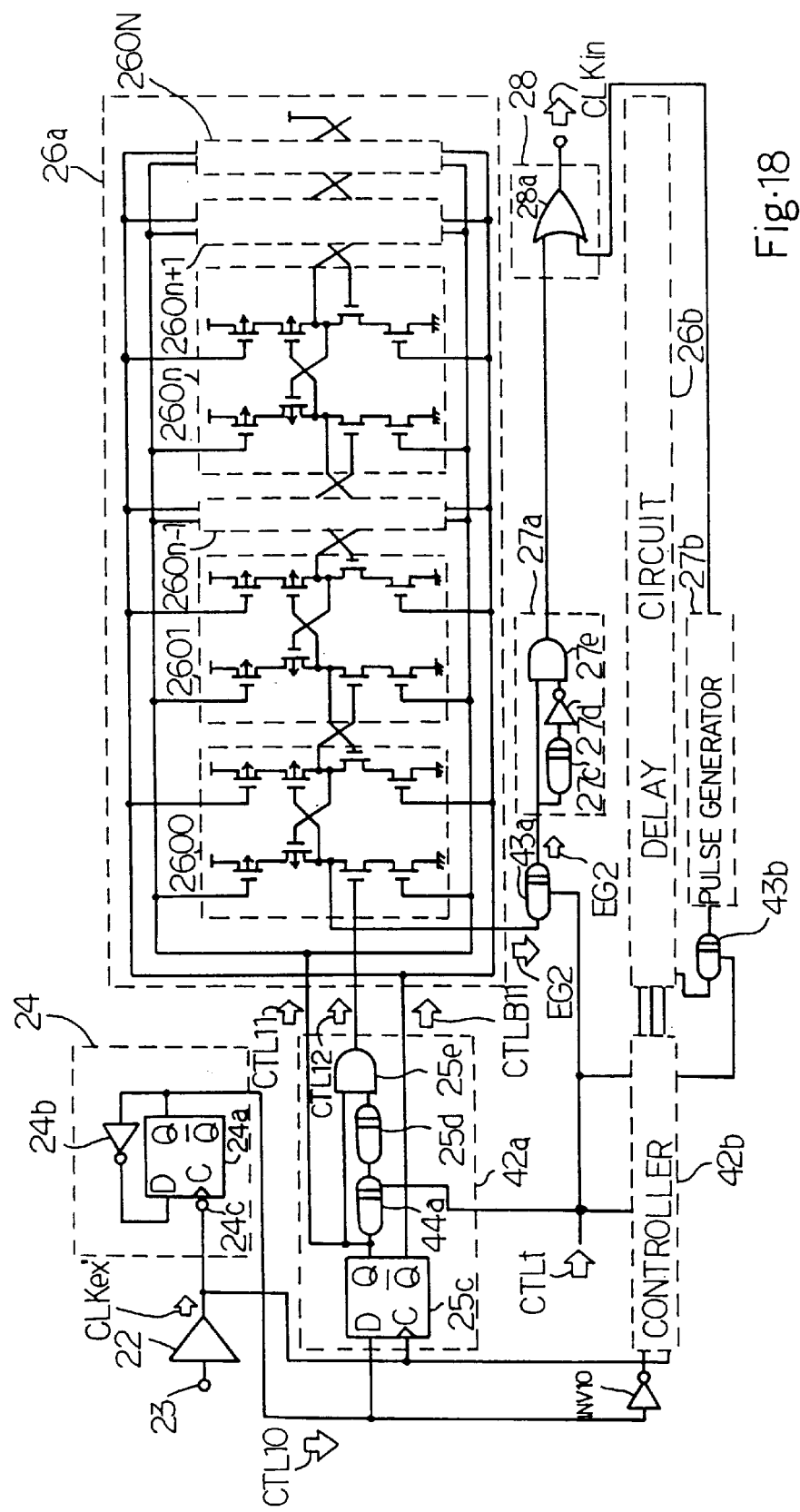
FIG. 18 is a circuit diagram showing the configuration of still another clock generating circuit according to the present invention.

FIG. 18 illustrates a clock generating circuit incorporated in still another semiconductor integrated circuit device embodying the present invention. The clock generating circuit comprises the receiving circuit 22, the polarity controller 24, the inverter INV10, controllers 42a/42b, the delay circuits 26a/26b, variable delay circuits 43a/43b, the pulse generators 27a/27b and the amplifier 28. The receiving circuit 22, the polarity controller 24, the inverter INV10, the delay circuits 26a/26b, the pulse generators 27a/27b and the amplifier 28 are similar to those of the first embodiment, and component elements are labeled with the same references designating corresponding component elements of the first embodiment without detailed description.

The controllers 42a is identical in circuit configuration with the other controller 42b, and only the controller 42a is described hereinbelow. A variable delay circuit 44a is newly added to the delay circuit 25a, and is connected between the output node Q of the flip-flop circuit 25c and the delay circuit 25d. The variable delay circuits 44a is equivalent to the variable delay circuit 43a/43b, and is responsive to a control signal CTLt so as to vary delay time $\Delta t$. The variable delay circuits 43a/43b are respectively connected between the delay circuits 26a/26b and the pulse generators 27a/27b.

The clock generating circuit implementing the third embodiment generates the internal clock signal CLKin synchronous with the external clock signal CLKex. The delay time $\Delta t$ is described hereinbelow.

Time period from the input of the external clock signal CLKex and the output of the flip-flop circuit 25c is expressed as "t1", and the clock signal CLKex' is propagated through the receiving circuit 22 and the flip-flop circiut 25c in time t1. Time period from the input of the potential edge signal EG2 into the pulse generator 27a to the output of the internal clock signal CLKin is expressed as "t2", and the potential edge signal EG2 is propagated through the pulse generator 27a and the amplifier 28 in time "t2". The delay circuit 26a introduces delay time td between the input of the control signal CTL12 and the arrival of the potential edge signal at the certain delay stage 260i in the first time period, and also introduces delay time td between the genertion of the potential edge siganl EG2 and the output of the potential edge signal EG2 in the second time period. The delay circuit 25d introduces delay time equal to (t1+t2). The control signal CTL11 is in the high level for time period equal to the cycle time tCK, and the time period is expressed as ($\Delta t$+t1+t2+td). Thus, the cycle time tCk is equal to ($\Delta t$+t1+t2+td).

In the second time period, time period from the input of the external clock signal CLKex to the output of the internal clock signal CLKin is equal to (t1+td+$\Delta t$+t2). Thus, the internal clock signal CLKin rises in synchronism with the pulse rise of the third external clock pulse.

The delay circuit 26a introduces the delay time td equal to (tCk−$\Delta t$−t1−t2). If the cycle time tCK is forecasted to be longer than usual, the delay time $\Delta t$ is shortened by changing the control signal CTLt. On the other hand, if the cycle time cCK is forecasted to be shorter than usual, the delay time $\Delta t$ is prolonged by changing the control signal CTLt. Thus, the variable delay circuits 44a and 43a/43b allow the designer to decrease the number of delay stages 260N. Moreover, the clock generating circuit makes the responsible frequency range of the external clock signal CLKex wide without increasing the delay stages 2600 to 260N.

Fifth Embodiment

Figure 19:
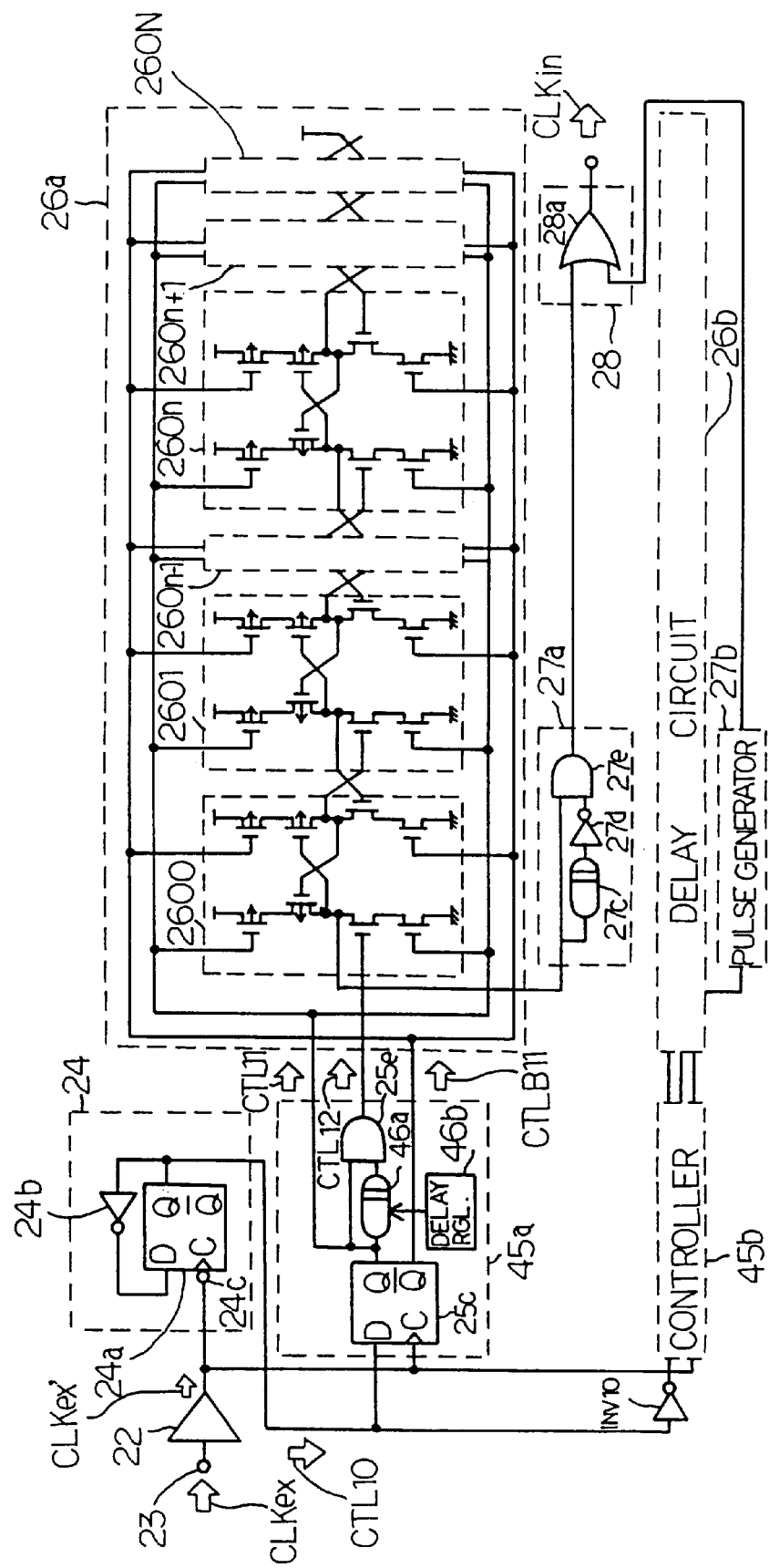
FIG. 19 is a circuit diagram showing the configuration of another clock generating circuit according to the present invention.

FIG. 19 illustrates another clock generating circuit embodying the present invention. The clock generating circuit implementing the fifth embodiment comprises the receiving circuit 22, the polarity controller 24, the inverter INV10, controllers 45a/45b, the delay circuits 26a/26b, the pulse generators 27a/27b and the amplifier 28. The receiving circuit 22, the polarity controller 24, the inverter INV10, the delay circuits 26a/26b, the pulse generators 27a/27b and the amplifier 28 are similar to those of the first embodiment, and component elements are labeled with the same references designating corresponding component elements of the first embodiment without detailed description.

The controller 45a is similar in circuit configuration to the other controller 45b, and only the controller 45a is described hereinbelow. The controller 45a includes the flip-flop circuit 25c, the AND gate 25e, a variable delay circuit 46a and a delay regulator 46b. The delay circuit 25b is replaced with the variable delay circuit 46a, and the delay regulator 46b regulates the variable delay circuit 46a to appropriate delay time.

Figure 20:
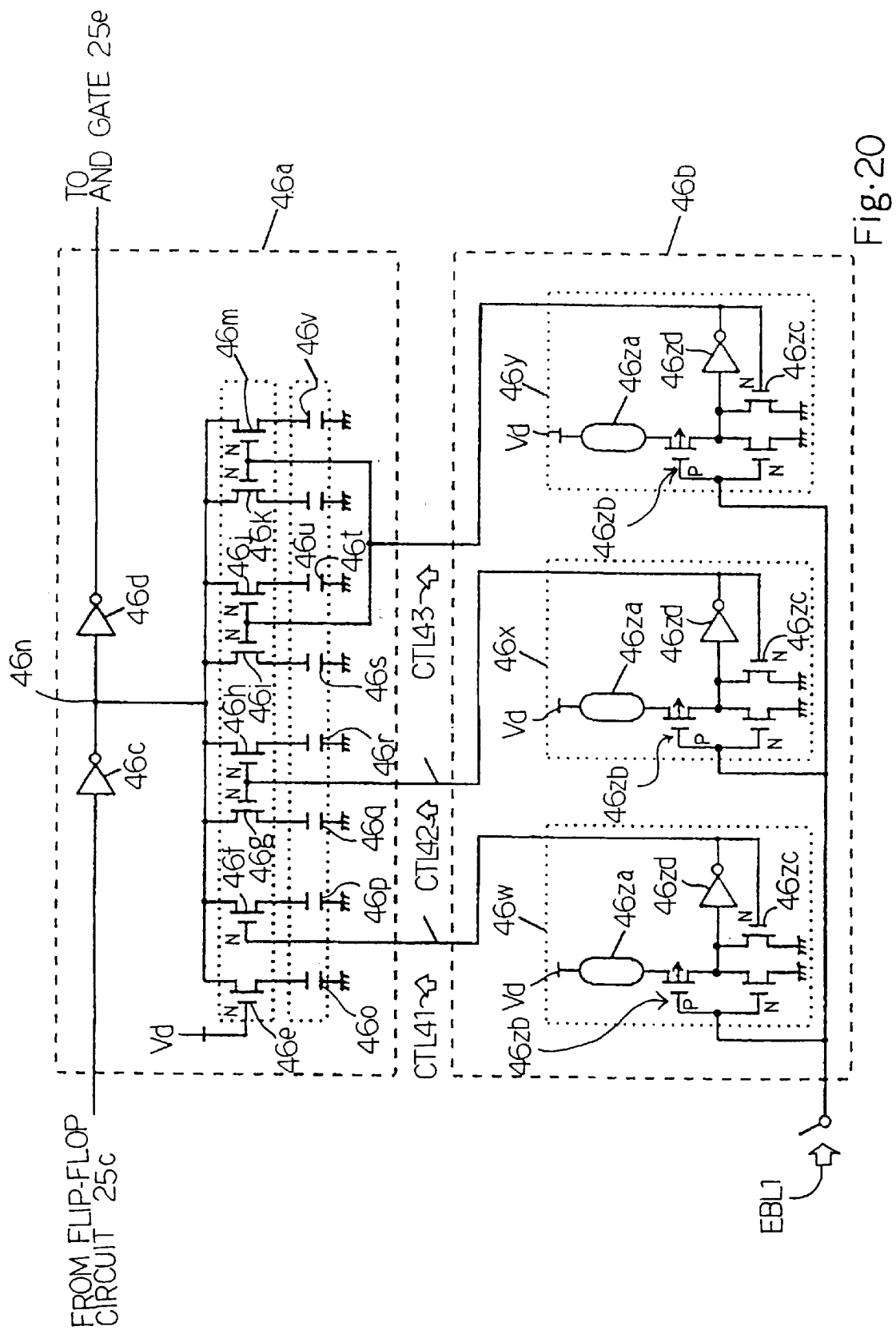
FIG. 20 is a circuit diagram showing the configuration of a variable delay circuit and a delay regulator incorporated in the clock generating circuit shown in FIG. 19.

FIG. 20 illustrates the variable delay circuit 46a and the delay regulator 46b. The variable delay circuit 46a includes a series of inverters 46c/46d, n-channel type field effect transistors 46e to 46m connected in parallel to a node 46n between the inverters 46c and 46d and capacitors 46o to 46v connected between the n-channel type field effect transistors 46e to 46m and a ground line. The gate electrode of the n-channel type field effect transistor 46e is connected to the power supply line Vd, and the n-channel type field effect transistor 46e is turned on at all times so as to connect the capacitor 46o to the node 46n.

The other n-channel type field effect transistors 46f to 46m are gated by the delay regulator 46b, and the associated capacitors 46p to 46v are selectively connected to the node 46n. The delay regulator 46b generates three control signals CTL41, CTL42 and CTL43. The control signal CTL41 is supplied to the gate electrode of n-channel type field effect transistor 46f, the control signal CTL42 is supplied to the gate electrodes of two n-channel type field effect transistors 46g/46h, and the control signal CTL43 is supplied to the gate electrodes of four n-channel type field effect transistors 46i to 46m. Thus, the delay regulator 46b doubles the capacitance coupled to the node 46n by changing the control signal from CLT41 through CTL42 to CTL43, and the total capacitance is stepwise changed to one of the eight levels, i.e., $2^3$.

The delay regulator 46b includes three fuse registers 46w/46x/46y, and the three fuse registers 46w to 46y generate the control signals CTL41 to CTL43, respectively. Each of the fuse registers 46w to 46y contains a fuse element 46za, a complementary transistor 46zb connected between the fuse element 46za and the ground line, an n-channel type field effect transistor 46zc connected between the output node of the complementary transistor 46zb and the ground line and an output inverter 46zd connected to the output node of the complementary transistor 46zb for producing the control signal CTL41/CTL42/CTL43. The fuse element 46za is either broken or maintained after the fabrication of the clock generating circuit on a semiconductor chip. If the fuse element 46za has been broken, the output node of the complementary transistor 46zb is fixed to the low level, and the output inverter 46zd sets the control signal CTL41/CTL42/CTL43 to the high level. On the other hand, if the fuse element 46za connects the power supply line Vd to the complementary transistor 46zb, the complementary transistor 46zb is responsive to an enable signal EBL1 so as to change the output node thereof to the low level.

Thus, the fuse registers 46w to 46y selectively change the control signals to the high level, and cause the n-channel type field effect transistors 46e to 46m to selectively add the capacitors 46o to 46v to the node 46n. The variable delay circuit 46a varies the delay time depending upon the amount of capacitance coupled to the node 46n, and the manufacturer regulates the delay circuit 46a to appropriate delay time before the packaging work. As a result, the clock generating circuit shown in FIG. 19 makes the internal clock signal CLKin strictly synchronous with the external clock signal CLKex.

Sixth Embodiment

Figure 21:
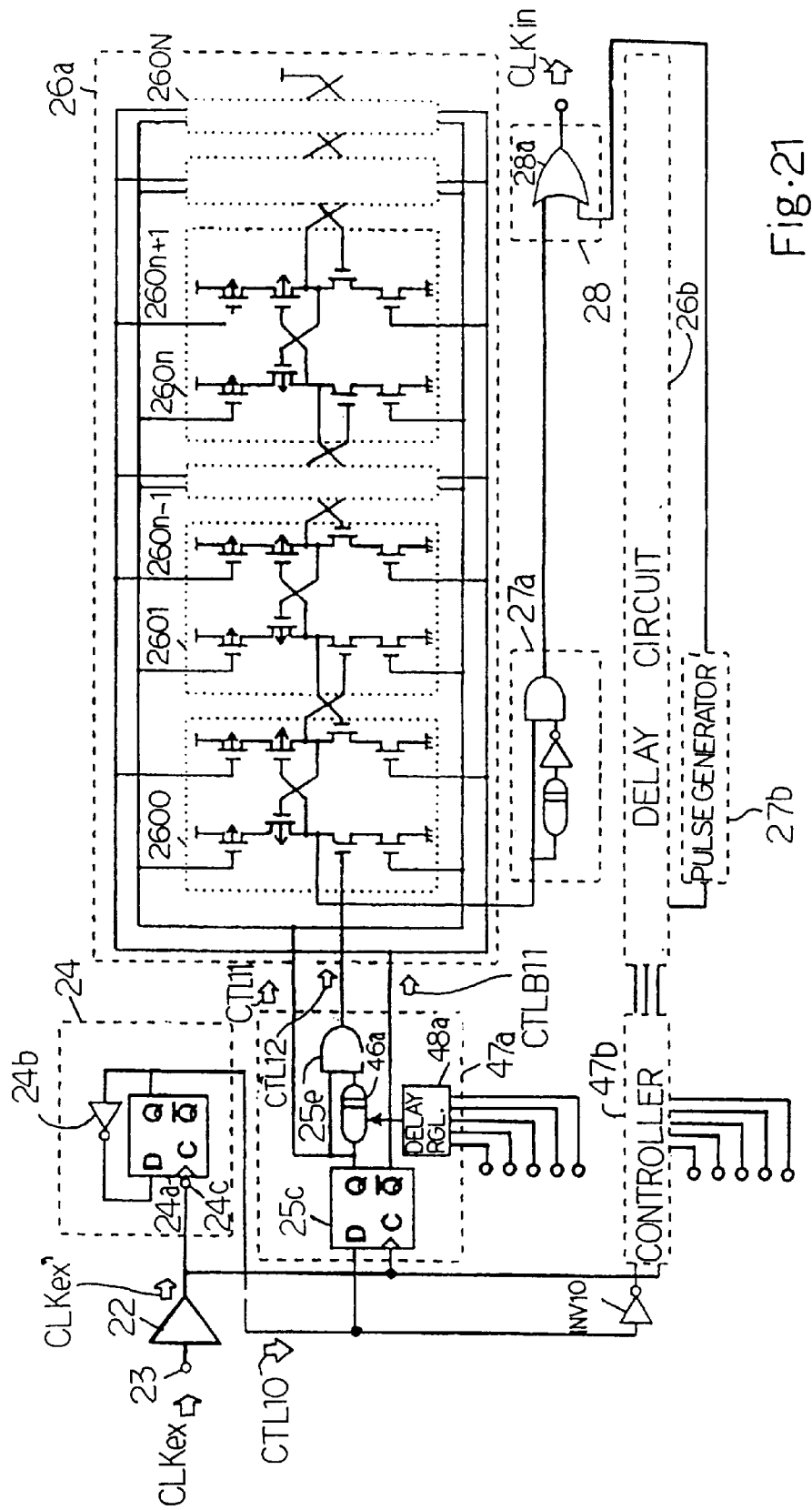
FIG. 21 is a circuit diagram showing the configuration of another clock generating circuit according to the present invention.

FIG. 21 illustrates another clock generating circuit embodying the present invention. The clock generating circuit implementing the sixth embodiment comprises the receiving circuit 22, the polarity controller 24, the inverter INV10, controllers 47a/47b, the delay circuits 26a/26b, the pulse generators 27a/27b and the amplifier 28. The receiving circuit 22, the polarity controller 24, the inverter INV10, the delay circuits 26a/26b, the pulse generators 27a/27b and the amplifier 28 are similar to those of the first embodiment, and component elements are labeled with the same references designating corresponding component elements of the first embodiment without detailed description.

The controller 47a is similar in circuit configuration to the other controller 47b, and only the controller 47a is described hereinbelow. The controller 47a includes the flip-flop circuit 25c, the AND gate 25e, the variable delay circuit 46a and a delay regulator 48a. The delay regulator 48a regulates the variable delay circuit 46a to appropriate delay time, and causes the internal clock signal CLKin to be strictly synchronized with the external clock signal CLKex as similar to the delay regulator 46b.

Figure 22:
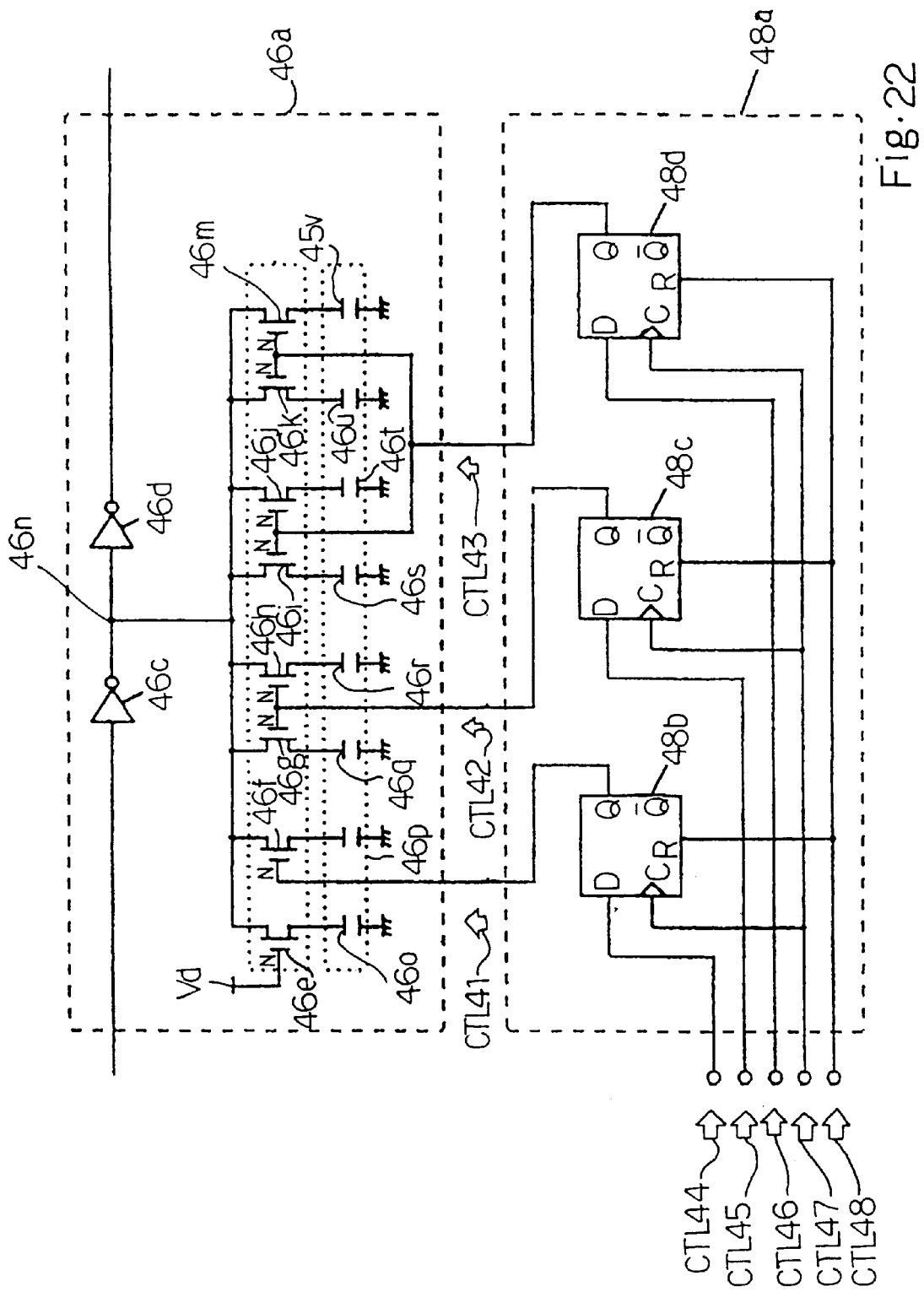
FIG. 22 is a circuit diagram showing the configuration of a variable delay circuit and a delay regulator incorporated in the clock generating circuit shown in FIG. 21.

FIG. 22 illustrates the variable delay circuit 46a and the delay regulator 48a. The variable delay circuit 46a changes the amount of capacitance coupled to the node 46n in response to the control signals CTL41/CTL42/CTL43 as similar to that of the fifth embodiment, and the delay regulator 48a selects one of the eight quantity levels of the capacitance coupled to the node 46n.

The delay regulator 48a has a different circuit configuration from the delay regulator 46b. The delay regulator 48a includes three flip-flop circuits 48b, 48c and 48d. The flip-flop circuits 48b/48c/48d are independently controlled through external control signals CTL44 to CTL46, an external set signal CTL47 and an external reset signal CTL48. The external control signals CTL44 to CTL46 are respectively supplied to the input nodes D of the flip-flop circuits 48b to 48d, and the set signal CTL47 and the reset signal CTL48 are shared between the flip-flop circuits 48b to 48d. The set signal CTL47 is supplied to the clock nodes of the flip-flop circuits 48b to 48d, and the reset signal CTL48 is supplied to the reset nodes of the flip-flop circuits 48b to 48d.

Even though the semiconductor chip is sealed in a package, user can adjust the variable delay circuit 46a to appropriate delay time by changing the external signals CTL44 to CTL48, and the internal clock signal CLKin is strictly synchronized with the external clock signal CLKex.

Figure 23:
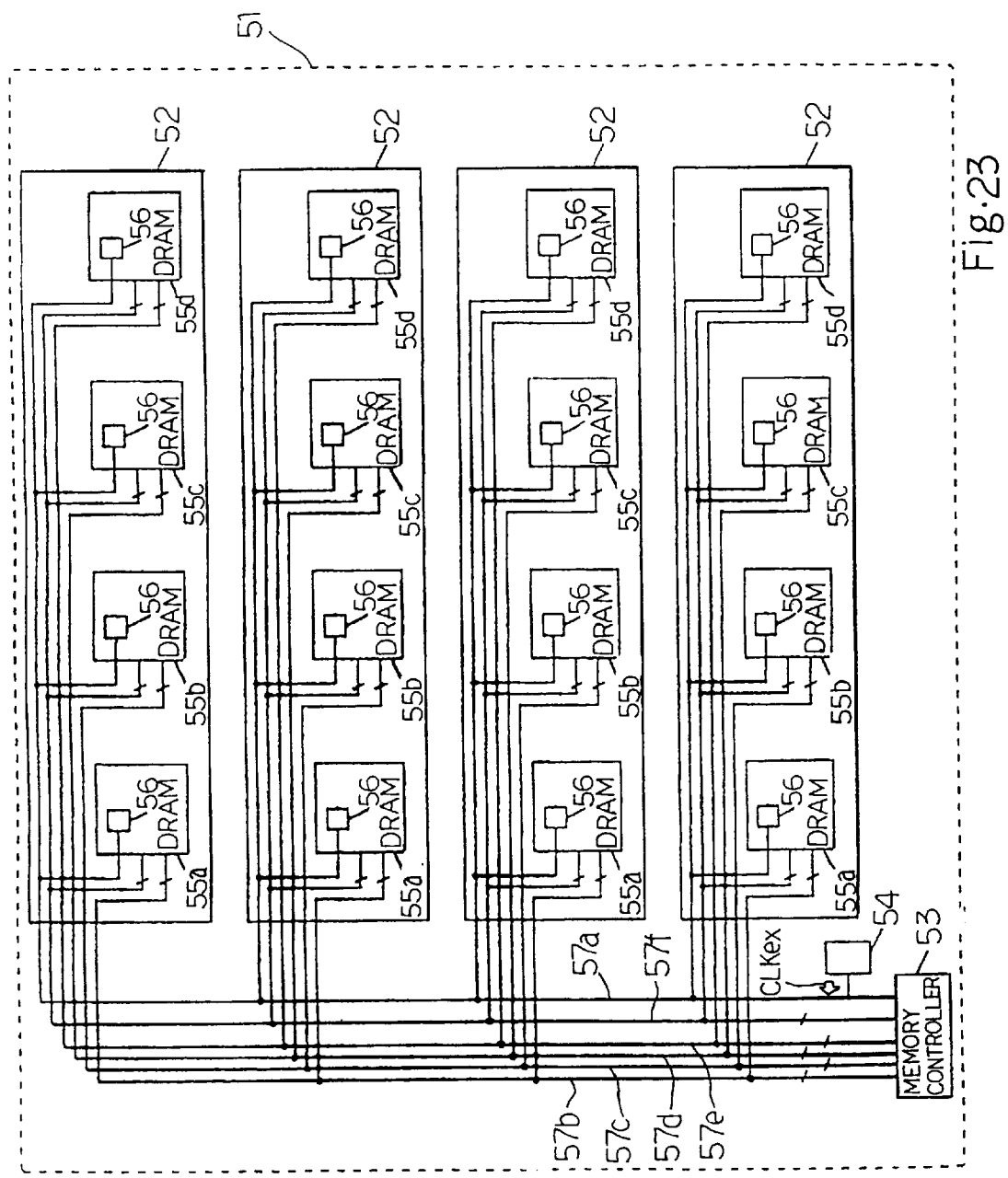
FIG. 23 is a circuit diagram showing an electronic system with synchronous dynamic random access memory devices.

FIG. 23 illustrates an electronic system 51. The electronic system 51 comprises plural memory modules 52, a memory controller 53 connected to the memory modules 52 and a clock generator 54 connected to the memory modules 52 and the memory controller 53. Plural synchronous dynamic random access memory devices 55a, 55b, 55c and 55d are incorporated in each memory module 52, and each synchronous dynamic random access memory device 55a/55b/55c/55d has the clock generating circuit 56 shown in FIGS. 21 and 22. The clock generator CLKex supplies the external clock signal CLKex through signal line 57a to all the synchronous dynamic random access memory devices 55a/55b/55c/55d, and all the clock generating circuits 56 generates the internal clock signals CLKin synchronous with the external clock signal CLKex. The internal clock signal CLKin is used for the double data rate transmission, and read-out data signals are supplied from the synchrous dynamic random access memory devices 55a, 55b, 55c and 55d through signal lines 57b, 57c, 57d and 57e to the memory controller 53.

The synchronous dynamic random access memory devices 55a to 55d are differently spaced from the memory controller 53 depending upon the location of the memory modules 52, and undesirable time difference takes between the read-out data signals at the memory controller 53. The time difference sets a limit on the maximum frequency of the external clock signal CLKex. The external control signals CTL44 to CTL48 are supplied from the memory controller 53 through the signal lines 57f to the synchronous dynamic random access memory devices 55a to 55d, and regulates the delay time to different values. As a result, the time difference is decreased, and the maximum frequency is increased.

Seventh Embodiment

Figure 24:
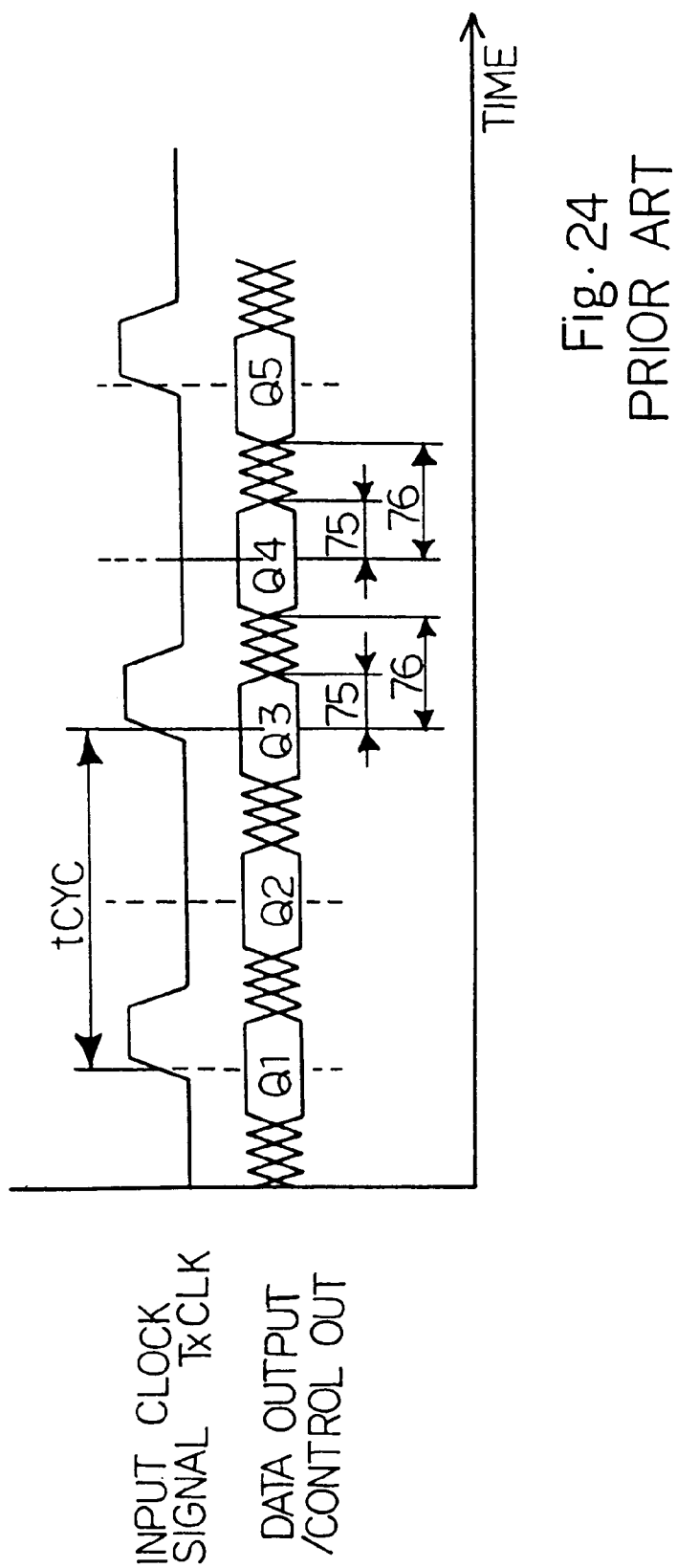
FIG. 24 is a timing chart showing a control sequence for a semiconductor memory device.

FIG. 24 illustrates an output timing of the high-speed DRAM written in "NEC Data Book: IC Memory Dynamic RAM", 1996, October. The input clock signal TxCLK has the cycle time tCYC. The data/control signal minimum output time and the data/control signal maximum output time are defined as $(1-0.45) \times tCYC/4$ and $(1+0.45) \times tCYC/4$, respectively. A system controller uses the input clock signal TxCLK as a strobe signal, and latches an output data and a control signal supplied from a semiconductor memory device. For this reason, the system controller controls the semiconductor memory device at ¼ of the cycle time tCYC and ¾ of the cycle time.

The clock generating circuit implementing the seventh embodiment is available for the control sequence. The clock generating circuit comprises the receiving circuit 22, the polarity controller 24, the inverter INV10, four pairs of controllers 25a/25b, 35a/35b and 61a to 61d, eight delay circuits 39a to 39d and 62a to 62d, pulse generators 27a/27b, 37a/37b and 63a to 63d, and the amplifier 28. Thus, the controllers 61a to 61d, the delay circuits 62a to 62d and the pulse generators 63a to 63d are added to the clock generating circuit shown in FIG. 14. Not only the internal clock pulses PS1 to PS4 but also internal clock pulses PS5, PS6, PS7 and PS8 are supplied to the OR gate 28a, and the amplifier 28 produces the internal clock signal CLKin from the internal clock pulses PS1 to PS8.

Figure 26:
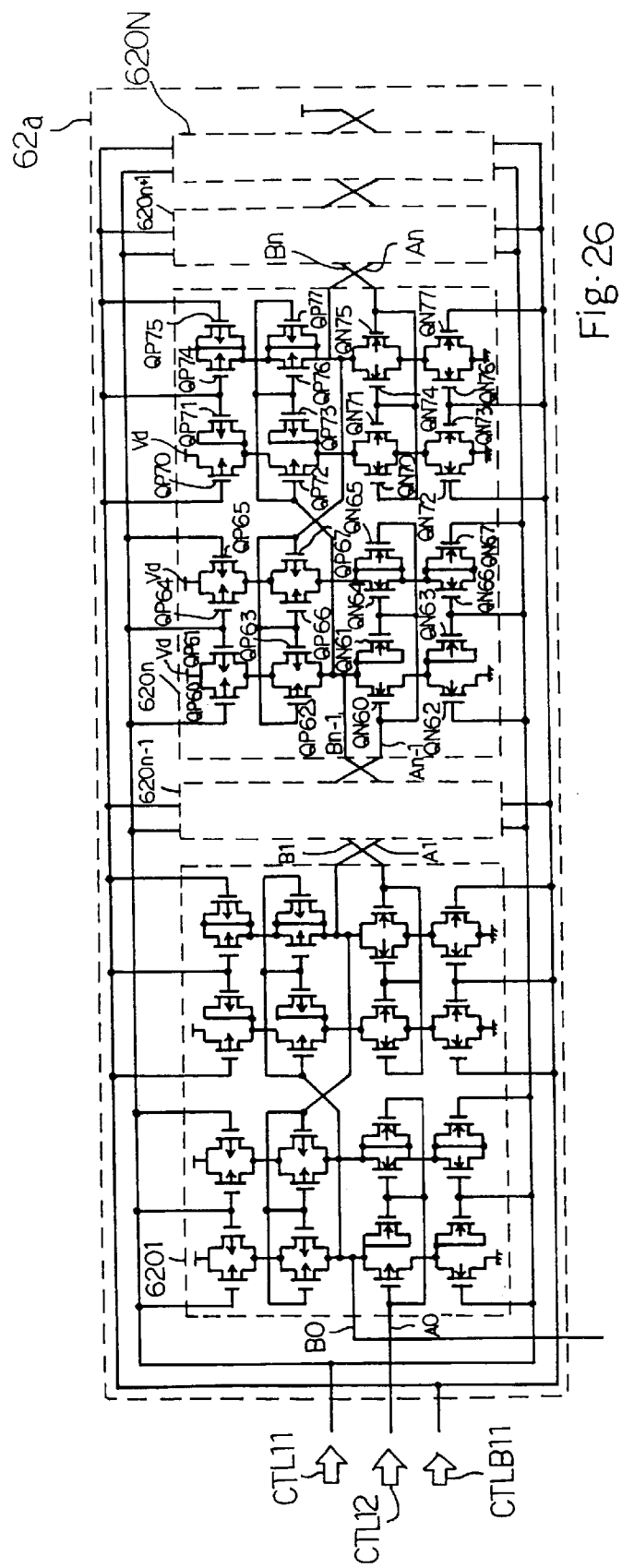
FIG. 26 is a circuit diagram showing the configuration of a delay circuit incorporated in the clock generating circuit shown in FIG. 25.

The controller 61a and the pulse generator 63a are similar to the controller 35a and the pulse generator 37a except for the delay time introduced by the controller 61a. The controller 61b, the delay circuit 62b and the pulse generator 63b behave complementarily to the controller 61a, the delay circuit 62a and the pulse generator 63b. The circuit configuration of the delay circuit 62a is illustrated in FIG. 26. The delay circuit 61a includes plural delay stages 6201 to 620N, and the delay stages 6201 to 620N are identical in circuit configuration to one another. For this reason, only the delay stage 620n is described hereinbelow.

The delay stage 620n has p-channel type field effect transistors QP60 to QP67 connected between the power supply line Vd and the signal transfer line Bn−1, and the p-channel type field effect transistors QP60 to QP67 provide four current paths to the signal transfer line Bn−1. The delay stage 620n further has n-channel type field effect transistors QN60 to QN67 connected to the signal transfer line Bn−1. However, only the n-channel type field effect transistor QN62 is connected to the ground line, and the n-channel type field effect transistors QN60 to QN67 provides only one current path from the signal transfer line Bn−1 and the ground line.

The delay stage 620n further has n-channel type field effect transistors QN70 to QN77 connected between the signal transfer line An and the ground line, and the n-channel type field effect transistors QN70 to QN77 provide four current paths from the signal transfer line An to the ground line. The delay stage 620n further has p-channel type field effect transistors QP70 to QP77 connected to the signal transfer line An. However, only the p-channel type field effect transistor QP70 is connected to the power supply line, and the p-channel type field effect transistors QP70 to QP77 provide only one current path from the power supply line to the signal transfer line An.

The control signal CTL11 is in the high level in the first time period, and, acordingly, the complementary control signal CTLB11 is in the low level. The signal transfer line An is charged through the p-channel type field effect transistor QP70, and the signal transfer line Bn-1 is discharged through the n-channel type field effect transistor QN62. On the other hand, the signal transfer line An is discharged through the four n-channel type field effect transistors QN72, QN73, QN76 and QN77 in the second time period, and the signal transfer line Bn-1 is charged through the p-channel type field effect transistors QP60, QP61, QP64 and QP65 in the second time period. Thus, the signal propagation speed in the second time period is four times higher than that in the first time period.

Figure 27:
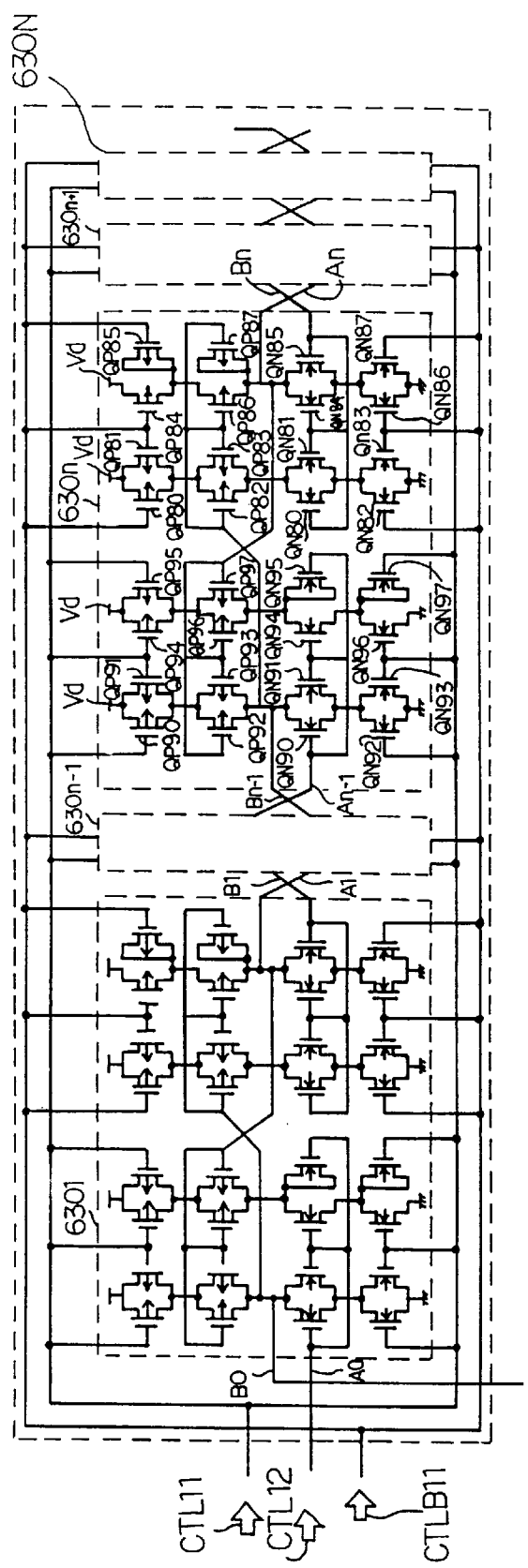
FIG. 27 is a circuit diagram showing the configuration of another delay circuit incorporated in the clock generating circuit shown in FIG. 25.

The controller 61c and the pulse generator 63d are similar to the controller 35a and the pulse generator 37a except for the delay time introduced by the controller 61c. The controller 61d, the delay circuit 62d and the pulse generator 63d behave complementarily to the controller 61c, the delay circuit 62c and the pulse generator 63c. The circuit configuration of the delay circuit 62c is illustrated in FIG. 27. The delay circuit 61c includes plural delay stages 6301 to 630N, and the delay stages 6301 to 630N are identical in circuit configuration to one another. For this reason, only the delay stage 630n is described hereinbelow.

The delay stage 630n includes n-channel type field effect transistors QN80 to QN87 connected between the signal transfer line An and the ground line, and the n-channel type field effect transistors QN80 to QN87 provide four current paths from the signal transfer line An to the ground line. The delay stage 630n further has p-channel type field effect transistors QP80 to QP87 connected to the signal transfer line An. However, only the p-channel type field effect transistors QP80, QP81 and QP84 are connected to the power supply line, and the p-channel type field effect transistors QP80 to QP87 provide only three current paths from power supply line Vd to the signal transfer line An.

The delay stage 630n further has p-channel type field effect transistors QP90 to QP97 connected between the power supply line Vd and the signal transfer line Bn-1, and the p-channel type field effect transistors QP90 to QP97 provide four current paths from the power supply line Vd and the signal transfer line Bn-1. The delay stage 630n further has n-channel type field effect transistors QN90 to QN97 connected to the signal transfer line Bn-1. However, only three n-channel type field effect transistors QN92, QN93 and QN96 are connected to the ground line, and the n-channel type field effect transistors QN90 to QN97 provide only three current paths from the signal transfer line Bn-1 and the ground line Bn-1.

The control signal CTL11 is in the high level in the first time period, and, acordingly, the complementary control signal CTLB11 is in the low level. The signal transfer line An is charged through the thee p-channel type field effect transistors QP80, QP81 and QP84, and the signal transfer line Bn-1 is discharged through the three n-channel type field effect transistors QN92, QN93 and QN96. On the other hand, the signal transfer line An is discharged through the four n-channel type field effect transistors QN82, QN83, QN86 and QN87 in the second time period, and the signal transfer line Bn-1 is charged through the four p-channel type field effect transistors QP90, QP91, QP94 and QP95 in the second time period. Thus, the signal propagation speed in the second time period is 4/3 times higher than that in the first time period.

Figure 25:
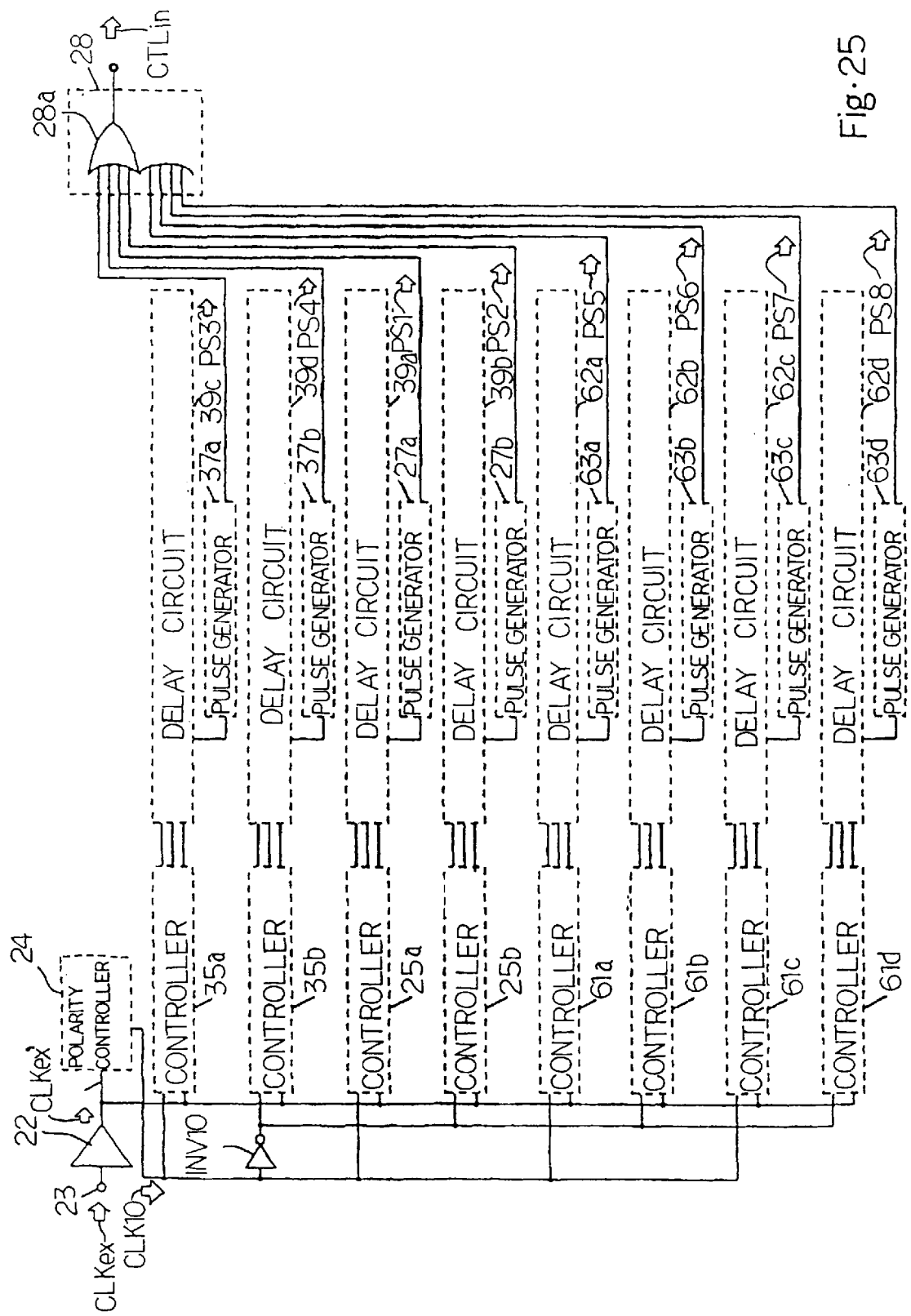
FIG. 25 is a circuit diagram showing the circuit configuration of a clock generating circuit according to the present invention.
Figure 28:
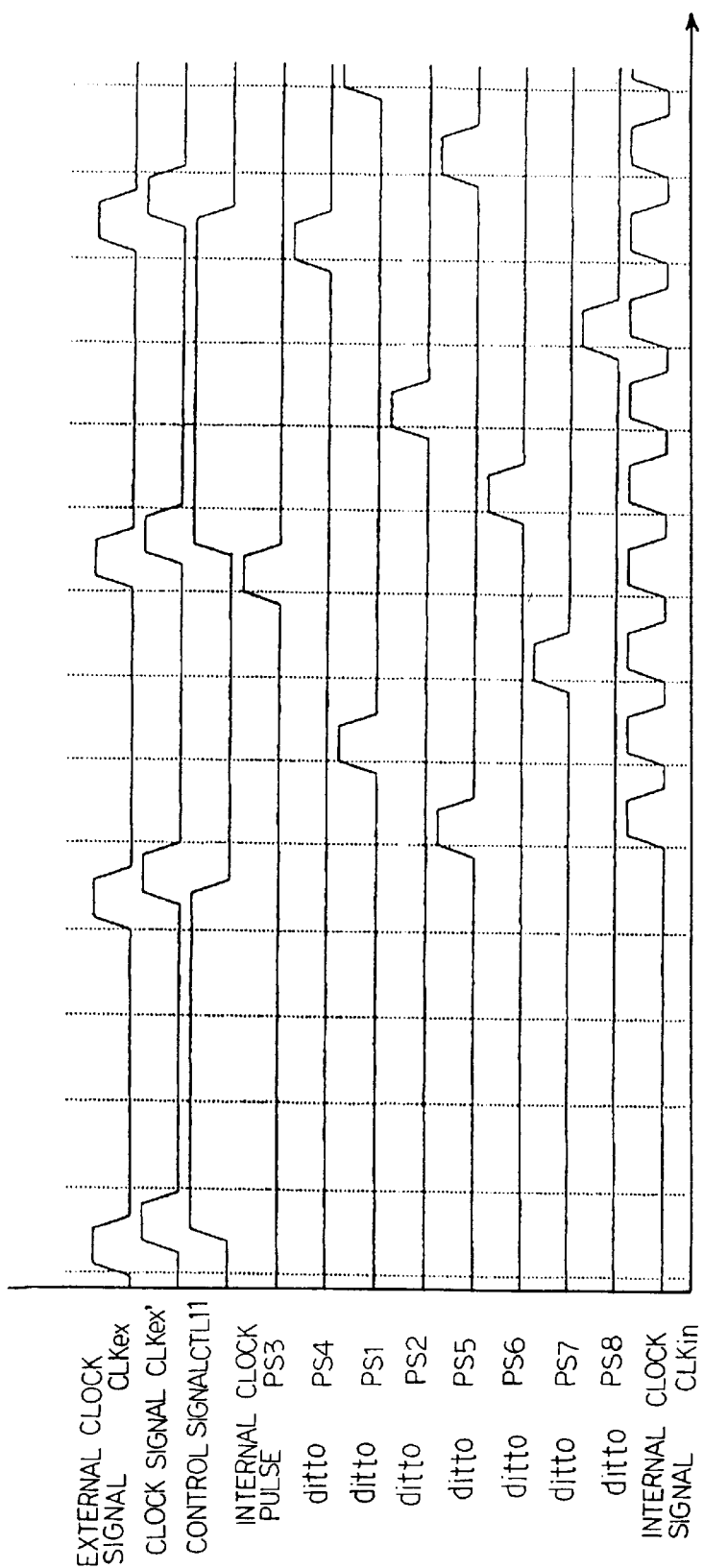
FIG. 28 is a timing chart showing the behavior of the clock generating circuit.

FIG. 28 illustrates the behavior of the clock generating circuit shown in FIG. 25. The polarity controller 24 and the inverter INV10 make the controllers 35b, 25b, 61b and 61d behave complementarily to the controllers 35a, 25a, 61a and 61c, respectively, and the internal clock pulses PS3, PS4, PS1, PS2 and PS5 to PS8 are supplied to the OR gate 28a. The amplifier 28 produces the internal clock signal CLKin from the internal clock pulses PS1 to PS8, and the internal clock signal CLKin rises at time intervals equal to a quarter of the clock period of the external clock signal CLKex.

The clock generating circuit implementing the seventh embodiment achieves the high resolution for the cycle time tCYC equivalent to the single gate as similar to the first embodiment. Even if the cycle time tCYC fluctuates, the clock generating circuit generates the internal clock signal synchronous with the external clock signal CLKex in so far as the delay stages maintain the linearity between the amount of charge and the charging/discharging time period, and the phase differece between the quarter cycle and the pulse rise of the internal clock signal CLKin is equal to or less than the time delay introduced by the signal gate. Thus, the clock generating circuit makes a semiconductor memory device achieve the control sequence shown in figure at the accuracy equal to or less than the time delay of a single logic gate under the condition where the internal clock signal CLKin and the external clock signal CLKex keep the phase difference at 90 degrees.

Eighth Embodiment

Figure 29:
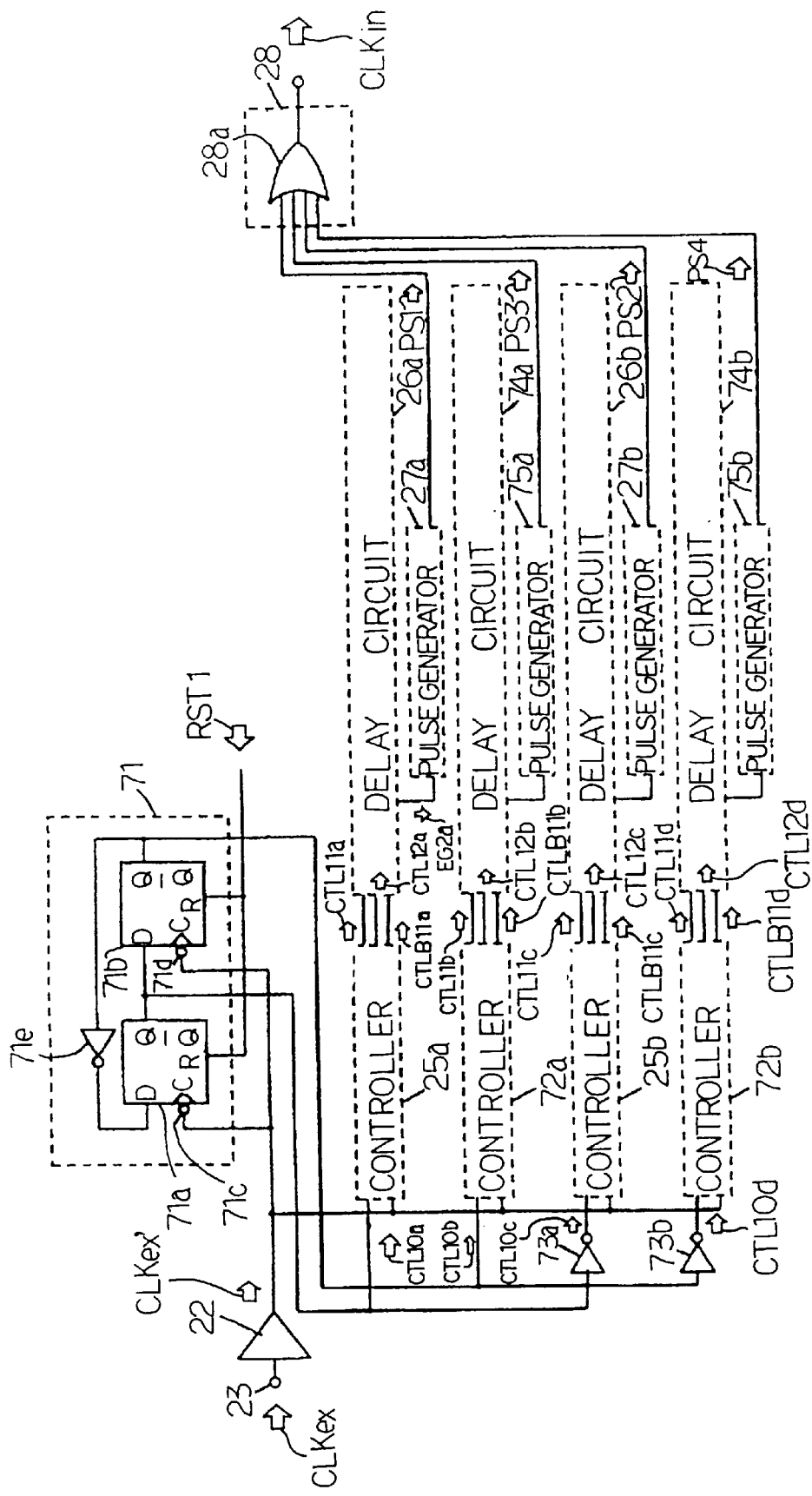
FIG. 29 is a circuit diagram showing the arrangement of another clock generating circuit according to the present invention.

FIG. 29 illustrates another clock generating circuit embodying the present invention. The clock generating circuit implementing the eighth embodiment comprises the receiving circuit 22, a polarity controller 71, controllers 25a/25b and 72a/72b, inverters 73a/73b, delay circuits 26a/26b and 74a/74b, pulse generators 27a/27b and 75a/75b and the amplifier 28. Thus, the polarity controller 24 is replaced with the polarity controller 71, and the controllers 72a/72b, the inverters 73a/73b, the delay circuits 74a/74b and the pulse generators 75a/75b are added to the clock generating circuit shown in FIG. 10, and the internal clock pulses PS1 to PS4 are supplied to the OR gate 28a.

The polarity controller 71 includes resettable flip-flop circuits 71a, 71b connected in series, inverters 71c/71d connected to the input nodes of the resettable flip-flop circutis 71a/71b and an inverter connected between the output node Q of the resettable flip-flop circuit 71b and the input node D of the other resettable flip-flop circuit 71a. The resettable flip-flop circuits 71a/71b are reset with a reset signal RST1, and are, thereafter, responsive to the clock signal CLKex' so as to supply polarity control signals CTL10a and CTL10b to the controllers 25a/25b and the inverters 73a/73b. The inverters 73a/73b produce the complementary control signals CTL10c/CTL10d from the control signals CTL10a/CTL10b, respectively. The control signals CTL10a/CTL10b and the complementary control signals CTL10c/CTL10d are different in phase from one another, and the polarity controller 71 and the inverters 73a/73b supply a 4-phase control signal CTL10a to CTL10d to the controllers 25a/25b and 72a/72b.

Turning back to FIG. 12, a pulse rise of the clock signal CLKex causes the control signal CTL11 to fall in the second time period, and the potential edge signal EG2 causes the amplifier 28 to raise the internal clock signal CLKin through the intenal clock pulse PS1, and the time period between the pulse rise of the external clock signal CLKex and the pulse rise of the internal clock signal CLKin is equal to (t1+td+t2). If the cycle time tCYC becomes shorter, the delay circuit 26a decreases the time delay td, and makes the internal clock signal CLKin synchronous with the external clock signal CLKex. However, if the potential edge signal EG2 is in the low level for certain time period shorter than the total time delay introduced by the delay circuit 25d and the inverter 27d, the next potential rise of the edge signal EG2 reaches the input node of the AND gate 27e before the potential rise of the output node of the inverter 27d. As a result, the internal clock pulse PS1 is not produced at the predetermined timing.

Figure 30:
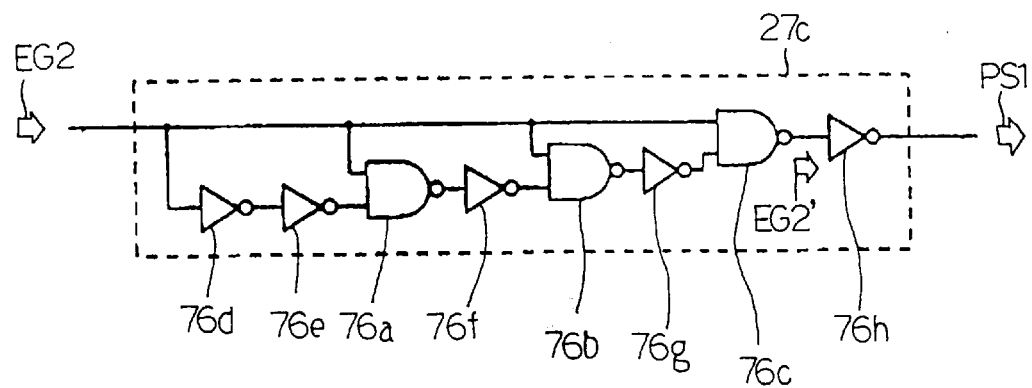
FIG. 30 is a circuit diagram showing the configuration of an actual delay circuit incorporated in the pulse generator.

In the actual design work, the pulse generator 27a is designed to have a signal propagation path shown in FIG. 30. The signal propagation path is divided by NAND gates 76a, 76b and 76c, and the potential edge signal EG2 is supplied to the input nodes of the NAND gates 76a to 76c. The potential edge signal EG2 is supplied through two inverters 76d/76e to the other input node of the NAND gate 76a, the output node of the NAND gate 76a is connected through an inverter 76f to the other input node of the next NAND gate 76b, and the output node of the NAND gate 76b is connected through an inverter 76g to the other input node of the next NAND gate 76c. The NAND gate 76c supplies the delayed potential edge signal EG2' to an inverter 76h, and the inverter 76h produces the internal clock pulse PS1. The potential edge signal EG2 is assumed to remain in the low level for time period tw. The delay circuit 27c can decrease the time period tw to time delay introduced by two inverters. The signal width in the low level is expresed as (2×td), and is euqal to or longer than tw, i.e., (2×td)≧tw. The minimum cycle time tCKmin is equal to (t1+tw/2+t2).

Figure 31:
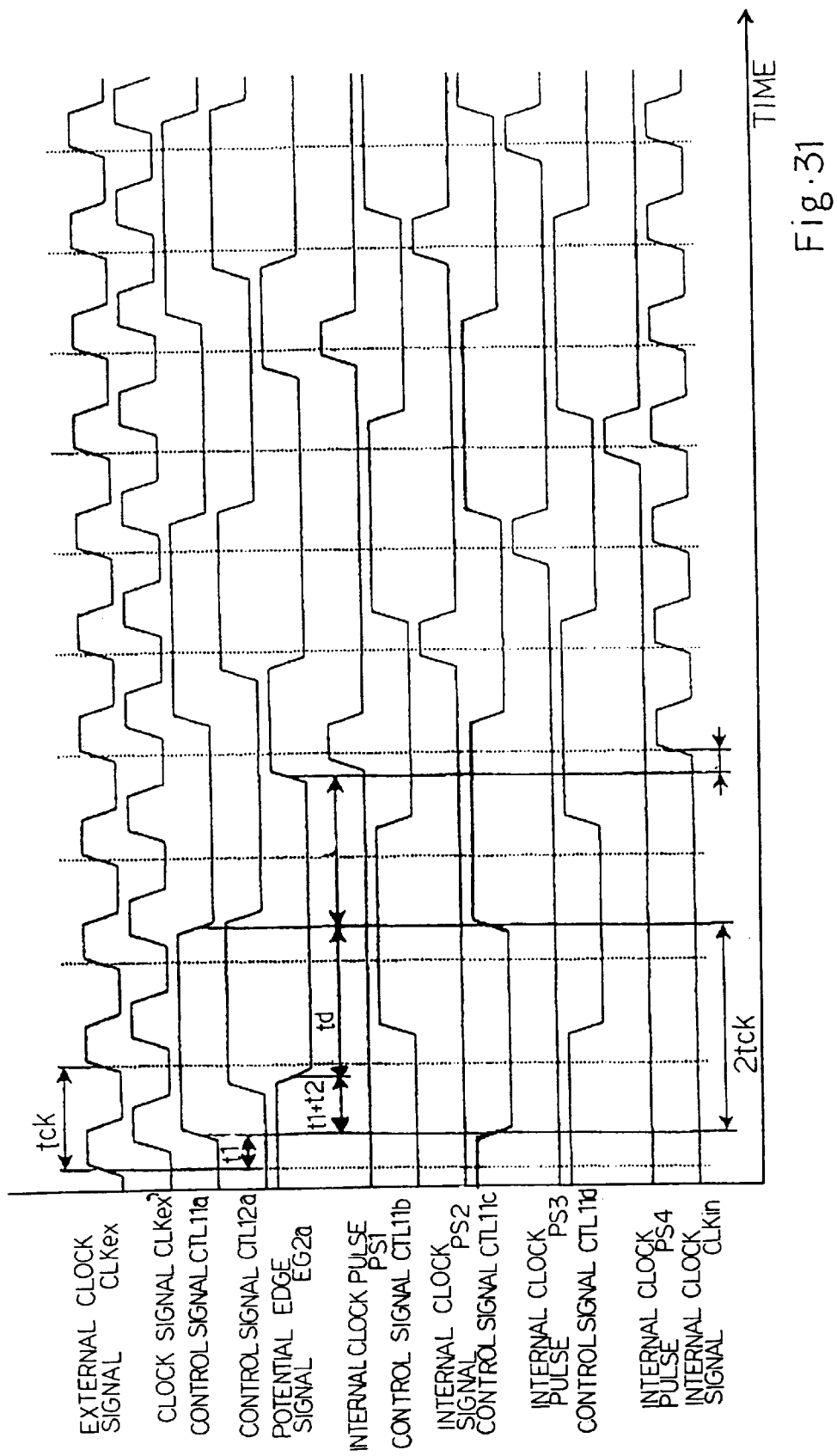
FIG. 31 is a timing chart showing the behavior of the clock generating circuit.

The clock generating circuit implementing the eighth embodiment provides a means for decreasing the minimum cycle time tCKmin. FIG. 31 illustrates the behavior of the clock generating circuit implementing the eighth embodiment. The the polarity controller 71 alters the control signal CTL10a level between the high level and the low level one two clock cycles tCK, and, accordingly, the controller 25a alters the control signal CTL11a between the high level and the low level once two external clock cycles tCK. Namely, the control signal CTL11a is changed to the high level in the first external clock cycle and to the low level in the third external clock cycle. Thus, the control signal CTL11a is maintained at the high level twice as long as the external clock cycle (2×tCK). The first time period is equivalent to the signal propagation from the rise of control signal CTL11a through the delay circuit 25d and the AND gate 25e to the arrival of the potential edge signal EG1 at the certain delay stage, i.e., 2×tCK=t1+t2+td. In the second time period, the receiving circuit 22 receives the next external clock pulse CLKex, the controller 25a decays the control signal CTL11a to the low level, the delay circuit 26a and the pulse generator 27a propagate the potential edge signal EG2, and the amplifier 28 alters the internal clock signal CLKin to the high level. The above described sequence consumes time period equal to (t1+td+t2), and the time period is equal to (2×tCK), and the first internal clock pulse CLKin is changed to the high level in the fifth cycle.

When the cycle time becomes shorter, the delay circuit 26a shortens the delay time td, and the delay time is decreased to tw/2. The minimum time period from the pulse rise of external clock pulse CLKex in the third cycle to the pulse rise of internal clock pulse CLKin in the fifth cycle, which is twice as long as the minimum cycle times tCKmin, is equal to (t1+tw/2+t2). Thus, the minimum cycle time tCKmin of the eighth embodiment is decreased to a half of the minimum cycle time tCKmin of the first embodiment.

Thus, the clock generating circuit implementing the eighth embodiment controls the four delay circuits 26a/26b and 74a/74b with the four-phase control signal CTL10a/CTL10b/CTL10c/CTL10d, and achieves the minimum cycle time tCKmin decreased to a half of that of the first embodiment.

Ninth Embodiment

Figure 32:
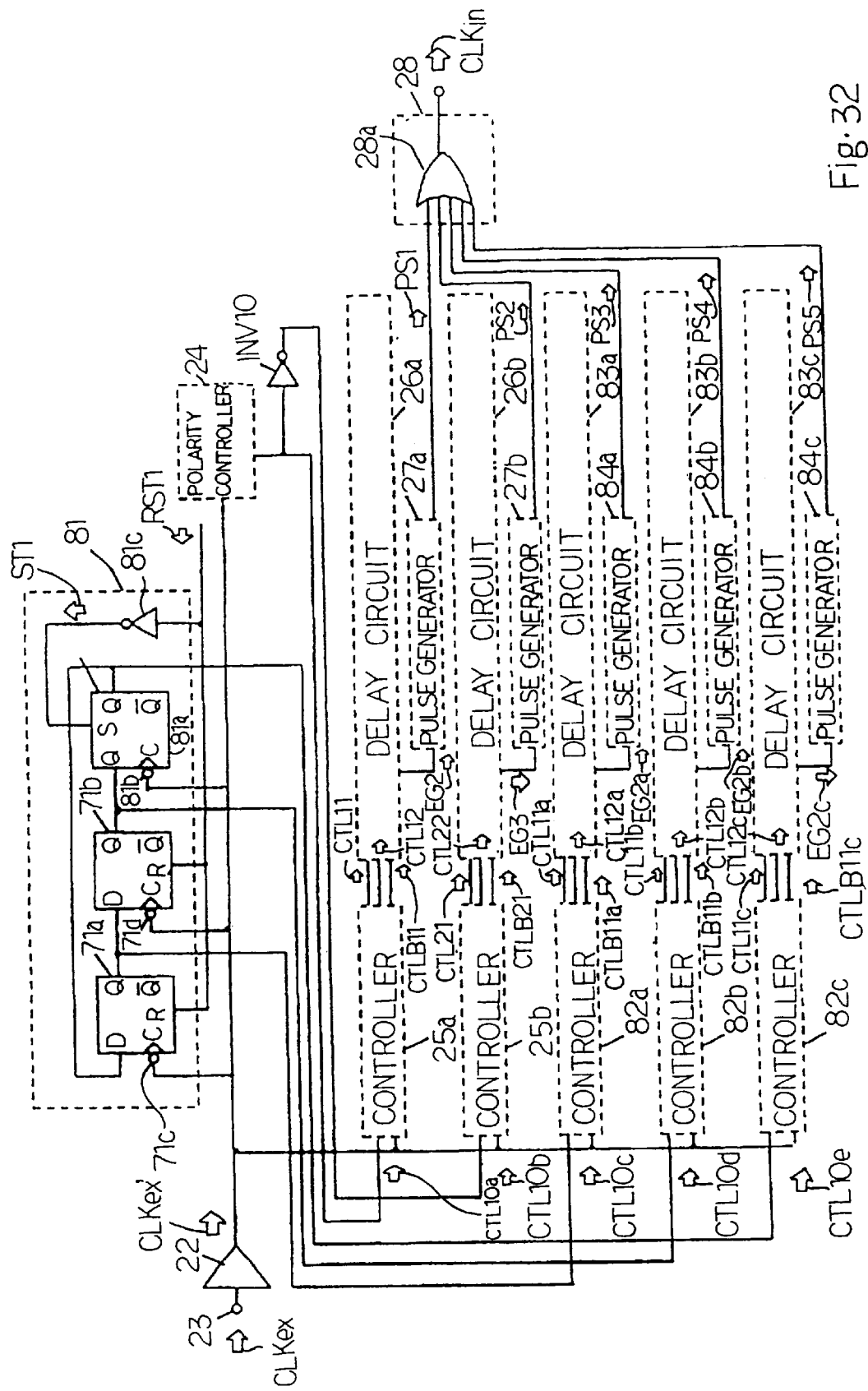
FIG. 32 is a circuit diagram showing the circuit diagram showing another clock generating circuit according to the present invention.

FIG. 32 illustrates another clock generating circuit embodying the present invention. A polarity controller 81, controllers 82a/82b/82c, delay circuits 83a/83b/83c and pulse generators 84a/84b/84c are added to the clock generating circuit implementing the first embodiment. For this reason, the other circuits are labeled with the same references designating corresponding circuits of the first embodiment.

A flip-flop circuit 81a and inverters 81b/81c are added to the polarity controller 71, and the inverter produces a set signal ST1 from the reset signal RST1. The set signal ST1 is supplied from the inverter 81c to the set node S of the flip flop circuit 81a.

Figure 33:
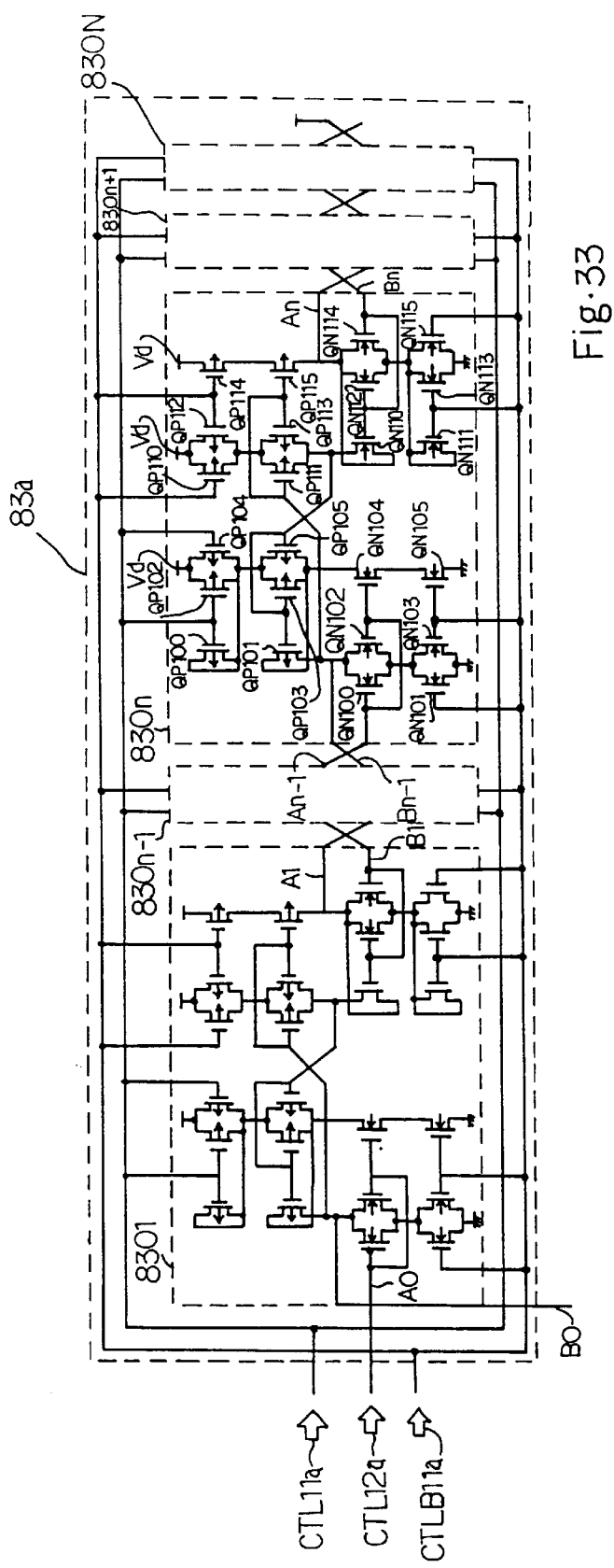
FIG. 33 is a circuit diagram showing the configuration of a delay circuit incorporated in the clock generating circuit.

The controller 82a and the pulse generator 84a are similar in circuit configuration and behavior to the controller 25a and the pulse generator 27a, respectively, and only the delay time of the controller 82a is different from that of the controller 25a. The delay circuit 83a is illustrated in FIG. 33, and includes plural delay stages 8301, 830n-1, 830n, 830n+1 and 830N. The delay stages 8301 to 830N are similar in circuit configuration to one another, and only the delay stage 830n is detailed hereinbelow.

The delay stage 830n includes a first charging circuit connected between the power supply line Vd and the signal transfer line Bn-1 and a first discharging circuit connected between the signal transfer line Bn-1 and the ground line. The first charging circuit has six p-channel type field effect transistors QP100, QP101, QP102, QP103, QP104 and QP105, and the first discharging circuit has six n-channel type field effect transistors QN100, QN101, QN102, QN103, QN104 and QN105. The n-channel type field effect transistors QN100 to QN105 form three current paths from the signal transfer line Bn-1 to the ground line. However, only the two p-channel type field effect transistors QP102/QP104 are connected to the power supply line Vd.

The delay stage 830n further includes a second charging circuit connected between the power supply line Vd and the signal transfer line An and a second discharging circuit connected between the signal transfer line An and the ground line. The second charging circuit has six p-channel type field effect transistors QP110, QP111, QP112, QP113, QP114 and QP115, and the second discharging circuit has six n-channel type field effect transistors QN110, QN111, QN112, QN113, QN114 and QN115. The p-channel type field effect transistors QP110 to QP115 form three current paths from the power supply line Vd to the signal transfer line An. However, only the two n-channel type field effect transistors QN113/QN115 are connected to the power supply line Vd. Thus, each of the delay stages 8301 to 830N has the charging/discharging capability unbalanced between the first time period and the second time period.

In the first time period, the first control signal CTL11a is in the high level, and the complementary control signal CTLB11a is in the low level. The signal transfer line An is charged through the three current paths, and the signal transfer line Bn-1 is discharged through the three current paths. On the other hand, the signal transfer line An is discharged through two current paths in the second time period, and the signal transfer line Bn-1 is charged through the two current paths in the second time period. As a result, the signal propagation time in the second time period is 3/2 times longer than the signal propagation time in the first time period.

Figure 34:
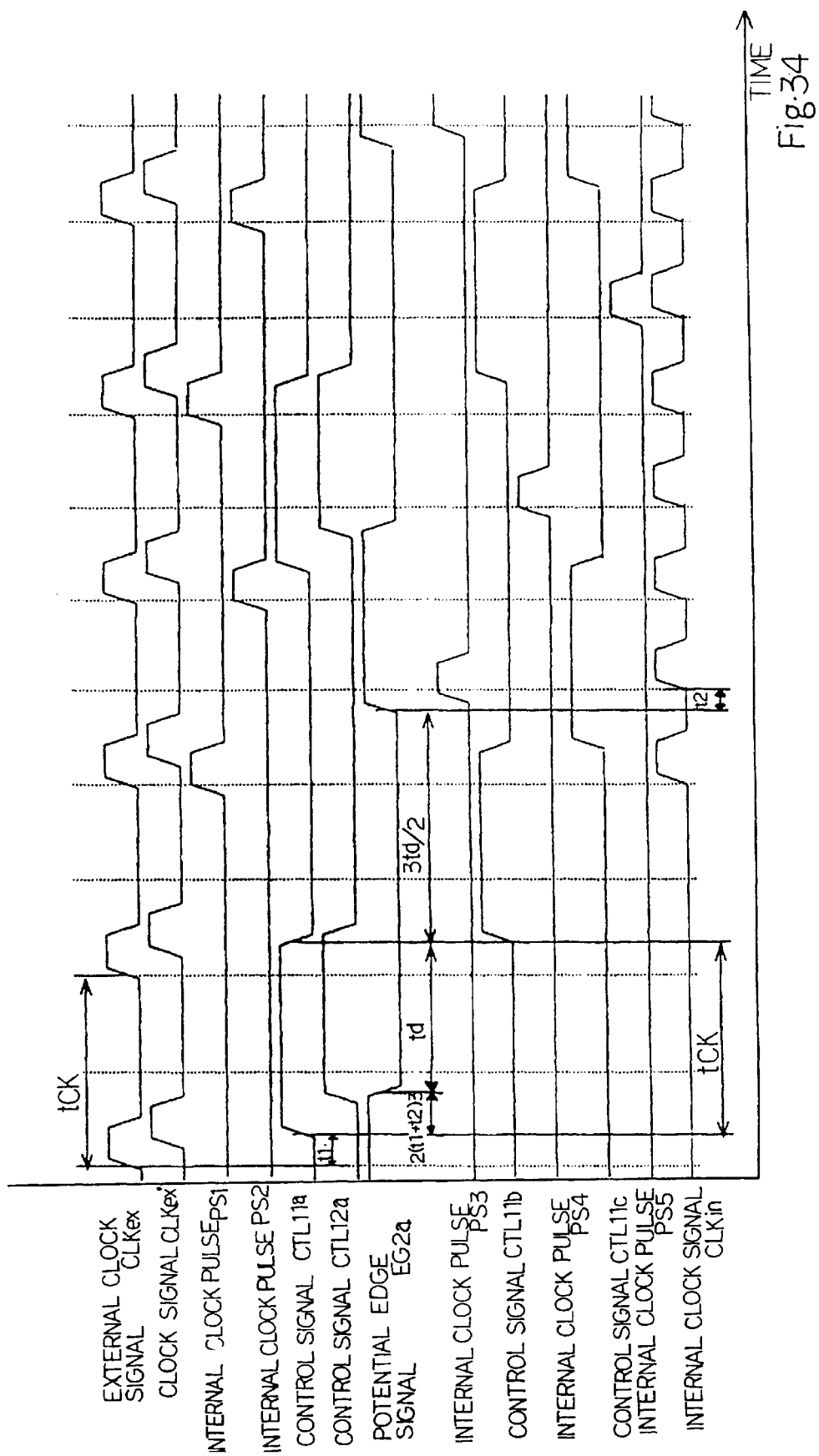
FIG. 34 is a timing chart showing the circuit behavior of the clock generating circuit.

FIG. 34 illustrates the behavior of the clock generating circuit. The controllers 82b/82c, the delay circuits 83b/83c and the pulse generators 84b/84c are similar in circuit arrangement to the controller 82a, the delay circuit 83a and the pulse generator 84a. However, the polarity controlling signals CTL10d/CTL10e are different from the polarity controlling signal CTL10c, and the controllers 82b/82c, the delay circuits 83b/83c and the pulse generators 84b/84c are different in phase to the controller 82a, the delay circuit 83a and the pulse generator 84a.

The pulse generators 27a, 27b, 84a, 84b and 84c respectively generate the internal clock pulses PS1, PS2, PS3, PS4 and PS5, and supply them to the OR gate 28a. The amplifier 28 produces an internal clock signal CLKin from the internal clock pulses PS1 to PS5. The internal clock signal CLKin is twice as high in frequency as the external clock signal CLKex, and rise at the same time as the external clock signal CLKex and at 180 degrees different from the external clock signal CLKex.

The clock generating circuit implementing the second embodiment propagates the potential edge signal EG2 for the time period equal to 0.5 cycle in the second time period. On the other hand, the clock generating circuit implementing the ninth embodiment propagates the potential edge signals for time period equal to 1.5 cycles in the second time period. For this reason, the clock generating circuit implementing the ninth embodiment shrinks the minimum cycle time, and realizes the same function as the second embodiment.

Tenth Embodiment

Figure 35:
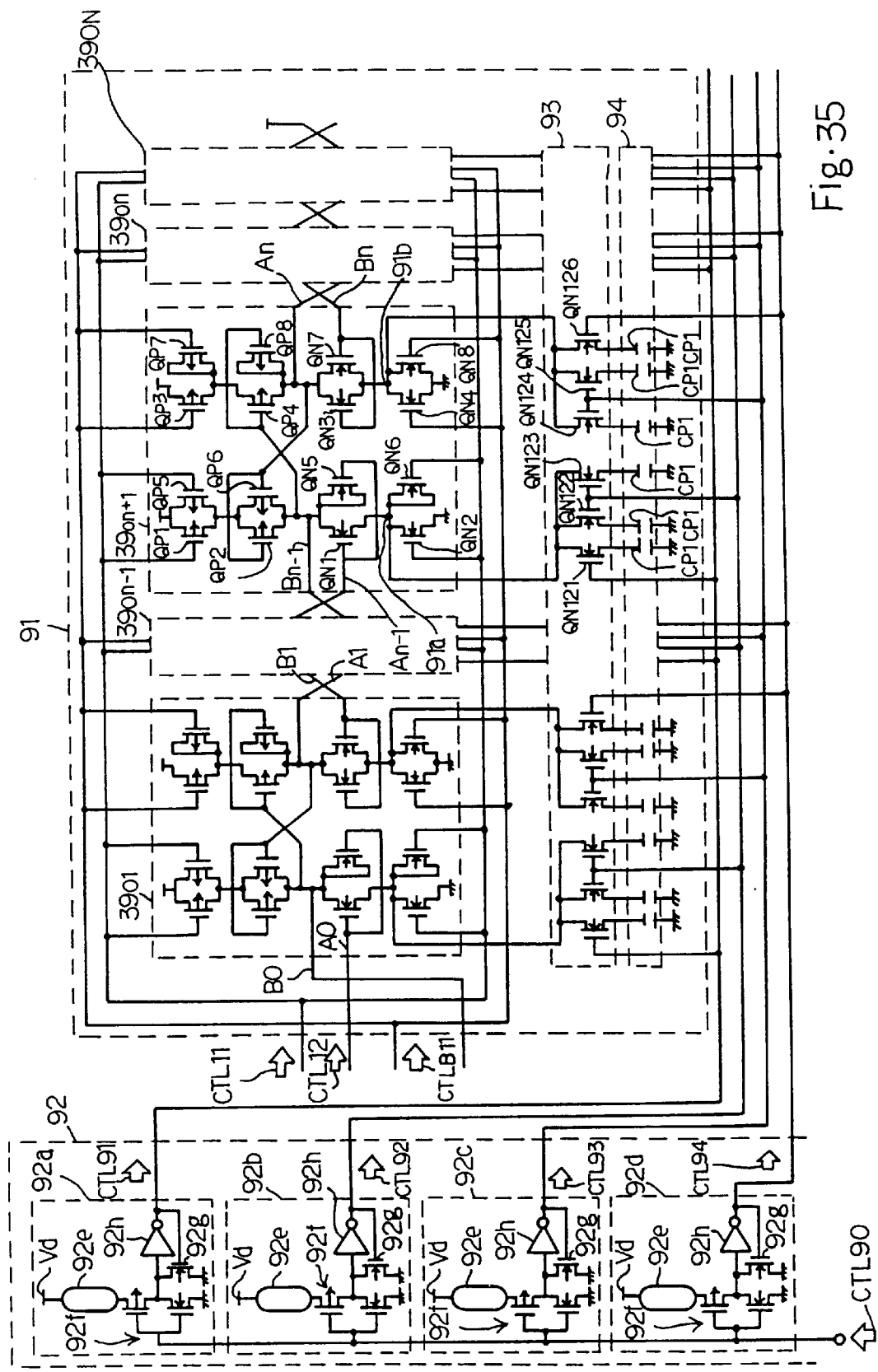
FIG. 35 is a circuit diagram showing another clock generating circuit according to the present invention.

FIG. 35 illustrates a variable delay circuit 91 and a delay controller 92 incorporated in another clock generating circuit embodying the present invention. The delay controller 92 varies the time delay introduced by the variable delay circuit 91. Although the receiving circuit 22, the polarity controller 24, the controllers 25a/25b, the pulse generators 27a/27b and the amplifier 28 are further incorproated in the clock generating circuit, they are deleted from FIG. 35 for the sake of simplicity.

The variable delay circuit 91 includes the plural delay stages 3901 to 390N (see FIG. 14), a switching array 93 and a capacitor array 94. Every six n-channel type field effect transistors QN121, QN122, QN123, QN124, QN125 and QN126 of the switching array 93 are grouped, and are associated with each delay stage. The n-channel type field effect transistors QN121 to QN126 are respectively connected in series to capacitors CP1, and the capacitors CP1 are grounded. The n-channel type field effect transistors QN121 to QN123 are connected to an intermediate node 91a between the n-channel type field effect transistors QN1 and QN2, and the remaining n-channel type field effect transistors QN124, QN125 and QN126 are connected to an intermediate node 91b between the n-channel type field effect transistors QN3/QN7 and the n-channel type field effect transistors QN4/QN8.

The delay controller 92 has four fuse registers 92a, 92b, 92c and 92d, and the fuse registers 92a to 92d are similar in circuit configuration to one another. A series of fuse element 92e and a complementary transistor 92f, an n-channel type field effect transistor 92g and an output inverter 92h form in combination each of the signal generators 92a to 92d. The fuse registers 92a to 92d are responsive to a control signal CTL90 for generating control signals CTL91, CTL92, CTL93 and CTL94, and behave as similar to the fuse registers 46w to 46y.

The control signal CTL91 is supplied to the gate electrode of the n-channel type field effect transistor QN121 connected to the intermediate node 91a, and the control signal CTL92 is supplied to the gate electrodes of the n-channel type field effect transistors QN122 and QN123 also connected to the intermediate node 91b. Similarly, the control signal CTL93 is supplied to the gate electrode of the n-channel type field effect transistor QN124 connected to the intermediate node 91b, and the control signal CTL94 is supplied to the gate electrodes of the n-channel type field effect transistors QN125 and QN126 also connected to the intermediate node 91b. Thus, the delay controller 92 stepwise increases the capacitance coupled to the intermediate nodes 91a/91b. When the capacitor CP1 has capacitance C, the capacitance coupled to each intermediate node 91a/91b is changed from 0, C, 2C and 3C. The fuse eleemnt 92e of the fuse register 92d is assumed to be broken, only the fuse register 92 changes the control signal CTL94 to the high level, and the control signal CTL94 causes the n-channel type field effect transistor QN126 to turn on. The n-channel type field effect transistor QN126 connects the associated capacitor CP1 to the intermediate node 91b.

In the first time period, the control signal CTL11 is changed to the high level, and the signal transfer line An-1 is in the high level. The signal transfer line Bn-1 is discharged from the high level toward the low level. Subsequently, the series of two p-channel type field effect transistors QP3/QP4 turn on so as to change the signal transfer line An. The signal transfer line Bn of the high level causes the n-channel type field effect transistors QN3/QN7 to turn on, and the current flows through the n-channel type field effect transistors QN3/QN7 and the n-channel type field effect transistor QN126 to the capacitor CP1. Thus, the capacitor CP1 retards the potential rise on the signal transfer line An, and the delay time is prolonged.

The control signal CTL11 is changed to the low level in the second time period, and, accordingly, the complementary control signal CTLB11 is changed to the high level. The n-channel type field effect transistors QN4/QN8 turn on, and the intermediate node 91b is discharged. When the signal transfer line Bn is changed to the high level, the n-channel type field effect transistors QN3/QN7 turn on, and the signal transfer line An is discharged. The capacitor CP1 coupled to the intermediate node 91b has been already discharged, and the capacitor CP1 does not affect the propagation of the potential edge signal EG2.

The capacitors CP1 selectively coupled to the intermediate node 91a/91b prolong the signal propagation of the potential edge signal EG1 in the first time period. However, the capacitors CP1 do not have any influence on the signal propagation of the potential edge signal EG2 in the second time period. On the other hand, the capacitors CP1 coupled to the intermediate node 91a propongs the signal propagation of the potential edge signal EG2 in the second time period, and have no influence on the signal propagation of the potential edge signal EG1 in the first time period. Thus, the delay controller 92, the switching array 93 and the capacitor array 94 independently varies the signal propagation time of the potential edge signal EG1 in the first time period and the signal propagation time of the potential edge signal EG2 in the second time period.

Although the parasitic resistance and the parasitic capacitance coupled to each signal transfer line Ai is designed to be equal to the parasitic resistance and the parasitic capacitance coupled to each signal transfer line Bi, the parasitic resistance and the parasitic capacitance coupled to the signal transfer line Ai is hardly equalized to the parasitic resistance and the parasitic capacitance coupled to the other signal transfer line Bi due to fluctuation of the fabrication process. If the parasitic resistance and the parasitic capacitance are unbalanced between the signal transfer line Ai and the signal transfer line Bi, each stage propagates one of the potential edge signals EG1 or EG2 faster than the other potential edge signal EG2 or EG1, and the time difference is accumulated during the signal propagation through the plural delay stages 3901 to 390i. In this instance, the signal propagation speed is regulable. The manufacturer may check the delay circuit 92 to see whether or the signal propagation speed is equal between the potential edge signal EG1 and the potential edge signal EG2 before the packaging. If the difference in signal propagation speed is not admittable, the manufacturer selectively break the fuse elements 92e of the fuse registers 92a to 92d, and regualtes the signal proapgation speed between the potential edge signal EG1 and the potential edge signal EG2.

Eleventh Embodiment

Figure 36:
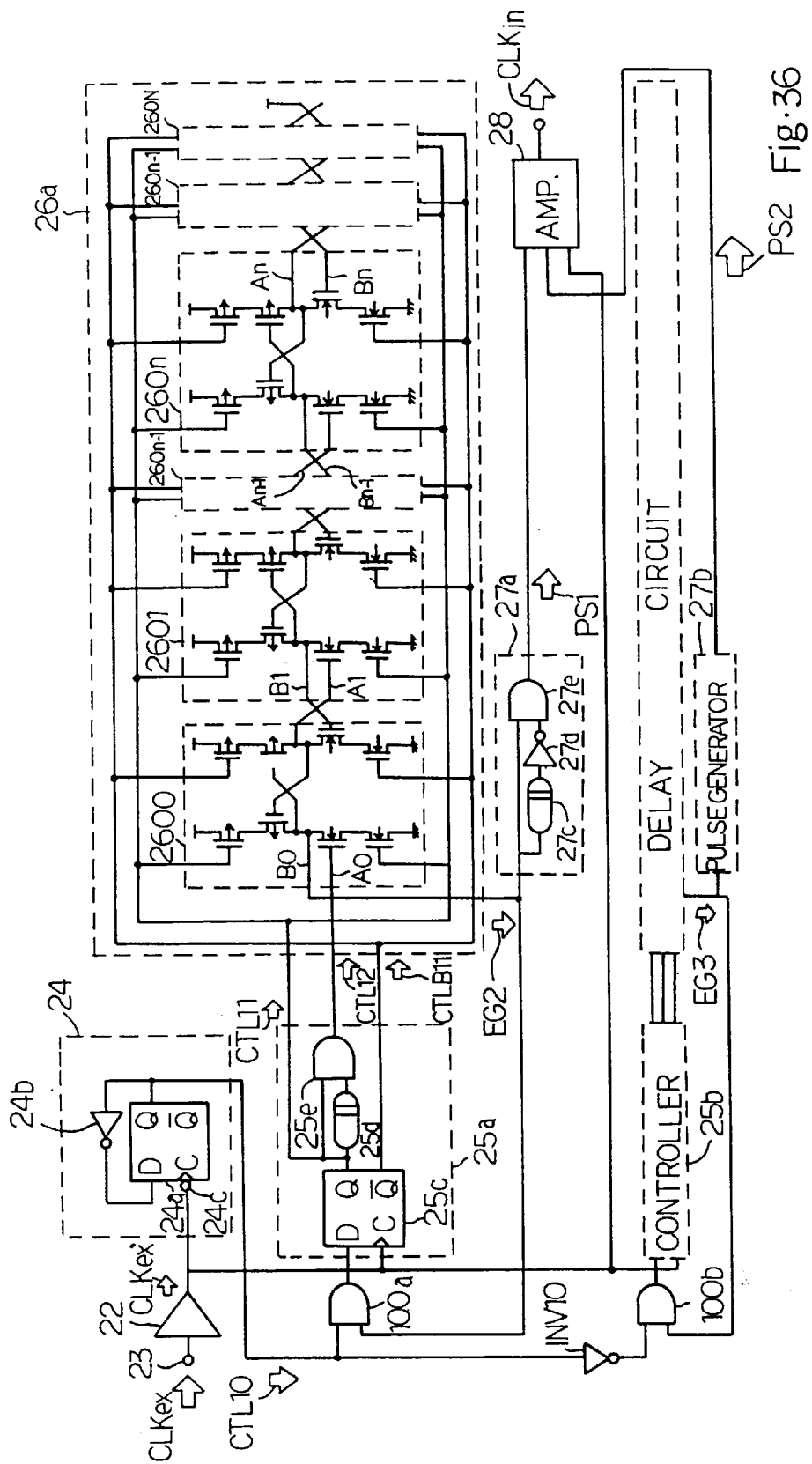
FIG. 36 is a circuit diagram showing another clock generating circuit according to the present invention.

Turning to FIG. 36 of the drawings, AND gates 100a/100b are added to the clock generating circuit shown in FIG. 10. For this reason, the other circuits and components are labeled with the same references designating corresponding circuits and components of the first embodiment.

Figure 37:
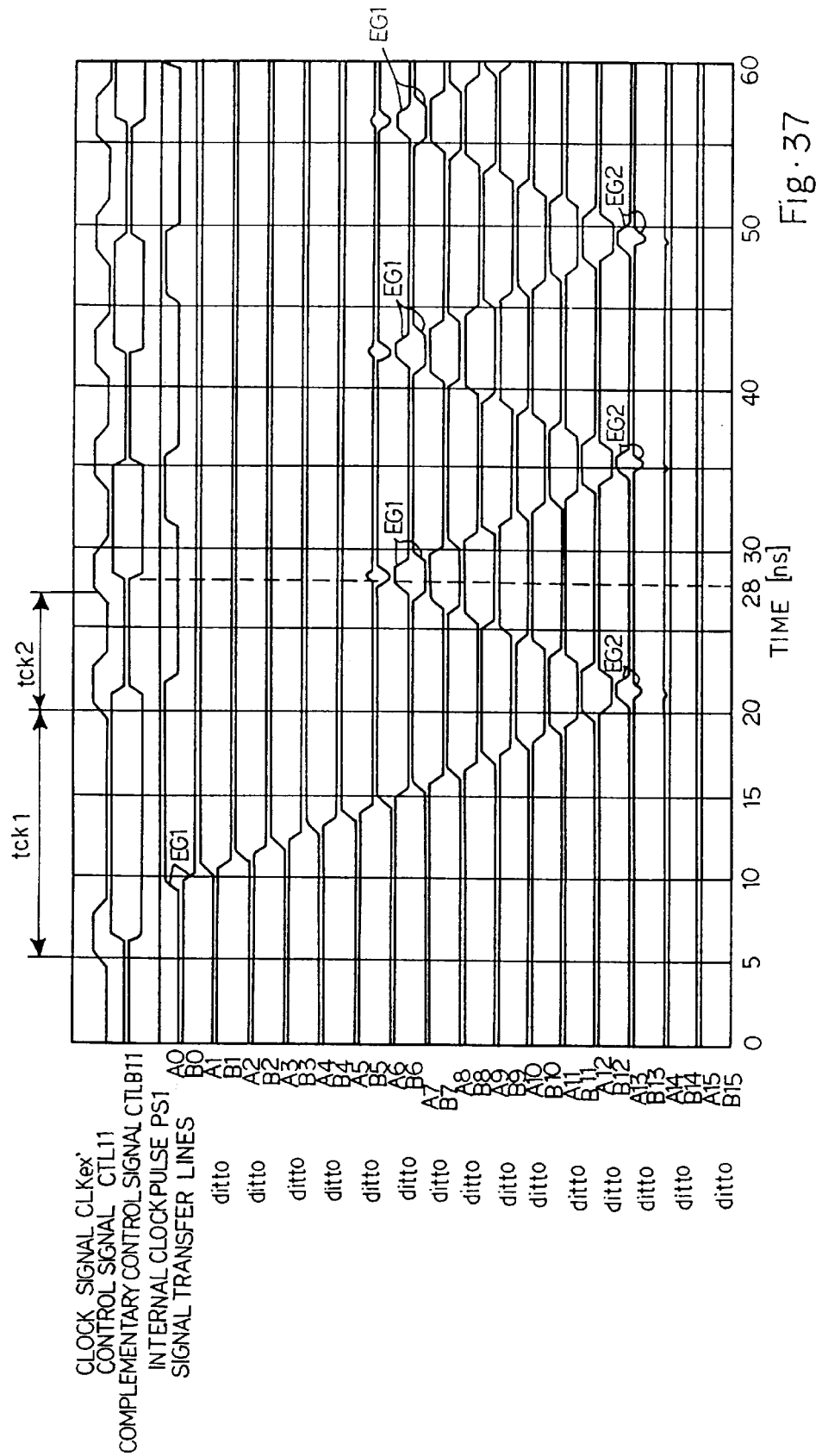
FIG. 37 is a timing chart showing the behavior of the clock generating circuit shown in FIG. 10 when the external clock signal is unstable.

When the external clock signal CLKex temporarily becomes unstable, the clock generating circuit shown in FIG. 10 incompletely propagates the potential edge signals EG1/EG2 as shown in FIG. 37. In order to make the difference between the first embodiment and the eleventh embodiment clear, the behavior of the first embodiment is described under the unstable external clock signal CLKex.

FIG. 37 illustrates the behavior of the thirteenth embodiment under the unstable external clock signal CLKex. The clock signal CLKex' is lost at 10 ns and 15 ns. The clock signal CLKex' rises at 5 ns. The polarity control signal CTL10 is in the high level, and the control signal CTL11 rises. Then, the delay circuit enters into the first time period. The control signal CTL12 rises, and causes the signal trasfer line A0 to rise around 10 ns. The delay circuit 26a propagates the potential edge signal EG1 from the delay stage 2600 toward a certain delay stage 260i.

When the clock signal CLKex' falls, the polarity control signal CTL10 is delayed. The clock signal CLKex' rises at 20 ns, again. Since the polarity control signal CTL10 is in the low level, the control signal CTL11 is changed to the low level, and the delay circuit 26a enters into the second time period. Then, the potential edge signal EG2 is propagated from the certain delay stage 260i to the first delay stage 2600.

If the cycle time tCk2 is shorter than the cycle time tCK1, the clock signal CLKex' rises before the arrival of the potential edge signal EG2 at the first delay stage 2600, and the control signal CTL11 is changed to the high level around 28 ns. Then, the delay circuit 26a starts to rightwardly propagate the potential edge signal EG1. Thus, the potential edge signal EG2 is not supplied to the pulse generator 27a, and the pulse generator 27a does not generate the internal clock pulse PS1.

Even though the external clock signal CLKex becomes stable, the potential edge signals EG1/EG2 are moved between the signal transfer lines A6/B6 and the signal transfer lines A13/B13, and the potential edge signal EG2 is never supplied to the pulse generator 27a. The undesirable phenomenon is liable to take place immediately after the power-on, because the clock signal CLKex' is unstable.

Figure 38:
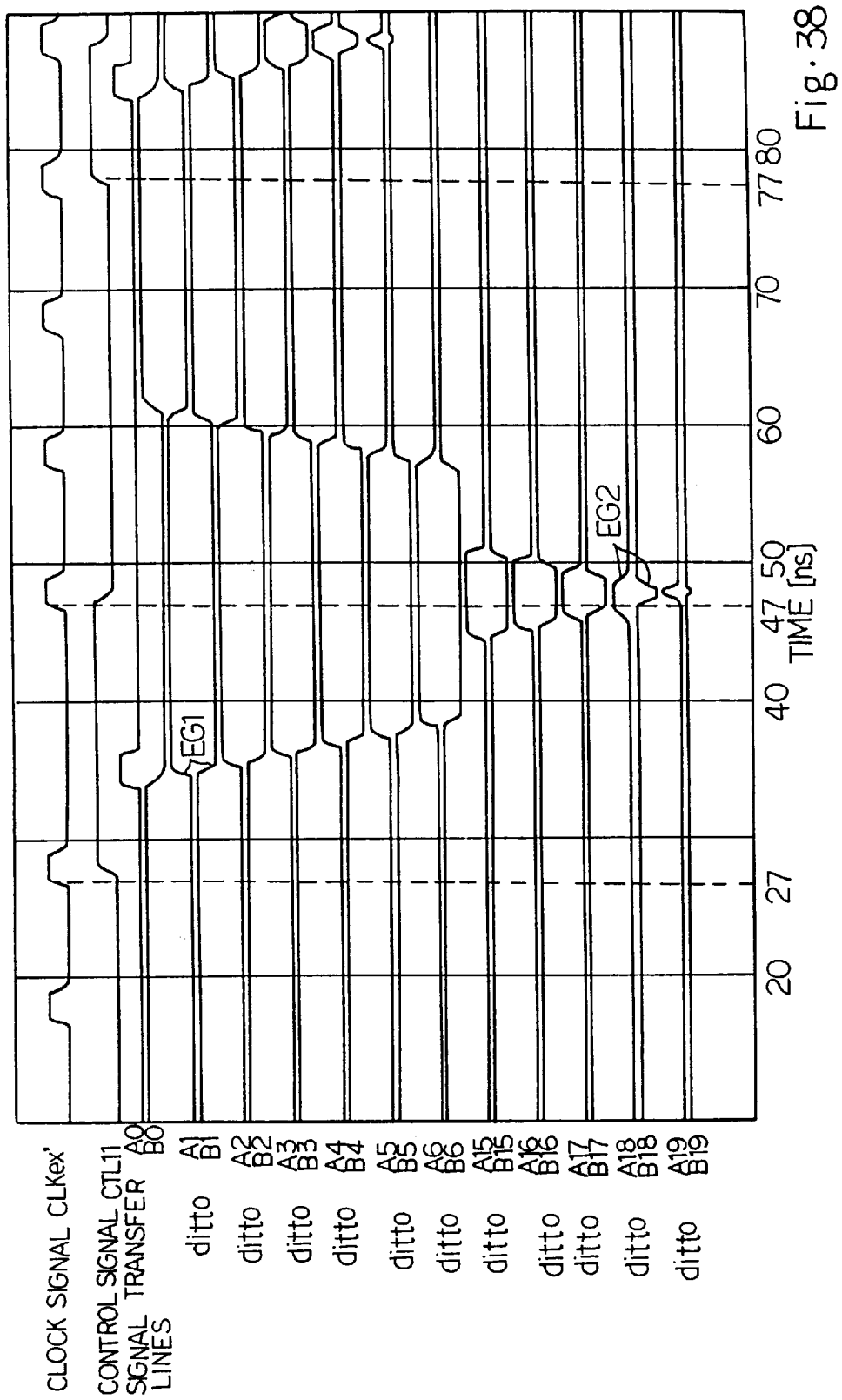
FIG. 38 is a timing chart showing the behavior of the clock generating circuit shown in FIG. 36 when the external clock signal is unstable.

The AND gates 100a/100b prevents the delay circuits 26a/26b from the undesirable phenomenon, and the circuit behavior of the clock generating circuit shown in FIG. 36 is illustrated in FIG. 38. The polarity control signal CTL10 and the potential edge signal EG2 are supplied to the input nodes of the AND gate 100a, and the complementary polarity control signal and the potential edge signal EG3 are supplied to the input nodes of the other AND gate 10b.

The clock signal CLKex' is assumed to become unstable, and does not rise at 37 ns. The clock signal CLKex' rises at 27 ns, and the control signal CTL11 is changed to the high level. The control signal CTL12 is supplied to the first delay stage 2600, and the delay circuit 26a starts to rightwardly propagate the potential edge signal EG1. The clock signal CLKex' is skipped at 37 ns, and rises at 47 ns. Then, the delay circuit 26a starts to leftwardly propagate the potential edge signal EG2. However, the potential edge signal EG2 does not change the signal transfer line B0 to the high level at 57 ns. For this reason, even though the clock signal CLKex' rises at 57 ns, the AND gate 100a does not transfer the polarity control signal CTL10 to the input node D of the flip-flop circuit 25c. The second time period is prolonged to 57 ns, and allows the potential edge signal EG2 to raise the signal transfer line B0. Thus, the clock generating circuit implementing the eleventh embodiment is free from the above described phenomenon.

Twelfth Embodiment

Figure 39:
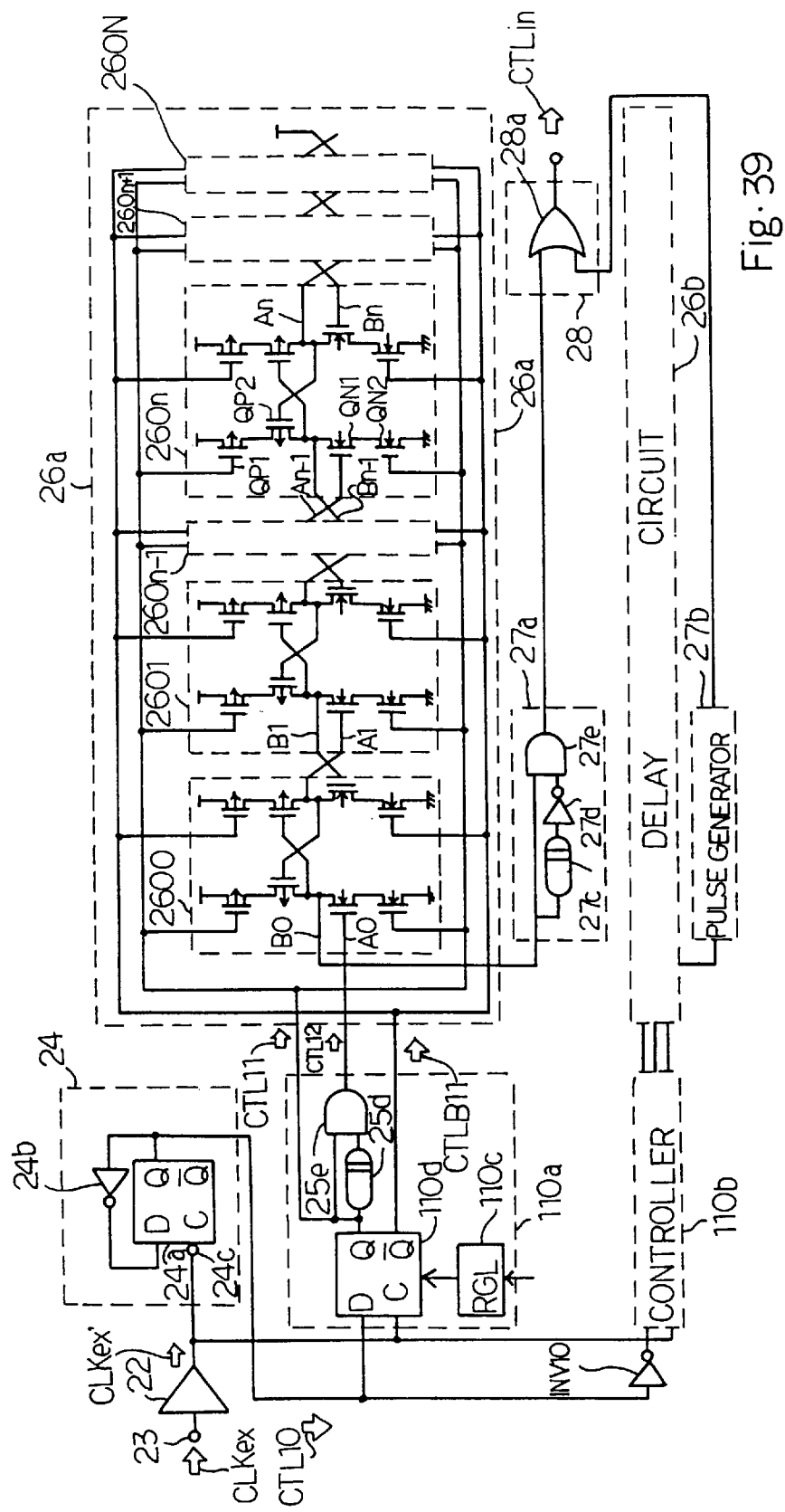
FIG. 39 is a circuit diagram showing another clock generating circuit according to the present invention.

FIG. 39 illustrates another clock generating circuit embodying the present invention. The controllers 25a/25b are replaced with controllers 110a/110b, and other components are similar to those of the first embodiment. For this reason, the other components are labeled with the same references designating corresponding components.

The controller 110a/110b includes a delay regulator 110c, a flip-flop circuit 110d, the delay circuit 25d and the AND gate 25e. The delay regulator 110c selectively changes control signals CTL100, CTL101, CTL102 and CTL103 to the active high level, and the flip flop circuit 110d changes the time delay between the input of the clock signal CLKex' and the output of the control signals CTL11/CTLB11. The delay regulator 110c and the flip-flop circuit 110d are shown in FIG. 40 in detail.

The flip-flop circuit 110d has a bi-stable circuit 110e, a first switching circuit 110f connected to a node N100, a second switching circuit 110g connected to a node N110, a first capacitor array 110h connected between the first switching circuit 110f and the ground line and a second capacitor array 110j connected between the second switching circuit 110g and the ground line. Four n-channel type field effect transistors connected in parallel form the first switching circuit 110f. The leftmost n-channel type field effect transistor is turned on at all times, the second n-channel type field effect transistor is gated by the control signal CTL100, and the remaining two n-channel type field effect transistors are gated by the control signal CTL101. The capacitors are equal in capacitance to one another, and is represented by "C". The total capacitance coupled to the node N100 is changed from C through 2C and 3C to 4C. Similarly, four n-channel type field effect transistors connected in parallel form the second switching circuit 110f. The rightmost n-channel type field effect transistor is turned on at all times, the second n-channel type field effect transistor is gated by the control signal CTL103, and the remaining two n-channel type field effect transistors are gated by the control signal CTL102. The total capacitance coupled to the node N110 is also changed from C through 2C and 3C to 4C.

The delay regulator 110c is implemented by four fuse registers 110k, 110m, 110n and 110p, and the four fuse registers 110k to 110p are similar in circuit configuration to the fuse registers 92a to 92d, and the component elements are labeled with the same references designating corresponding parts of the fuse registers 92a to 92d without detailed description.

Figure 40:
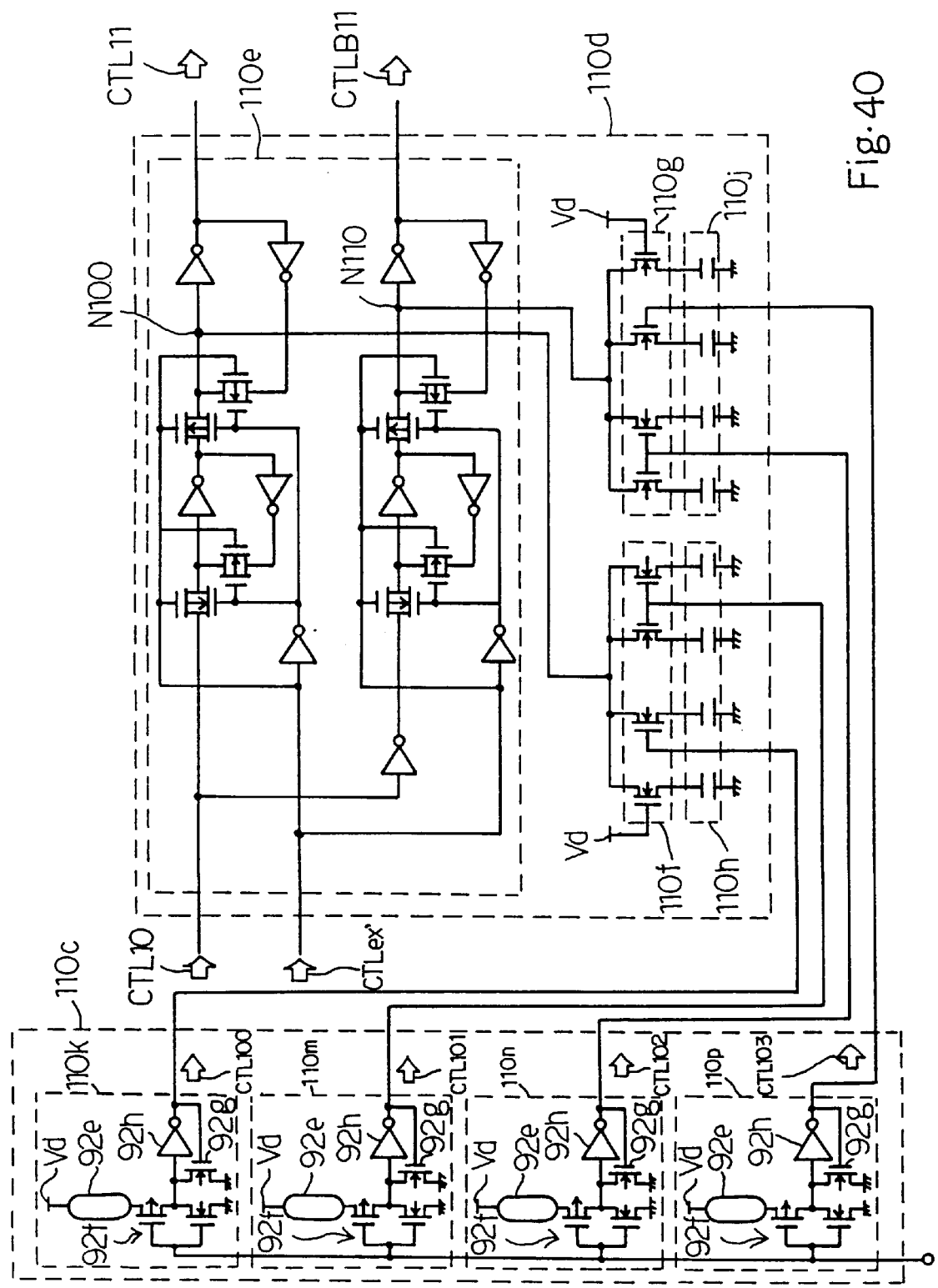
FIG. 40 is a circuit diagram showing the configuration of a flip-flop circuit incorporated in the clock generating circuit.

The clock generating circuit shown in FIG. 40 achieves high resolution equivalent to or less than a signal propagation time of a logic gate. Even if the cycle time fluctuates, the clock generating circuit keeps phase difference between the external clock signal CLKex and the internal clock signal CLKin constant in so far as the delay stages 2600 to 260N has the linear relation between the amount of electric charge and the charging/discharging time. However, the p-channel type field effect transistors and the n-channel type field effect transistors are completed through different ion-implanting steps, and the threshold and the current driving capability are not linked between the p-channel type field effect transistors and the n-channel type field effect transistors. This results in unbalance of the charging/discharging capability. For this reason, the phase difference between the external clock signal CLKex and the internal clock signal CLKin is variable within the time delay introduced by a single gate or less.

Assuming now that the n-channel type field effect transistors become smaller in charging/discharging capability rather than the p-channel type field effect transistors, the potential decay on the signal transfer line Bi consumes time period longer than the time period consumed during the potential rise on the signal transfer line Ai in the first time period. While the n-channel type field effect transistors QN1/QN2 are discharging the signal transfer line Bn−1, the control signal CTL11 may change the delay circuit 26a from the first time period to the second time period. Then, the p-channel type field effect transistors QP1/QP2 starts to charge the signal transfer line Bn−1, and the potential edge signal EG2 is propagated from the delay stage 260n toward the delay stage 2600. The difference in the current driving capability between the p-channel type field effect transistors and the n-channel type field effect transistors makes the potential delay from the signal transfer line Bn−1 longed and the potential rise on the signal transfer line Bn−1 short. This results in that the delay stages 2600 to 260N accelerate the signal propagation of the potential edge signal EG2 toward the delay stage 2600. The internal clock pulse PS1 is generated earlier, and the internal clock signal CLKin is advanced.

In this instance, the capacitance coupled to the node N100/N110 is stepwise varied by selectively breaking the fuse elements 92e. If it is necessary to retard the potential decay of the control signal CTL11 with respect to the potential rise of the complementary control signal CTLB11, the control signals CTL100/CTL101 are selectively changed to the high level, and the first switching circuit 110f appropriately increases the capacitance coupled to the node N100. As a result, the delay circuit 26a retards the signal propagation of the potential edge signal EG2, and makes the internal clock signal CLKin synchronous with the external clock signal CLKex. The selective breakage of the fuse elements 92e is carried out between the completion of the fabrication process and the packaging, and regulates the phase difference between the external clock signal CLKex and the internal clock signal CLKin. The output time period of the control signal CTL11 and the output time period of the complementary control signal CTLB11 may be regualted in the test mode by using the register.

Thirteenth Embodiment

Figure 41:
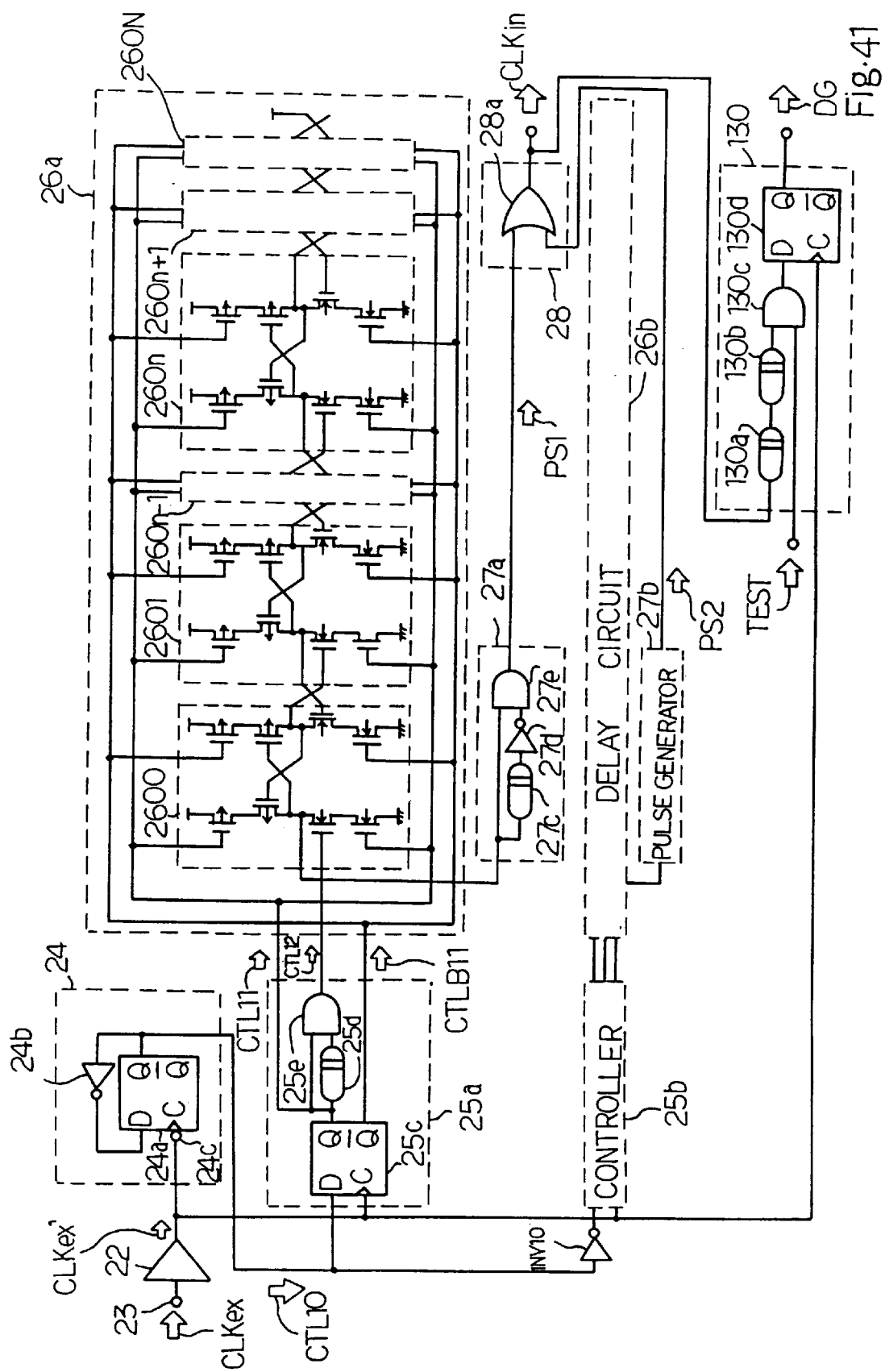
FIG. 41 is a circuit diagram showing another clock generating circuit according to the present invention.

FIG. 41 illustrates another clock generating circuit embodying the present invention. The clock generating circuit shown in FIG. 40 is similar to the clock generating circuit implementing the first embodiment except for a test circuit 130. The test circuit 130 includes a delay circuit 130a, a variable delay circuit 130b, an AND gate 130c and an edge-triggered flip-flop circuit 130d. The internal clock signal CLKin is supplied to the delay circuit 130a, and the delay circuit 130a introduces time delay shorter than the time difference between the internal clock signal CLKin and the clock signal CLKex'. The variable delay circuit 130b is regulable from the outside of the semiconductor chip 20, and an analyst can change the delay time introduced by the delay circuit 130b. The output signal of the variable delay circuit 130b and a test signal TEST are supplied to the input nodes of the AND gate 130c, and the output node of the AND gate 130c is connected to the input node of the edge triggered flip-flop circuit 130d. The clock signal CLKex' is supplied to the clock node C of the edge triggered flip-flop circuit 130d. The test signal TEST is changed to the high level in the test mode.

The variable delay circuit 130b is set to certain delay time. If the AND gate 130c supplies the output signal to the input node D earlier than the clock signal CLKex', the flip-flop circuit 130d stores the high level, and changes a diagnostic signal DG to the high level as shown in FIG. 42A.

The analyst gradually increases the time delay of the variable delay circuit 130b. When the output signal of the AND gate 130c is delayed from the clock signal CLKex', the flip-flop circuit 130d stores the low level, and changes the diagnostic signal DG to the low level as shown in FIG. 42B. Thus, the analyst can measure the time difference between the internal clock signal CLKin and the clock signal CLKex' on the basis of the delay time given to the variable delay circuit 130b.

As described hereinbefore, the phase difference between the external clock signal CLKex and the internal clock signal CLKin fluctuates within propagation time of a single gate due to the variation of the cycle time tCK. The clock signal CLKex' is synchronous with the external clock signal CLKex, and the analyst can investigate the variation of the phase difference between the external clock signal CLKex and the internal clock signal CLKin.

The electric characteristics of a semiconductor integrated circuit are investigated after completion of the fabrication by using probes. However, the inductance of each probe is too large to exactly measure the skew between two signals on the semiconductor wafer. The test circuit 130 is free from the large inductance of the probe, and the phase difference is accurately measured before the packaging.

If the test circuit 130 is incorporated in the clock generating circuit implementing the twelfth embodiment, the test circuit 130 measures the phase difference during the regulation in the test mode, and the fuse registers are selectively broken before the packaging.

The test circuit 130 may be doubled. The test circuits 130 are connected to the pulse generators 27a and 27b, respectively, and the analyst investigates the pieces of delay time introduced by the delay circuits 26a and 26b independently.

As will be appreciated from the foregoing description, the clock generating circuit according to the present invention achieves the follows technical effects.

First, the new delay circuit 26a/26b repeats the charging/discharging from the first delay stage to a certain delay stage in the first time period and from the certain delay stage to the first delay stage in the second time period, and triggers the pulse generator. The first clock cycle and the second clock cycle respectively contain the first delay time and the second delay time, and the clock generating circuit outputs the first internal clock pulse only two cycles after the first external clock pulse. Thus, the clock generating circuit according to the present invention is promptly responsive to the external clock signal CLKex.

Second, it is possible for the clock generating circuit according to the present invention to promptly respond to the external clock signal CLKex as descried in the previous paragraph. This means that the user can power off the clock generating circuit during the internal circuit does not need the internal clock signal CLKin. If the clock generating circuit is used in a synchronous semiconductor memory device, an external instruction signal or an equivalent internal signal activates the clock generating circuit. Thus, the power consumption is reduced.

Third, the new delay circuit replaces the clock cycle with the signal propagation from the first delay stage to the certain delay stage, and, accordingly, divides the clock cycle into pieces of time delay respectively introduced by the delay stages. For this reason, the clock generating circuit achieves the high resolution.

Fourth, the clock generating circuit is stable. Any voltage controlled oscillator is required. Even if the power voltage is unintentionally reduced, the delay circuit 26a/26b can propagate the potential edge signals EG1/EG2, and the clock generating circuit does not change the freuqncy of the internal clock signal CLKin.

Fifth, the clock generating circuit is easily designed. The phase difference between the external clock signal CLKex and the internal clock signal CLKin is only dependent on the uniformity of the charging/discharging capability of the delay stages. For this reason, the clock generating circuit is easily designed.

Sixth, the clock generating circuit is free from a malfunction due to waveform distortion. The clock generating circuit only transfers the potential edge signals EG1/EG2 through the signal transfer lines Ai/Bi, and the signal transfer lines Ai/Bi are short enough to maintain the waveform without any distortion.

Seventh, the circuit configuration is simple, and it is easy to respond to a trouble.

Eighth, the frequency of the internal clock signal is easily changeable. The phase difference from the external clock signal is depending on the ratio of current driving capability of the field effect transistors incorporated in the delay stages, and the combination of the delay circuits achieves an arbitrary frequency. The duty factor is also changeable.

A means for reducing the impedance at the intermediate node restricts the phase difference.

It is possible to respond to an external clock signal with a wide frequency range. If the clock generating circuit is expected to respond to a low-frequency external clock signal, the clock generating circuit becomes responsive by only increasing the delay stages. Even if the external clock signal changes the frequency, the clock generating circuit only requires plural delay circuits selectively used for generating the potential edge signals.

The fuse registers allow the manufacturer to regulate the delay time after the fabrication process.

If the clock generating circuit has more than two delay circuits different in phase, the minimum cycle time is drastically reduced.

The fuse registers further allows the manufacturer to regulate the clock generating timings and the duty ratio of the clock signal.

The test circuit allows the manufacturer to measure the actual phase difference, and makes the adjustment of the phase difference, the timings and the duty factor easy.

Although particular embodiments of the present invention have been shown and described, it will be obvious to those skilled in the art that various changes and modifications may be made without departing from the spirit and scope of the present invention.

For example, the p-channel type field effect transistors QP9/QP10 and the n-channel type field effect transistors QN9/QN10 may be added to the clock generating circuit shown in FIG. 14.

The variable delay circuits 44a and 43a/43b may be incorporated in the clock generating circuits shown in FIGS. 14 and 17.

The controller 45a/45b is available for the second embodiment to the fourth embodiment.

The controller 47a/47b is available for the second embodiment to the fourth embodiment.

The switch array 93 may be connected to an intermediate node between the p-channel type field effect transistors QP1/QP5 and the p-channel type field effect transistors QP2/QP6 and to an intermediate node between the p-channel type field effect transistor QP3 and the p-channel type field effect transistor QP4.

The capacitor CP1 may be replaced with an n-channel type field effect transistor having a source node and a drain node coupled to each other and a gate electrode supplied with the control signal. The intermediate node 91a/91b varies the potential level from zero to a half of the positive power voltage. When the gate electrode is changed to the high level, a conductive channel is formed between the source node and the drain node, and prolongs the delay time. On the other hand, if the control signal is changed to the low level, any conductive channel does not take place between the drain node and the source node, and the delay time is unchanged. Thus, the signal propagation time is regulable by changing the gate potential. If the switch array 93 is connected to the intermediate nodes between the p-channel type field effect transistors, the capacitor CP1 is replaceable with a p-channel type field effect transistor connected as similar to the n-channel type field effect transistor. The AND gates 100a/100b may be added to any one of the second to tenth embodiments.

The controller 110a/110b may be used for any one of the third embodiment to the eleventh embodiment.

The test circuit 130 or circuits 130 may be incorporated in any one of the second to twelfth embodiments.

What is claimed is:

1. A clock generating circuit comprising:
   a first controller responsive to a preliminary clock signal producing a first control signal, a first complimentary control signal and a first input signal, said first control signal repetitively switching from a first level to a second level at the start of a first time period and subsequently switching from said second level to said first level at the start of a second time period wherein said first and second time periods are equal to a pulse period of said preliminary clock signal,
   said first complimentary control signal complementarily switching between said first and second levels synchronously with said first control signal,
   said first input signal on a first input signal line switching from an inactive level to an active level during said first time period, a first delay circuit having a plurality of first delay stages connected in series through a plurality of first signal transfer lines and a plurality of second signal transfer lines respectively paired with said first signal transfer lines and responsive to said first input signal generating a first potential edge signal and propagating said first potential edge signal from an initial first delay stage towards a certain one of said first delay stages during said first time period and propagating said first potential edge signal from said certain one of said first delay stages through said initial first delay stage to a first output signal line during said second time period, wherein each of said plurality of first delay stages comprises, a first charging circuit connected to a first power voltage line and enabled with said first control signal during said second time period and responsive to a potential level on the first signal transfer line of a next delay stage providing a current path from said first power voltage line to one of said first output signal line and a second signal transfer line corresponding to a previous delay stage, a first discharging circuit connected to a second power voltage line different in potential level from said first power voltage line and enabled with said first control signal during said first time period and responsive to a potential level of one of said first input signal line and said first signal transfer line corresponding to said previous delay stage providing a current path from said one of said first output signal line and said second signal transfer line to said second power voltage line, a second charging circuit connected to said first power voltage line and enabled with said first complimentary control signal during said first time period and responsive to a potential level on said one of said first output signal line and said second signal transfer line corresponding to said previous delay stage providing a current path from said first power voltage line to said first signal transfer line corresponding to said next delay stage, a second discharging circuit connected to said second power voltage line and enabled with said first complimentary control signal during said second time period and responsive to a potential level on said second signal transfer line corresponding to said next delay stage; and a first one-shot pulse generator connected to said first output signal line producing a first internal clock pulse with a constant phase relation to a preliminary clock pulse of said preliminary clock signal during said second time period.

2. The clock generating circuit as set forth in claim 1, in which said first charging circuit has a first series combination of first field effect transistors having respective first channels of one conductivity type and respective first gate electrodes selectively supplied with said first control signal and said potential level on the first signal transfer line of said next delay stage, said first discharging circuit has a second series combination of second field effect transistors having respective second channels of the other conductivity type opposite to said one conductivity type and respective second gate electrodes selectively supplied with said first control signal and said potential level of one of said first input signal line and said first signal transfer line corresponding to said previous delay stage, said second charging circuit has a third series combination of third field effect transistors having respective third channels of said one conductivity type and respective third gate electrodes selectively supplied with said first complementary control signal and said potential level on said one of said first output signal line and said second signal transfer line corresponding to said previous delay stage, and said second discharging circuit has a fourth series combination of fourth field effect transistors having respective fourth channels of said other conductivity type and respective fourth gate electrodes selectively supplied with said first complementary control signal and said potential level on said second signal transfer line corresponding to said next delay stage.

3. The clock generating circuit as set forth in claim 1, in which said first charging circuit and said first discharging circuit are different in current driving capability from said second charging circuit and said second discharging circuit, respectively.

4. The clock generating circuit as set forth in claim 3, in which said first charging circuit includes a first series combination of first field effect transistors having respective channels of one conductivity type and selectively supplied with said first control signal and said potential level on the first signal transfer line of said next delay stage and a second series combination of said first field effect transistors connected in parallel to said first series combination and selectively supplied with said first control signal and said potential level on the first signal transfer line of said next delay stage, said first discharging circuit includes a third series combination of second field effect transistors having respective channels of the other conductivity type opposite to said one conductivity type and selectively supplied with said first control signal and said potential level of one of said first input signal line and said first signal transfer line corresponding to said previous delay stage and a fourth series combination of said second field effect transistors connected in parallel to said third series combination and serving as a first load capacitor, said second charging circuit includes a fifth series combination of said first field effect transistors and selectively supplied with said first complementary control signal and said potential level on said one of said first output signal line and said second signal transfer line corresponding to said previous delay stage and a sixth series combination of said first field effect transistors connected in parallel to said fifth series combination and selectively serving as a second load capacitor, and said second discharging circuit includes a seventh series combination of said second field effect transistors selectively supplied with said first complementary control signal and said potential level on said second signal transfer line corresponding to said next delay stage and an eighth series combination of said second field effect transistors connected in parallel to said seventh series combination and selectively supplied with said first complementary control signal.

5. The clock generating circuit as set forth in claim 1, in which each of said plurality of first delay stages further has a third charging circuit connected between said first power voltage line and a first intermediate node of said first charging circuit for regulating electric charge at said first intermediate node to a first amount after said first charging circuit turns off, a third discharging circuit connected between said second power voltage line and a second intermediate node of said first discharging circuit for regulating electric charge at said second intermediate node to a second amount after said first discharging circuit turns off, a fourth charging circuit connected between said first power voltage line and a third intermediate node of said second charging circuit for regulating electric charge at said third intermediate node to said first amount after said second charging circuit turns off, and a fourth discharging circuit connected between second power voltage line and a fourth intermediate node of said second discharging circuit for regulating electric charge at said fourth intermediate node to said second amount after said second discharging circuit turns off.

6. The clock generating circuit as set forth in claim 1, wherein the start of at least one of said first time period and said second time period is unstable.

7. The clock generating circuit as set forth in claim 6, in which said first delay circuit further has at least a first load capacitor selectively connected to one of said first charging circuit and said first discharging circuit.

8. The clock generating circuit as set forth in claim 7, in which said first load capacitor is variable in capacitance.

9. The clock generating circuit as set forth in claim 1, wherein the start of both of said first time period and said second time period are unstable.

10. The clock generating circuit as set forth in claim 9, in which said first controller introduces a time delay between said first input signal and said first control signal, and said time delay is variable.

11. The clock generating circuit as set forth in claim 10, in which said first controller includes a flip-flop circuit responsive to said preliminary clock signal for producing said first control signal an output node thereof and said first complementary control signal at another output node thereof, a first variable delay circuit connected to said output node of said flip-flop circuit and introducing a variable time delay, a delay circuit connected to the output node of said variable delay circuit and introducing constant time delay, and a logic gate having input nodes connected to said output node of said flip-flop circuit and an output node of said delay circuit for producing said first input signal, said clock generating circuit further comprising a second variable delay circuit connected between said first delay circuit and said first one-short pulse generator for introducing said variable time delay into propagation of said first potential edge signal.

12. The clock generating circuit as set forth in claim 10, in which said first controller includes a flip-flop circuit responsive to said preliminary clock signal for producing said first control signal an output node thereof and said first complementary control signal at another output node thereof, a variable delay circuit connected to said output node of said flip-flop circuit and introducing a variable time delay, a logic gate having input nodes connected to said output node of said flip-flop circuit and an output node of said variable delay circuit for producing said input signal, and a delay controller producing an instruction signal for instructing said variable delay circuit of the amount of said variable time delay.

13. The clock generating circuit as set forth in claim 12, in which said variable delay circuit includes a first logic gate having an input node connected to said output node of said flip-flop circuit, a second logic gate having an input node connected to said output node of said first logic gate, a plurality of capacitors connected in parallel to said second power supply line, and a plurality of switching elements connected between said plurality of capacitors and said output node of said first logic gate and responsive to said instruction signal of said delay controller for selectively connecting said plurality of capacitors to said output node of said first logic gate.

14. The clock generating circuit as set forth in claim 12, in which said delay controller includes a plurality of fuse registers for producing instruction sub-signals of said instruction signal, respectively, and each of said plurality of fuse registers includes a breakable fuse element connected to said first power supply line, a complementary transistor connected between said breakable fuse element and said second power supply line and responsive to a load regulating signal for connecting an output node thereof to said breakable fuse element, an output inverter connected to said output node of said complementary transistor for producing one of said instruction sub-signals and a discharging transistor connected between said output node of said complementary transistor and said second power supply line and responsive to said one of said instruction sub-signals for providing a current path to said second power supply line.

15. The clock generating circuit as set forth in claim 12, in which said delay controller includes a plurality of flip-flop circuits responsive to external control signals for producing instruction sub-signals of said instruction signal.

16. The clock generating circuit as set forth in claim 9, in which said first controller includes a flip-flop circuit responsive to said preliminary clock signal for producing said first control signal at a first output node thereof and said first complementary control signal at a second output node thereof, a delay circuit connected to said first output node, and a logic gate connected to an output node of said delay circuit and said second output node for producing said first input signal, and said flip-flop circuit introduces a first delay time between said preliminary clock signal and said first control signal and a second delay time between said preliminary clock signal and said first complementary control signal, and said first delay time and said second delay time are unstable.

17. The clock generating circuit as set forth in claim 9, in which said first delay circuit further has a first load capacitor and a second load capacitor selectively connected to one of said first charging circuit and said first discharging circuit and one of said second charging circuit and said second discharging circuit, respectively.

18. The clock generating circuit as set forth in claim 17, in which said first load capacitor and said second load capacitor are variable.

19. The clock generating circuit as set forth in claim 1, further comprising a switching circuit connected between a signal line for said preliminary clock signal and said first controller and responsive to said second level on said first output signal line so as to transfer said preliminary clock signal to said first controller.

20. The clock generating circuit as set forth in claim 19, in which said switching circuit is implemented by an AND gate.

21. A clock generating circuit as set forth in claim 1, further comprising;
   a second controller responsive to said preliminary clock signal producing a second control signal, a second complimentary control signal and a second input signal, said second control signal repetitively switching from said second level to said first level at the start of said first time period and subsequently switching from said first level to said second level at the start of said second time period,
   said second complimentary control signal complementarily switching between said first and second levels synchronously with said second control signal,
   said second input signal on a second input signal line switching from said inactive level to said active level during said second time period,
   a second delay circuit having a plurality of second delay stages connected in series through a plurality of third signal transfer lines and a plurality of fourth signal transfer lines respectively paired with said third signal transfer lines and responsive to said second input signal generating a third potential edge signal and propagating said third potential edge signal from an initial second delay stage towards a certain one of said second delay stages during said second time period and propagating said third potential edge signal from said certain one of said second delay stages through said initial second delay stage to a second output signal line during said first time period, wherein each of said plurality of second delay stages is similar in circuit configuration to each of said plurality of said first delay stages,
   a second one-shot pulse generator connected to said second output signal line producing a second internal clock pulse with another constant phase relation to said preliminary clock pulse of said preliminary clock signal during said first time period, and
   an output circuit connected to said first one-shot pulse generator and said second one-shot pulse generator producing an internal clock signal from said first internal clock pulse and said second internal clock pulse.

22. The clock generating circuit as set forth in claim 21, in which said first charging circuit of one of said plurality of first delay stages and said plurality of second delay stages has a first series combination of first field effect transistors having respective first channels of one conductivity type and respective first gate electrodes selectively supplied with one of said first control signal and said second control signal and said potential level on the first signal transfer line of said next delay stage,
   said first discharging circuit of said one of said plurality of first delay stages and said plurality of second delay stages has a second series combination of second field effect transistors having respective second channels of the other conductivity type opposite to said one conductivity type and respective second gate electrodes selectively supplied with one of said first control signal and said second control signal and said potential level of one of said first input signal line and said first signal transfer line corresponding to said previous delay stage,
   said second charging circuit of said one of said plurality of first delay stages and said plurality of second delay stages has a third series combination of third field effect transistors having respective third channels of said one conductivity type and respective third gate electrodes selectively supplied with one of said first complementary control signal and said second complementary control signal and said potential level on said one of said first output signal line and said second signal transfer line corresponding to said previous delay stage, and
   said second discharging circuit of said one of said plurality of first delay stages and said plurality of second delay stages has a fourth series combination of fourth field effect transistors having respective fourth channels of said other conductivity type and respective fourth gate electrodes selectively supplied with one of said first complementary control signal and said second complementary control signal and said potential level on said second signal transfer line corresponding to said next delay stage.

23. The clock generating circuit as set forth in claim 22, in which said one conductivity type and said other conductivity type are p-type and n-type, respectively.

24. The clock generating circuit as set forth in claim 21, in which said first controller, said first delay circuit and said first one-shot pulse generator forms a first clock generating sub-circuit together with said second controller, said second delay circuit and said second one-shot pulse generator,
   a second clock generating sub-circuit similar in circuit arrangement to said first clock generating sub-circuit is further incorporated in said clock generating circuit so as to supply a third internal clock pulse and a fourth internal clock pulse different in phase from said first internal clock pulse and said second internal clock pulse to said output circuit.

25. The clock generating circuit as set forth in claim 24, further comprising a third clock generating sub-circuit similar in circuit arrangement to said first clock generating sub-circuit and supplying a fifth internal clock signal and a sixth internal clock signal different from said first internal clock pulse, said second internal clock pulse, said third internal clock pulse and said fourth internal clock pulse to said output circuit.

26. The clock generating circuit as set forth in claim 24, further comprising a polarity controller responsive to said preliminary clock signal for changing a first polarity control signal, a first complementary signal of said first polarity control signal, a second polarity control signal and a second complementary signal of said second polarity control signal to an active level over two clock cycles of said preliminary clock signal, and said first polarity control signal, said first complementary signal, said second polarity control signal and said second complementary signal are supplied to said first controller of said first clock generating sub-circuit, said second controller of said first clock generating sub-circuit, the first controller of said second clock generating sub-circuit and said second controller of said second clock generating sub-circuit, respectively.

27. The clock generating circuit as set forth in claim 21, whereby said clock generating circuit forms a first clock generating subcircuit, said clock generating circuit further comprising;
   a plurality of second clock generating subcircuits each identical in structure to said first clock generating subcircuit, and
   wherein a current driving capability of each of said first charging circuits and said first discharging circuits of said first clock generating subcircuit are equal to a corresponding current driving capability of each of said second charging circuits and said second discharging circuits of said first clock generating subcircuit and, wherein further,
   a current driving capability of each of said first charging circuits and said first discharging circuits of said plurality of second generating subcircuits are different than a corresponding current capability of each of said second charging circuits and said second discharging circuits of said plurality of second clock generating subcircuits.

28. The clock generating circuit as set forth in claim 16, in which said flip-flop circuit includes
- a first signal generating sub-circuit having a first input node supplied with said preliminary clock signal, a first intermediate node and a first output node for outputting said first control signal,
- a second signal generating sub-circuit having a second input node supplied with said preliminary clock signal, a second intermediate node and a second output node for outputting said first complementary control signal,
- a first parallel combination of capacitors connected to said second power supply line,
- a first parallel combination of switching transistors connected between said first parallel combination and said first intermediate node and responsive to a first instruction signal for selectively connecting the capacitors of said first parallel combination to said first intermediate node,
- a second parallel combination of capacitors connected to said second power supply line,
- a second parallel combination of switching transistors connected between said second parallel combination of capacitors and said second intermediate node and responsive to a second instruction signal for selectively connecting the capacitors of said second parallel combination to said second intermediate node, and
- a delay regulator for producing said first instruction signal and said second instruction signal.

29. The clock generating circuit as set forth in claim 28, in which said delay regulator includes a plurality of fuse registers for producing instruction sub-signals of said first and second instruction signals, respectively, and each of said plurality of fuse registers includes a breakable fuse element connected to said first power supply line, a complementary transistor connected between said breakable fuse element and said second power supply line and responsive to a load regulating signal for connecting an output node thereof to said breakable fuse element, an output inverter connected to said output node of said complementary transistor for producing one of said instruction sub-signals and a discharging transistor connected between said output node of said complementary transistor and said second power supply line and responsive to said one of said instruction sub-signals for providing a current path to said second power supply line.

30. The clock generating circuit as set forth in claim 21, further comprising a test circuit for measuring a phase difference between said preliminary clock signal and said internal clock signal.

31. The clock generating circuit as set forth in claim 30, in which said test circuit includes
- a variable delay circuit responsive to an external instruction signal for introducing a delay time into propagation of said internal clock signal,
- a flip-flop circuit having a clock node supplied with said preliminary clock signal and an input node supplied with said internal clock signal for producing a diagnostic signal, and
- a logic gate enabled with said external instruction signal for transferring said internal clock signal to said input node of said flip-flop circuit.

* * * * *